(12) United States Patent
Yamazaki et al.

(10) Patent No.: US 12,666,843 B2
(45) Date of Patent: Jun. 23, 2026

(54) DISPLAY APPARATUS, DISPLAY MODULE, ELECTRONIC DEVICE, AND METHOD FOR MANUFACTURING DISPLAY APPARATUS

(71) Applicant: Semiconductor Energy Laboratory Co., Ltd., Atsugi (JP)

(72) Inventors: Shunpei Yamazaki, Setagaya (JP); Kenichi Okazaki, Atsugi (JP); Koji Kusunoki, Isehara (JP); Shingo Eguchi, Atsugi (JP); Daisuke Kubota, Atsugi (JP); Yasuhiro Niikura, Komae (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 353 days.

(21) Appl. No.: 18/273,084

(22) PCT Filed: Jan. 17, 2022

(86) PCT No.: PCT/IB2022/050337
§ 371 (c)(1),
(2) Date: Jul. 19, 2023

(87) PCT Pub. No.: WO2022/162493
PCT Pub. Date: Aug. 4, 2022

(65) Prior Publication Data
US 2024/0090302 A1     Mar. 14, 2024

(30) Foreign Application Priority Data

Jan. 28, 2021   (JP) ................................ 2021-012418
Feb. 18, 2021   (JP) ................................ 2021-024602

(51) Int. Cl.
*H10K 59/40*        (2023.01)
*G06V 40/13*        (2022.01)
(Continued)

(52) U.S. Cl.
CPC ......... *H10K 59/40* (2023.02); *G06V 40/1318* (2022.01); *H10K 71/60* (2023.02); *H10K 59/871* (2023.02); *H10K 59/873* (2023.02)

(58) Field of Classification Search
CPC ...... H10K 59/40; H10K 71/60; H10K 59/871; H10K 59/873; H10K 59/35; H10K 59/60; (Continued)

(56) References Cited

U.S. PATENT DOCUMENTS 5,953,985 A     9/1999 Kobayashi
6,120,338 A     9/2000 Hirano et al.
(Continued)

FOREIGN PATENT DOCUMENTS

CN        105229580 A     1/2016
CN        105593873 A     5/2016
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Bitew A Dinke
(74) *Attorney, Agent, or Firm* — Eric J. Robinson; Robinson Intellectual Property Law Office, P.C.

(57) ABSTRACT

A high-resolution display apparatus having a function of sensing light is provided. A high-definition display apparatus having a function of sensing light is provided. The display apparatus includes a first light-emitting device, a second light-emitting device, a third light-emitting device, a first light-receiving device, and a second light-receiving device in a first pixel. The first light-emitting device has a function of emitting red light. The second light-emitting device has a function of emitting green light. The third light-emitting (Continued)

device has a function of emitting blue light. The first light-receiving device has a function of sensing light emitted from at least one of the three light-emitting devices. The second light-receiving device has a function of sensing infrared light.

21 Claims, 29 Drawing Sheets

(51) Int. Cl.
      *H10K 71/60*          (2023.01)
      *H10K 59/80*          (2023.01)

(58) Field of Classification Search
      CPC .. H10K 71/231; H10K 39/34; H10K 59/1201;
                H10K 59/8051; H10K 59/8052; H10K
                59/87; H10K 59/90; G06V 40/1318;
                G06V 10/143; G06V 40/1312; G06V
            40/1329; G06F 3/041; G06F 3/042; G09F
                9/00; G09F 9/30; H05B 33/02; H05B
                     33/04; H05B 33/10; H10F 55/00
      See application file for complete search history.

(56)                    References Cited

U.S. PATENT DOCUMENTS

| | | | |
|---|---|---|---|
| 7,965,266 B2 | 6/2011 | Yamaguchi et al. | |
| 8,907,928 B2 | 12/2014 | Yamaguchi et al. | |
| 9,076,990 B2 | 7/2015 | Nakamura et al. | |
| 9,436,864 B2 | 9/2016 | Gozzini | |
| 9,465,429 B2 | 10/2016 | Kitchens, II et al. | |
| 9,490,304 B2 | 11/2016 | Nakamura et al. | |
| 9,494,995 B2 | 11/2016 | Kitchens, II et al. | |
| 9,606,606 B2 | 3/2017 | Kitchens, II et al. | |
| 9,755,005 B2 | 9/2017 | Nakamura et al. | |
| 9,798,372 B2 | 10/2017 | Kitchens, II et al. | |
| 10,031,602 B2 | 7/2018 | Kitchens, II et al. | |
| 10,978,523 B2 | 4/2021 | Park et al. | |
| 11,450,820 B2 | 9/2022 | Kawano et al. | |
| 11,716,892 B2 | 8/2023 | Park et al. | |
| 12,004,400 B2 | 6/2024 | Yamazaki et al. | |
| 12,069,876 B2* | 8/2024 | Kusunoki | G09F 9/30 |
| 12,096,659 B2 | 9/2024 | Kamada et al. | |
| 2002/0072139 A1 | 6/2002 | Kashiwabara | |
| 2006/0244693 A1* | 11/2006 | Yamaguchi | G02F 1/13338 |
| | | | 345/76 |
| 2009/0295760 A1* | 12/2009 | Linge | G06F 3/0421 |
| | | | 345/179 |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0056493 A1 | 2/2014 | Gozzini | |
| 2014/0354597 A1* | 12/2014 | Kitchens, II | G06V 40/1306 |
| | | | 345/175 |
| 2015/0060826 A1 | 3/2015 | Matsumoto. et al. | |
| 2015/0069360 A1 | 3/2015 | Sato | |
| 2015/0076476 A1 | 3/2015 | Odaka et al. | |
| 2015/0220760 A1 | 8/2015 | Foote et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0032778 A1* | 2/2018 | Lång | G06V 40/1306 |
| 2018/0157351 A1* | 6/2018 | Lee | G06F 3/042 |
| 2018/0190908 A1 | 7/2018 | Ke et al. | |
| 2018/0366045 A1* | 12/2018 | Perreault | H04N 23/11 |
| 2020/0105828 A1* | 4/2020 | Ryu | H10H 29/142 |
| 2020/0105841 A1* | 4/2020 | Bang | H10K 59/1213 |
| 2020/0111851 A1* | 4/2020 | Park | G06F 3/0412 |
| 2020/0125189 A1* | 4/2020 | Kim | G06F 3/04162 |
| 2020/0193120 A1* | 6/2020 | Chen | H10K 59/60 |
| 2020/0203662 A1 | 6/2020 | Mollard et al. | |
| 2020/0312928 A1* | 10/2020 | Chung | H10K 59/35 |
| 2020/0395555 A1 | 12/2020 | Kawano et al. | |
| 2021/0066669 A1 | 3/2021 | Kubota et al. | |
| 2021/0096678 A1 | 4/2021 | Kubota et al. | |
| 2021/0296409 A1* | 9/2021 | Yamazaki | H05B 33/02 |
| 2022/0069025 A1* | 3/2022 | Yamazaki | H05B 45/20 |
| 2022/0181572 A1 | 6/2022 | Ohsawa et al. | |
| 2022/0216445 A1 | 7/2022 | Seo et al. | |
| 2022/0223671 A1 | 7/2022 | Yamazaki et al. | |
| 2022/0238836 A1 | 7/2022 | Okazaki et al. | |
| 2022/0242834 A1 | 8/2022 | Tosu et al. | |
| 2022/0246694 A1* | 8/2022 | Watanabe | H10K 59/352 |
| 2022/0328571 A1 | 10/2022 | Kurokawa et al. | |
| 2023/0032743 A1 | 2/2023 | Kubota et al. | |
| 2024/0057378 A1* | 2/2024 | Nakamura | H05B 33/24 |
| 2024/0057428 A1* | 2/2024 | Yamazaki | H05B 33/12 |
| 2024/0065026 A1* | 2/2024 | Yamazaki | H10K 59/353 |
| 2024/0065074 A1* | 2/2024 | Yamazaki | H10K 50/166 |
| 2024/0074240 A1* | 2/2024 | Hodo | H05B 33/04 |
| 2024/0090303 A1* | 3/2024 | Kubota | H10K 59/65 |
| 2024/0138204 A1* | 4/2024 | Hodo | G09F 9/00 |
| 2024/0237425 A9* | 7/2024 | Hodo | G09F 9/30 |
| 2024/0324377 A1 | 9/2024 | Yamazaki et al. | |

FOREIGN PATENT DOCUMENTS

| | | |
|---|---|---|
| CN | 110970466 A | 4/2020 |
| CN | 111009556 A | 4/2020 |
| CN | 111628097 A | 9/2020 |
| DE | 102020115542 | 12/2020 |
| EP | 3637472 A | 4/2020 |
| JP | 2000-036385 A | 2/2000 |
| JP | 2003-059663 A | 2/2003 |
| JP | 2006-301864 A | 11/2006 |
| JP | 2008-091037 A | 4/2008 |
| JP | 2008-098106 A | 4/2008 |
| JP | 2008-147072 A | 6/2008 |
| JP | 2008-251270 A | 10/2008 |
| JP | 2014-089803 A | 5/2014 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-530590 | 9/2016 |
| JP | 2016-197494 A | 11/2016 |
| JP | 2019-179696 A | 10/2019 |
| JP | 2020-160305 A | 10/2020 |
| JP | 2020-205412 A | 12/2020 |
| KR | 2016-0014708 A | 2/2016 |
| KR | 2016-0047527 A | 5/2016 |
| KR | 2020-0036255 A | 4/2020 |
| KR | 2020-0046817 A | 5/2020 |
| KR | 2020-0143279 A | 12/2020 |
| TW | 202036954 | 10/2020 |
| TW | 202104234 | 2/2021 |
| WO | WO-2014/197243 | 12/2014 |
| WO | WO-2014/197245 | 12/2014 |
| WO | WO-2014/197247 | 12/2014 |
| WO | WO-2014/197252 | 12/2014 |
| WO | WO-2015/065411 | 5/2015 |
| WO | WO-2022/162493 | 8/2022 |

OTHER PUBLICATIONS

Malinowski.P et al., "High resolution photolithography for direct view active matrix organic light-emitting diode augmented reality displays", J. SOC. INF. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.

(56)                    References Cited

OTHER PUBLICATIONS

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/050337) Dated Mar. 29, 2022.

Written Opinion (Application No. PCT/IB2022/050337) Dated Mar. 29, 2022.

Taiwanese Office Action (Application No. 111102574) Dated Oct. 8, 2025.

Taiwanese Office Action (Application No. 111102574) Dated Jan. 30, 2026.

* cited by examiner

| | | |
|---|---|---|
| G | B | R |

PS    IRS

180C

| | | |
|---|---|---|
| G | B | R |

FIG. 22A
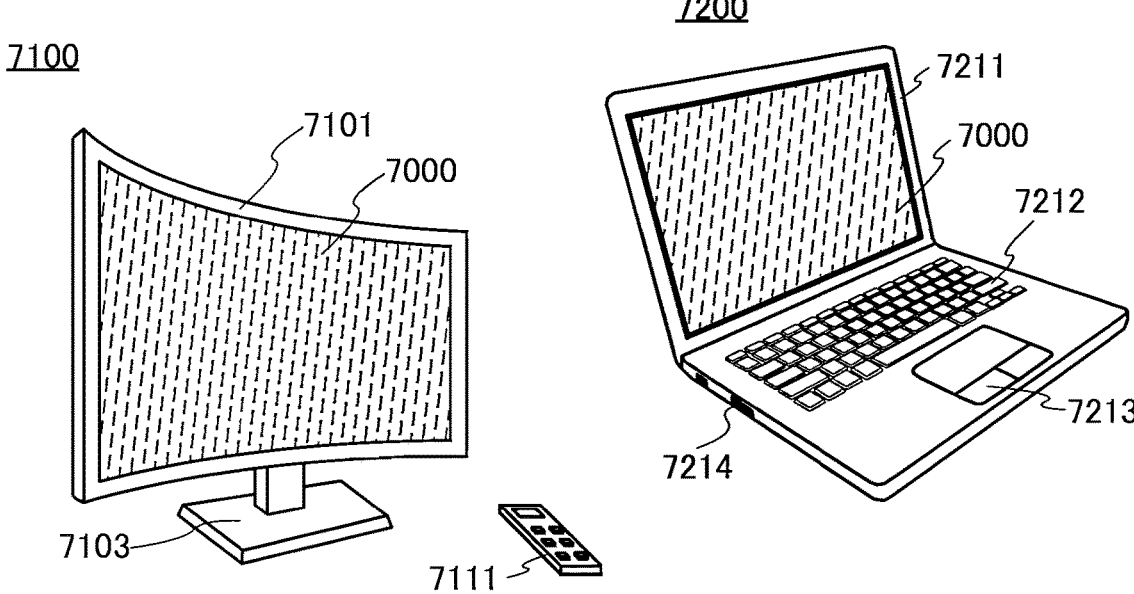
7100
7101
7000
7103
7111
FIG. 22B
7200
7211
7000
7212
7213
7214
FIG. 22C
7300
7301
7303
7000
7311
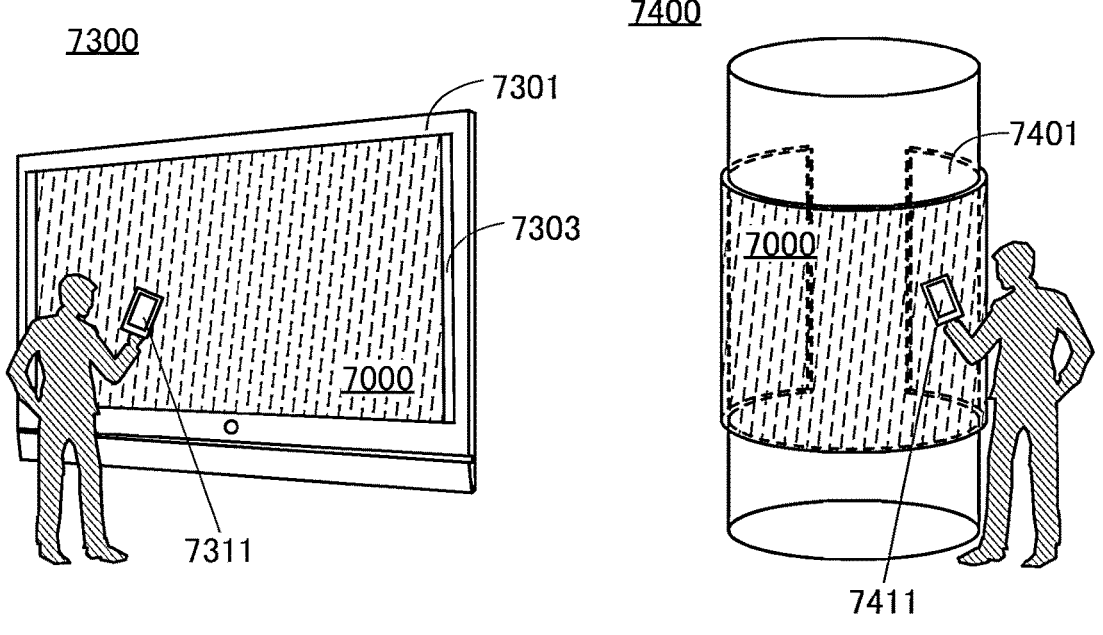
FIG. 22D
7400
7401
7000
7411

FIG. 23A
9101
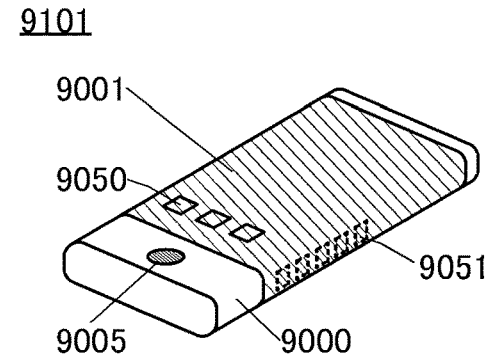
FIG. 23B
9102
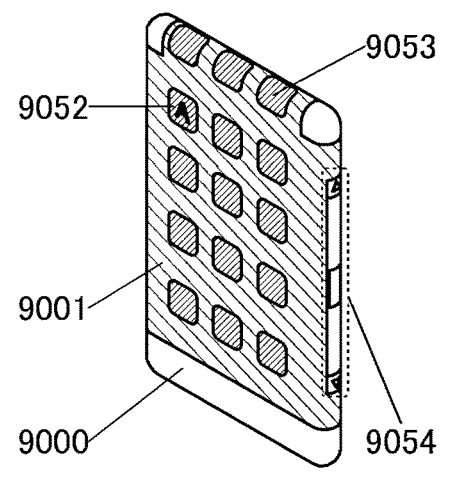
FIG. 23C
9200
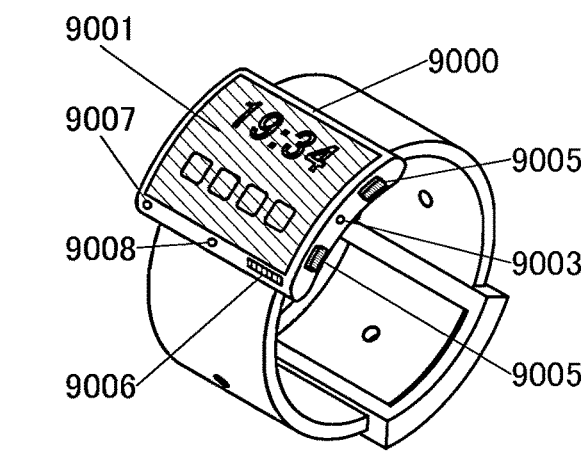
FIG. 23D
9201
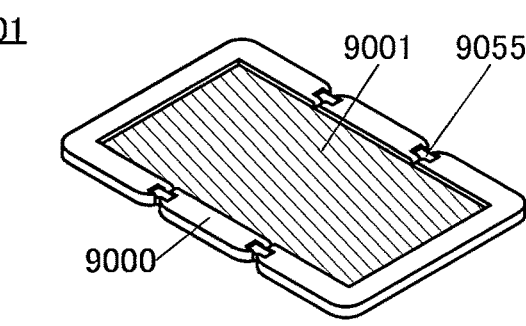
FIG. 23E
9201
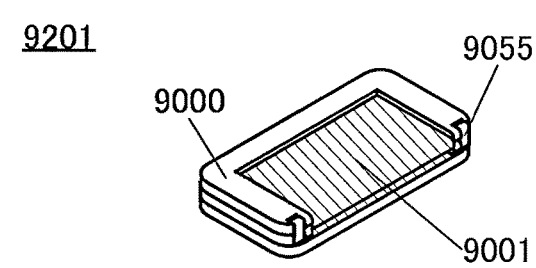
FIG. 23F
9201

1

DISPLAY APPARATUS, DISPLAY MODULE, ELECTRONIC DEVICE, AND METHOD FOR MANUFACTURING DISPLAY APPARATUS

TECHNICAL FIELD

One embodiment of the present invention relates to a display apparatus, a display module, and an electronic device. One embodiment of the present invention relates to a manufacturing method of the display apparatus.

Note that one embodiment of the present invention is not limited to the above technical field. Examples of the technical field of one embodiment of the present invention include a semiconductor device, a display apparatus, a light-emitting device, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, information terminal devices, for example, mobile phones such as smartphones, tablet information terminals, and laptop PCs (personal computers) have been widely used. Such information terminal devices often include personal information or the like, and thus various authentication technologies for preventing unauthorized use have been developed. Information terminal devices have been required to have a variety of functions such as an image display function, a touch sensor function, and a function of capturing images of fingerprints for authentication.

For example, Patent Document 1 discloses an electronic device including a fingerprint sensor in a push button switch portion.

Light-emitting apparatuses including light-emitting devices (also referred to as light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

REFERENCE

Patent Document

[Patent Document 1] United States Published Patent Application No. 2014/0056493

SUMMARY OF THE INVENTION

Problems to be Solved by the Invention

An object of one embodiment of the present invention is to provide a high-resolution display apparatus having a function of sensing light. An object of one embodiment of the present invention is to provide a high-definition display apparatus having a function of sensing light. An object of one embodiment of the present invention is to provide a large display apparatus having a function of sensing light. An object of one embodiment of the present invention is to provide a highly reliable display apparatus having a function of sensing light.

2

An object of one embodiment of the present invention is to provide a method for manufacturing a high-resolution display apparatus having a function of sensing light. An object of one embodiment of the present invention is to provide a method for manufacturing a high-definition display apparatus having a function of sensing light. An object of one embodiment of the present invention is to provide a method for manufacturing a large display apparatus having a function of sensing light. An object of one embodiment of the present invention is to provide a method for manufacturing a highly reliable display apparatus having a function of sensing light. An object of one embodiment of the present invention is to provide a method for manufacturing a display apparatus having a function of sensing light with high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a first pixel. The first pixel includes a first light-emitting device, a second light-emitting device, a first light-receiving device, and a second light-receiving device. The first light-emitting device and the second light-emitting device have functions of emitting visible light with different wavelengths. The first light-receiving device has a function of sensing light emitted from the first light-emitting device. The second light-receiving device has a function of sensing infrared light.

One embodiment of the present invention is a display apparatus including a first pixel. The first pixel includes a first light-emitting device, a second light-emitting device, a third light-emitting device, a first light-receiving device, and a second light-receiving device. The first light-emitting device has a function of emitting red light. The second light-emitting device has a function of emitting green light. The third light-emitting device has a function of emitting blue light. The first light-receiving device has a function of sensing light emitted from at least one of the first light-emitting device, the second light-emitting device, and the third light-emitting device. The second light-receiving device has a function of sensing infrared light.

The second light-receiving device preferably has a function of sensing an object that is not touching the display apparatus.

The area of a light-receiving region of the first light-receiving device is preferably smaller than the area of a light-receiving region of the second light-receiving device.

Each of the above display apparatuses preferably includes a second pixel including the first light-emitting device, the second light-emitting device, the first light-receiving device, and a sensor device.

One embodiment of the present invention is an electronic device which includes the display apparatus having any of the above structures and has a function of measuring, with the sensor device, at least one of force, displacement, position, speed, acceleration, angular velocity, rotational frequency, distance, magnetism, temperature, chemical substance, time, hardness, electric field, electric current, voltage, electric power, radiation, flow rate, humidity, gradient, oscillation, odor, physical condition, pulse, body temperature, and blood oxygen level.

Alternatively, each of the above display apparatuses preferably includes a second pixel including the first light-emitting device, the second light-emitting device, a fourth light-emitting device, and the first light-receiving device.

Another embodiment of the present invention is an electronic device including the display apparatus having any of the above structures, a fourth light-emitting device, and a housing. The fourth light-emitting device preferably has a function of emitting infrared light. The fourth light-emitting device preferably emits light to the outside of the electronic device through the display apparatus.

One embodiment of the present invention is a display module that includes the display apparatus having any of the above structures. For example, the display module is a display module provided with a connector such as a flexible printed circuit (hereinafter referred to as an FPC) or a TCP (Tape Carrier Package) or a display module mounted with an integrated circuit (IC) by a COG (Chip On Glass) method, a COF (Chip On Film) method, or the like.

One embodiment of the present invention is an electronic device including the above display module and at least one of a housing, a battery, a camera, a speaker, and a microphone.

One embodiment of the present invention is a method for manufacturing a display apparatus, including the steps of forming a first pixel electrode, a second pixel electrode, and a third pixel electrode; forming a first layer including a light-emitting layer over the first pixel electrode, the second pixel electrode, and the third pixel electrode; forming a first sacrificial layer over the first layer; processing the first layer and the first sacrificial layer so that the second pixel electrode and the third pixel electrode are exposed; forming a second layer including a first active layer over the first pixel electrode, the second pixel electrode, and the third pixel electrode; forming a second sacrificial layer over the second layer; processing the second layer and the second sacrificial layer so that the first sacrificial layer and the third pixel electrode are exposed; forming a third layer including a second active layer over the first pixel electrode, the second pixel electrode, and the third pixel electrode; forming a third sacrificial layer over the third layer; processing the third layer and the third sacrificial layer so that the first sacrificial layer and the second sacrificial layer are exposed; removing the first sacrificial layer, the second sacrificial layer, and the third sacrificial layer; and forming a common electrode over the first layer, the second layer, and the third layer.

After the removal of the first sacrificial layer, the second sacrificial layer, and the third sacrificial layer, a fourth layer may be formed over the first layer, the second layer, and the third layer, and a common electrode may be formed over the fourth layer.

A protective layer may be formed over the common electrode.

Effect of the Invention

One embodiment of the present invention can provide a high-resolution display apparatus having a function of sensing light. One embodiment of the present invention can provide a high-definition display apparatus having a function of sensing light. One embodiment of the present invention can provide a large display apparatus having a function of sensing light. One embodiment of the present invention can provide a highly reliable display apparatus having a function of sensing light.

One embodiment of the present invention can provide a method for manufacturing a high-resolution display apparatus having a function of sensing light. One embodiment of the present invention can provide a method for manufacturing a high-definition display apparatus having a function of sensing light. One embodiment of the present invention can provide a method for manufacturing a large display apparatus having a function of sensing light. One embodiment of the present invention can provide a method for manufacturing a highly reliable display apparatus having a function of sensing light. One embodiment of the present invention can provide a method for manufacturing a display apparatus having a function of sensing light with high yield.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 5 is a diagram illustrating an example of a layout of a display apparatus.

FIG. 7 is a diagram illustrating an example of a layout of a display apparatus.

FIG. 16A to FIG. 16D are diagrams each illustrating a structure example of a light-emitting device.

FIG. 22A to FIG. 22D are diagrams illustrating examples of electronic devices.

FIG. 23A to FIG. 23F are diagrams illustrating examples of electronic devices.

MODE FOR CARRYING OUT THE INVENTION

Figure 1A:
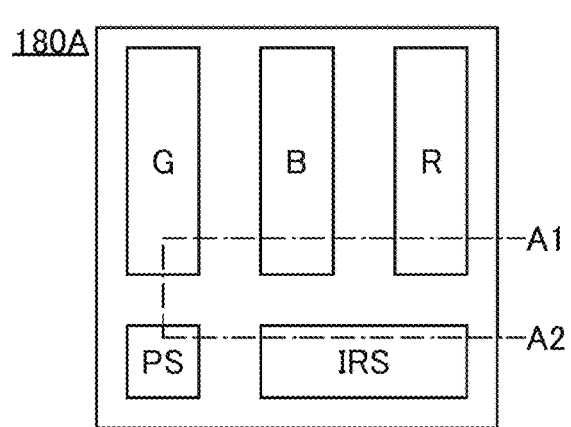
FIG. 1A and FIG. 1B are diagrams each illustrating an example of a pixel of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, display apparatuses of embodiments of the present invention are described with reference to FIG. 1 to FIG. 8.

A display apparatus of one embodiment of the present invention includes a first pixel including a light-emitting device, a first light-receiving device, and a second light-receiving device.

The display apparatus of one embodiment of the present invention can display an image with the light-emitting device.

The area of a light-receiving region (also simply referred to as a light-receiving area) of the first light-receiving device is preferably smaller than that of the second light-receiving device. The first light-receiving device can capture a higher-resolution image than the second light-receiving device owing to its smaller imaging range. In this case, the first light-receiving device can be used to capture an image for personal authentication using a fingerprint, a palm print, the iris, the shape of a blood vessel (including the shape of a vein and the shape of an artery), a face, or the like. The wavelength of light sensed by the first light-receiving device can be determined depending on the application purpose. For example, the first light-receiving device preferably senses visible light.

The second light-receiving device can be used in a touch sensor (also referred to as a direct touch sensor), a near touch sensor (also referred to as a hover sensor, a hover touch sensor, a contactless sensor, or a touchless sensor), or the like. The wavelength of light sensed by the second light-receiving device can be determined depending on the application purpose. For example, the second light-receiving device preferably senses infrared light (including near-infrared light). Thus, a touch can be sensed even in a dark place. In the case where the second light-receiving device senses infrared light, highly sensitive sensing can sometimes be performed even when dust, a drop of water, or the like is attached to the surface of the display apparatus, as compared to a capacitive touch sensor.

Here, the touch sensor or the near touch sensor can sense an approach or contact of an object (e.g., a finger, a hand, or a pen). The touch sensor can sense the object when the display apparatus and the object come in direct contact with each other. Furthermore, even when an object is not in contact with the display apparatus, the near touch sensor can sense the object. For example, the display apparatus is preferably capable of sensing an object positioned in the range of 0.1 mm to 300 mm inclusive, more preferably 3 mm to 50 mm inclusive from the display apparatus. This structure enables the display apparatus to be operated without direct contact of an object. In other words, the display apparatus can be operated in a contactless (touchless) manner. With the above-described structure, the display apparatus can have a reduced risk of being dirty or damaged, or can be operated without the object directly touching a dirt (e.g., dust, or a virus) attached to the display apparatus.

Since the first light-receiving device and the second light-receiving device have difference in the sensing accuracy, methods for sensing an object may be selected depending on the functions. For example, a function of scrolling a display screen may be achieved by a near touch sensor function using the second light-receiving device, and an input function with a keyboard displayed on a screen may be achieved by a high-resolution touch sensor function using the first light-receiving device.

When one pixel includes two kinds of light-receiving devices, the display apparatus can have two additional functions as well as a display function, enabling a multi-functional display apparatus.

For high-resolution image capturing, the first light-receiving devices are preferably provided in all pixels included in the display apparatus. In contrast, the second light-receiving devices used for a touch sensor, a near touch sensor, or the like only need to be provided in some pixels included in the display apparatus because sensing with the second light-receiving devices is not required to have high accuracy as compared to sensing with the first light-receiving devices. When the number of second light-receiving devices included in the display apparatus is smaller than the number of first light-receiving devices, the sensing speed can be increased.

In view of the above, the display apparatus of one embodiment of the present invention can have a structure in which a plurality of first pixels described above and a plurality of second pixels are included. The second pixel includes the light-emitting device and the first light-receiving device like the first pixel, and includes no second light-receiving device and another device instead unlike the first pixel.

The second pixel can include any of a variety of sensor devices, a light-emitting device that emits infrared light, or the like. A device different from the devices provided in the first pixel is provided in the second pixel in this way, whereby the display apparatus can be a multifunctional display apparatus.

In the case where light-emitting devices of three colors of red, green, and blue are provided in a pixel for full-color display, one pixel includes five subpixels in total with two light-receiving devices. In such a pixel including many subpixels, a high aperture ratio is extremely difficult to achieve. Alternatively, a high-resolution display apparatus is difficult to achieve with the use of a pixel including many subpixels. In view of this, the display apparatus of one embodiment of the present invention is preferably manufactured by a method for manufacturing a display apparatus of one embodiment of the present invention, which is to be described in detail in Embodiment 2.

In the method for manufacturing a display apparatus, which is to be described in Embodiment 2, an island-shaped EL layer is formed by processing an EL layer formed on the entire surface, not by using a fine metal mask. Accordingly, a high-resolution display apparatus or a display apparatus having a high aperture ratio, which has been difficult to achieve, can be manufactured. Moreover, a high-resolution display apparatus or a display apparatus with a high aperture ratio, which incorporates a light-receiving device and has a function of sensing light, can be manufactured.

As described above, the display apparatus of one embodiment of the present invention can be a multifunctional display apparatus having a high aperture ratio or high resolution.

FIG. 1A illustrates an example of a pixel included in the display apparatus of one embodiment of the present invention.

A pixel 180A illustrated in FIG. 1A includes a subpixel G, a subpixel B, a subpixel R, a subpixel PS, and a subpixel IRS.

FIG. 1A illustrates an example in which one pixel 180A is provided in two rows and three columns. The pixel 180A includes three subpixels (the subpixel G, the subpixel B, and the subpixel R) in the upper row (first row) and two subpixels (the subpixel PS and the subpixel IRS) in the lower row (second row). In other words, the pixel 180A includes two subpixels (the subpixel G and the subpixel PS) in the left column (first column), the subpixel B in the center column (second column), the subpixel R in the right column (third column), and the subpixel IRS across the center and right columns. Note that the layout of the subpixels is not limited to the layout illustrated in FIG. 1A.

Figure 1B:
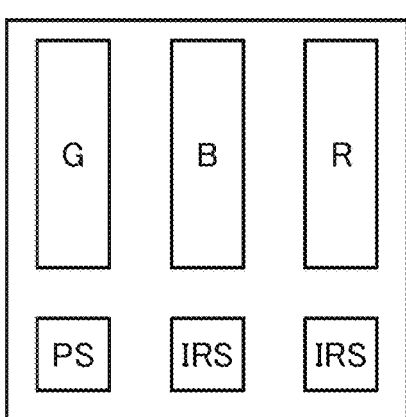

As illustrated in FIG. 1B, three subpixels (the subpixel PS and two subpixels IRS) may be provided also in the lower row (second row). Aligning the positions of the subpixels in the upper row and the lower row as illustrated in FIG. 1B enables dust and the like that would be produced in the manufacturing process to be removed efficiently. Thus, a display apparatus having high display quality can be provided.

Figure 1C:
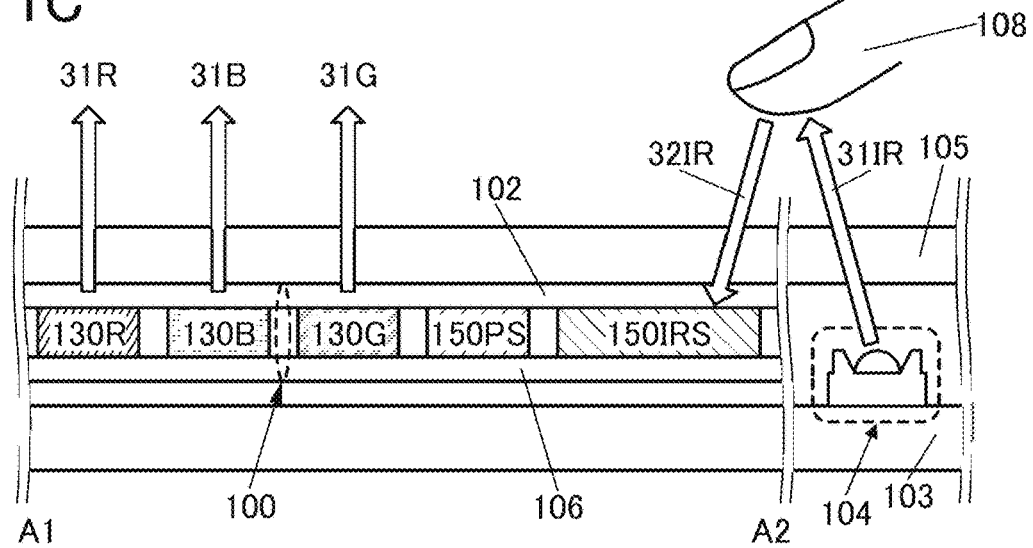
FIG. 1C and FIG. 1D are cross-sectional views each illustrating an example of an electronic device.
Figure 1D:
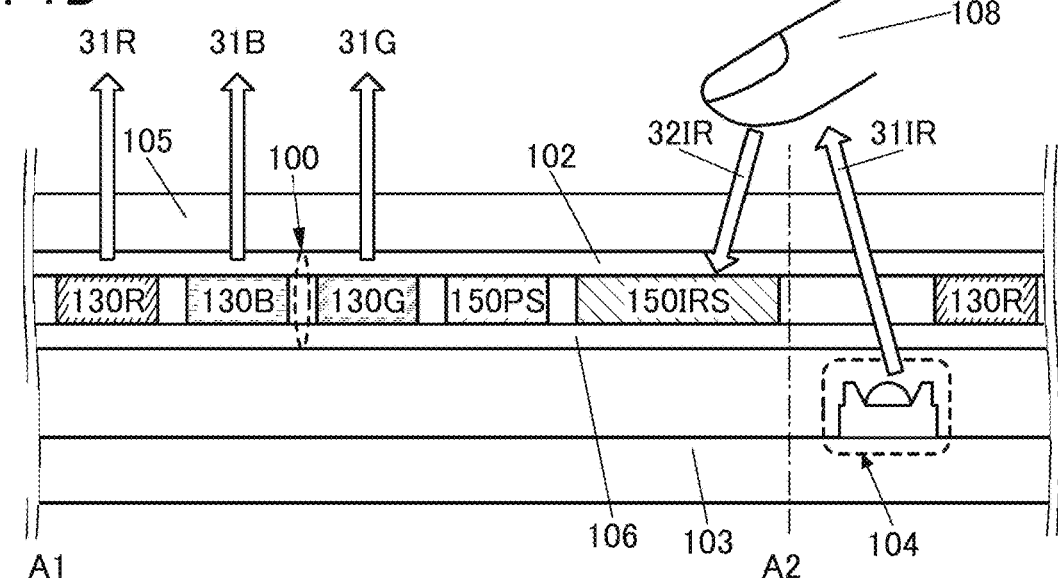

FIG. 1C and FIG. 1D are each an example of a cross-sectional view of an electronic device including the display apparatus of one embodiment of the present invention.

Each of the electronic devices illustrated in FIG. 1C and FIG. 1D includes a display apparatus 100 and a light source 104 between a housing 103 and a protection member 105.

The light source 104 includes a light-emitting device that emits infrared light 311B. For example, a light emitting diode (LED) is preferably used for the light source 104.

FIG. 1C illustrates an example in which the light source 104 is positioned so as not to overlap with the display apparatus 100. In this case, light of the light source 104 is emitted to the outside of the electronic device through the protection member 105.

FIG. 1D illustrates an example in which the display apparatus and the light source 104 are provided to overlap with each other. In this case, light of the light source 104 is emitted to the outside of the electronic device through the display apparatus 100 and the protection member 105.

The cross-sectional structures of the display apparatuses 100 in FIG. 1C and FIG. 1D each correspond to a cross-sectional structure taken along a dashed-dotted line A1-A2 in FIG. 1A. The display apparatus 100 includes a plurality of light-emitting devices and a plurality of light-receiving devices between a substrate 106 and a substrate 102.

The subpixel R includes a light-emitting device 130R that emits red light 31R. The subpixel G includes a light-emitting device 130G that emits green light 31G. The subpixel B includes a light-emitting device 130B that emits blue light 31B.

The subpixel PS includes a light-receiving device 150PS, and the subpixel IRS includes a light-receiving device 150IRS.

As illustrated in FIG. 1C and FIG. 1D, the infrared light 311R emitted from the light source 104 is reflected by an object 108 (here, a finger), and reflected light 321R from the object 108 enters the light-receiving device 150IRS. The object 108 is not touching the electronic device, but the object 108 can be sensed with the light-receiving device 150IRS.

An example in which an object is sensed with the use of the infrared light 311R is described in this embodiment. The wavelength of light sensed by the light-receiving device 150IRS is not particularly limited. The light-receiving device 150IRS preferably senses infrared light. Alternatively, the light-receiving device 150IRS may sense visible light or both infrared light and visible light.

In a touch sensor or a near touch sensor, an increase in the light-receiving area of a light-receiving device can facilitate sensing of an object in some cases. Thus, as illustrated in FIG. 2A, the object 108 may be sensed with both the light-receiving device 150PS and the light-receiving device 150IRS.

Figure 2A:
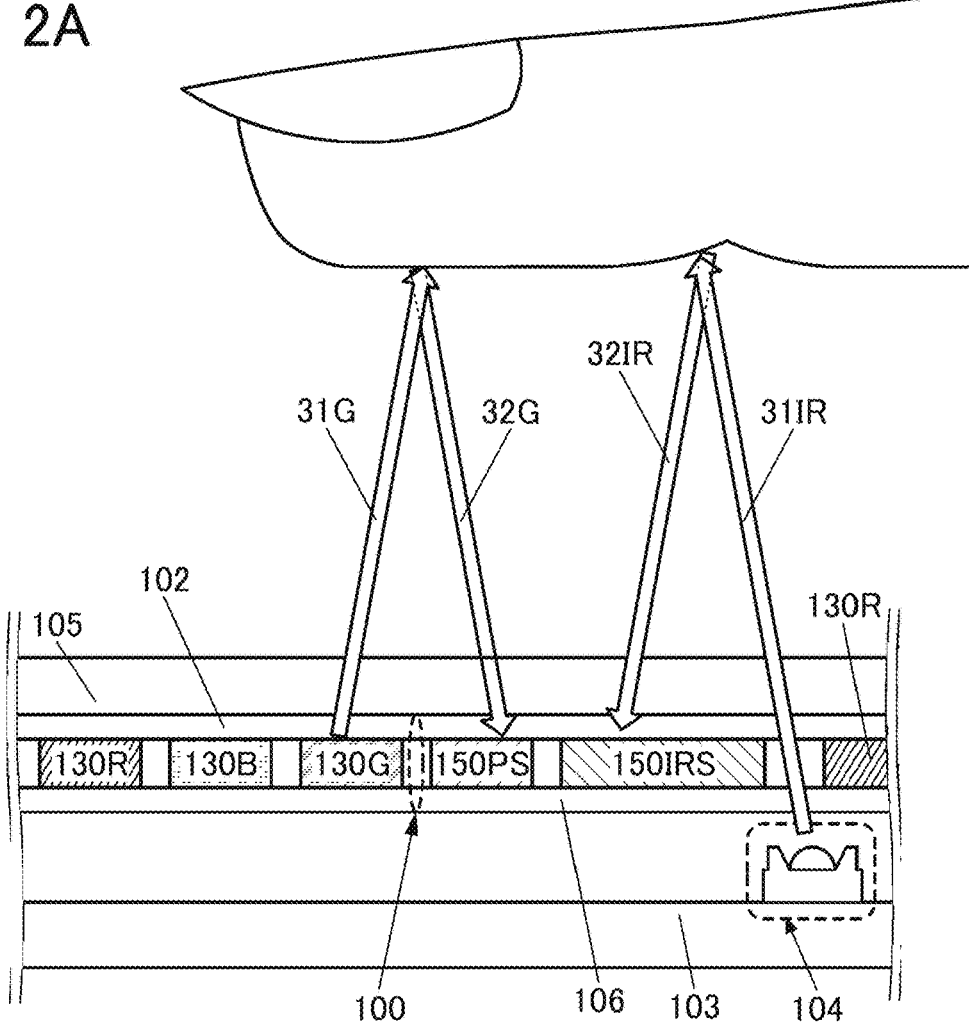
FIG. 2A and FIG. 2B are cross-sectional views illustrating an example of an electronic device.

In FIG. 2A, as in FIG. 1C and FIG. 1D, the infrared light 311B emitted from the light source 104 is reflected by the object 108 (here, a finger), and the reflected light 321R from the object 108 enters the light-receiving device 150IRS. In FIG. 2A, the green light 31G emitted from the light-emitting device 130G is also reflected by the object 108 and reflected light 32G from the object 108 enters the light-receiving device 150PS. The object 108 is not touching the electronic device, but the object 108 can be sensed with the light-receiving device 150IRS and the light-receiving device 150PS.

Note that the object 108 that is touching the electronic device can also be sensed with the light-receiving device 150IRS (and the light-receiving device 150PS).

The light-receiving area of the subpixel PS is smaller than the light-receiving area of the subpixel IRS. A smaller light-receiving area leads to a narrower image-capturing range, inhibits a blur in a captured image, and improves the definition. Thus, the use of the subpixel PS enables higher-resolution or higher-definition image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

Figure 2B:
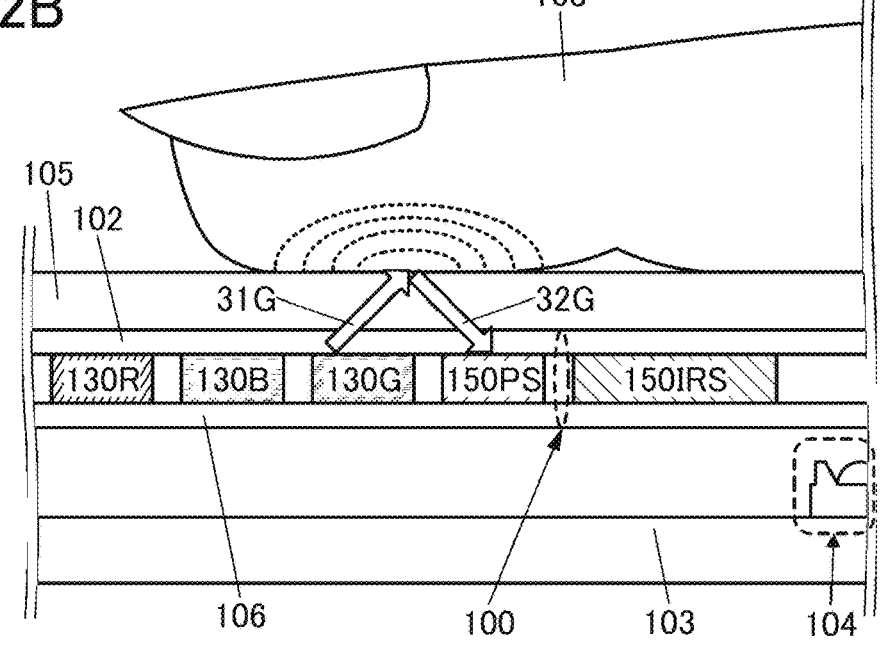

For example, as illustrated in FIG. 2B, the green light 31G emitted from the light-emitting device 130G is reflected by the object 108 and the reflected light 32G from the object 108 enters the light-receiving device 150PS. A fingerprint image of the object 108 can be captured with the light-receiving device 150PS.

In this embodiment, an example is described in which the light-receiving device 150PS senses an object with the use of the green light 31G emitted from the light-receiving device 130G. The wavelength of light sensed by the light-receiving device 150PS is not particularly limited. The light-receiving device 150PS preferably senses visible light, and preferably senses one or more of blue light, violet light, bluish violet light, green light, greenish yellow light, yellow light, orange light, red light, and the like. The light-receiving device 150PS may sense infrared light.

For example, the light-receiving device 150PS may have a function of sensing the red light 31R emitted from the light-emitting device 130R. Furthermore, the light-receiving device 150PS may have a function of sensing the blue light 31B emitted from the light-emitting device 130B.

Note that a light-emitting device that emits light sensed by the light-receiving device 150PS is preferably provided in a subpixel positioned close to the subpixel PS in the pixel. For example, the pixel 180A has a structure in which light emitted from the light-emitting device 130G included in the subpixel G adjacent to the subpixel PS is sensed by the light-receiving device 150PS. With such a structure, the sensing accuracy can be increased.

In the display apparatus of one embodiment of the present invention, the structure of the pixel 180A may be employed for all the pixels; alternatively, the structure of the pixel 180A may be employed for some of the pixels and another structure may be employed for the other pixels.

Figure 3A:
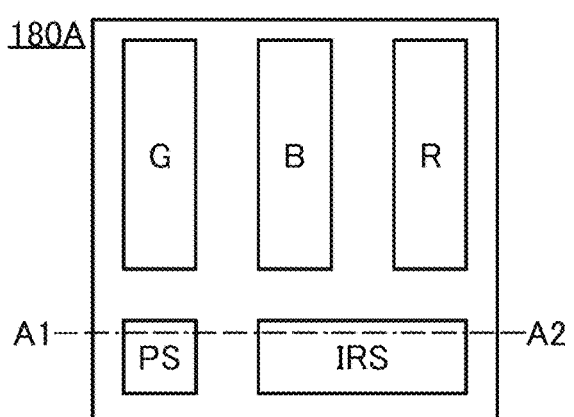
FIG. 3A to FIG. 3D are diagrams each illustrating an example of a pixel of a display apparatus.
Figure 3B:
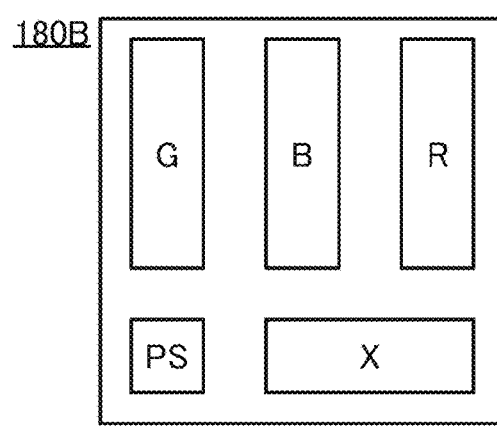

For example, the display apparatus of one embodiment of the present invention may include both the pixel 180A illustrated in FIG. 3A and a pixel 180B illustrated in FIG. 3B. The pixel 180A illustrated in FIG. 3A has a structure similar to the structure of the pixel 180A illustrated in FIG. 1A, and the detailed description thereof is omitted.

The pixel 180B illustrated in FIG. 3B includes the subpixel G, the subpixel B, the subpixel R, the subpixel PS, and a subpixel X.

Figure 3C:
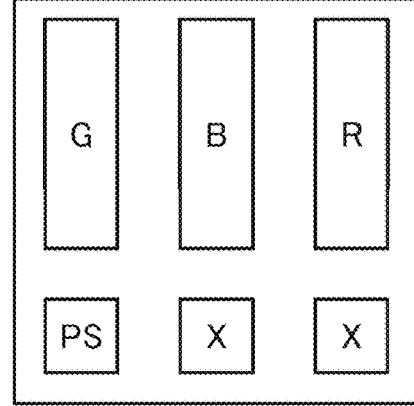

As illustrated in FIG. 3C, a pixel may include three subpixels (the subpixel PS and two subpixels X) in the lower row (second row). As described above, aligning the positions of the subpixels in the upper row and the lower row enables dust and the like that would be produced in the manufacturing process to be removed efficiently. Accordingly, a display apparatus having high display quality can be provided.

With a device included in the subpixel X, the display apparatus or an electronic device including the display apparatus can have a variety of functions.

For example, with the device included in the subpixel X, the display apparatus or the electronic device can have a function of measuring at least one of force, displacement, position, speed, acceleration, angular velocity, rotational frequency, distance, magnetism, temperature, chemical substance, time, hardness, electric field, electric current, voltage, electric power, radiation, flow rate, humidity, gradient, oscillation, odor, physical condition, pulse, body temperature, blood oxygen level, and arterial oxygen saturation.

Examples of the function of the display apparatus or the electronic device include a strobe light function, a flashlight function, a degradation correction function, an acceleration sensing function, an odor sensing function, a function of sensing the physical condition, a pulse sensing function, a body temperature sensing function, a pulse oximeter function, and a function of measuring the blood oxygen level.

A strobe light function can be obtained, for example, by repetition of light emission and non-light emission at short intervals.

A flashlight function can be obtained, for example, with a structure where flash of light is caused by instantaneous discharge using principles of an electric double layer.

For example, a strobe light function and a flashlight function can be used for crime prevention, self-defense, or the like. The light emission color of a strobe light and a flashlight is preferably white. There is no particular limitation on the light emission color of the strobe light and the flashlight; the practitioner can appropriately select one or more optimal light emission colors from white, blue, violet, bluish violet, green, yellowish green, yellow, orange, red, and the like.

As the degradation correction function, a function of correcting degradation of a light-emitting device included in at least one subpixel selected from the subpixel G, the subpixel B, and the subpixel R can be given. Specifically, in the case where a material used for the light-emitting device included in the subpixel G has poor reliability, a structure including two subpixels G in the pixel 180B can be employed by making the subpixel X have the same structure as the subpixel G. Such a structure can double the area of the subpixel G. When the area of the subpixel G doubles, the reliability can be approximately two times as high as the case of one subpixel G. Alternatively, when two subpixels G are provided in the pixel 180B, one subpixel G may compensate for light emission of the other subpixel G that cannot emit light due to degradation or the like.

Although the case of the subpixel G is described in the above, the subpixel B and the subpixel R can also have similar structures.

The acceleration sensing function, the odor sensing function, the function of sensing the physical condition, the pulse sensing function, the body temperature sensing function, and the function of measuring the blood oxygen level can each be achieved by providing a sensor device necessary for each sensing in the subpixel X. The display apparatus or the electronic device can have a variety of functions depending on the sensor device provided in the subpixel X.

When a variety of functions are given to the subpixel X illustrated in FIG. 3B as described above, the display apparatus including the pixel 180B can be referred to as a multifunctional display apparatus or a multifunctional panel. Note that the subpixel X may have one function or two or more functions, and the practitioner can appropriately select optimal function(s).

Note that the display apparatus of one embodiment of the present invention may include a pixel composed of four subpixels without the subpixel X nor the subpixel IRS. That is, the display apparatus may include a pixel composed of the subpixel G, the subpixel B, the subpixel R, and the subpixel PS. In the display apparatus, the number of subpixels may vary among pixels. However, it is preferable that all pixels have the same number of subpixels for uniform quality of the pixels.

Figure 3D:
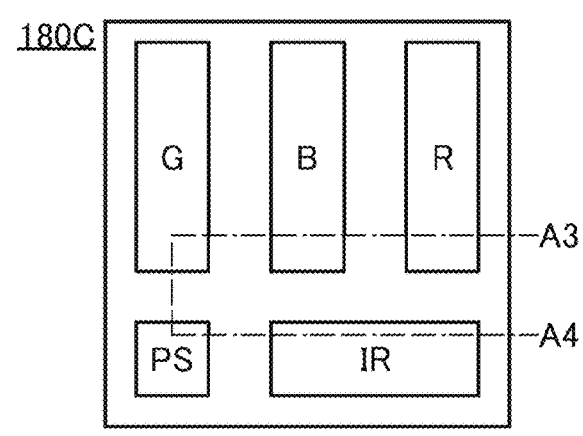

For example, the display apparatus of one embodiment of the present invention may include both the pixel 180A illustrated in FIG. 3A and a pixel 180C illustrated in FIG. 3D.

The pixel 180C illustrated in FIG. 3D includes the subpixel G, the subpixel B, the subpixel R, the subpixel PS, and a subpixel IR.

The subpixel IR includes a light-emitting device that emits infrared light. That is, the subpixel IR can be used as a light source of a sensor. When the display apparatus includes a light-emitting device that emits infrared light, a light source need not be provided separately from the display apparatus, reducing the number of components of the electronic device.

Figure 3E:
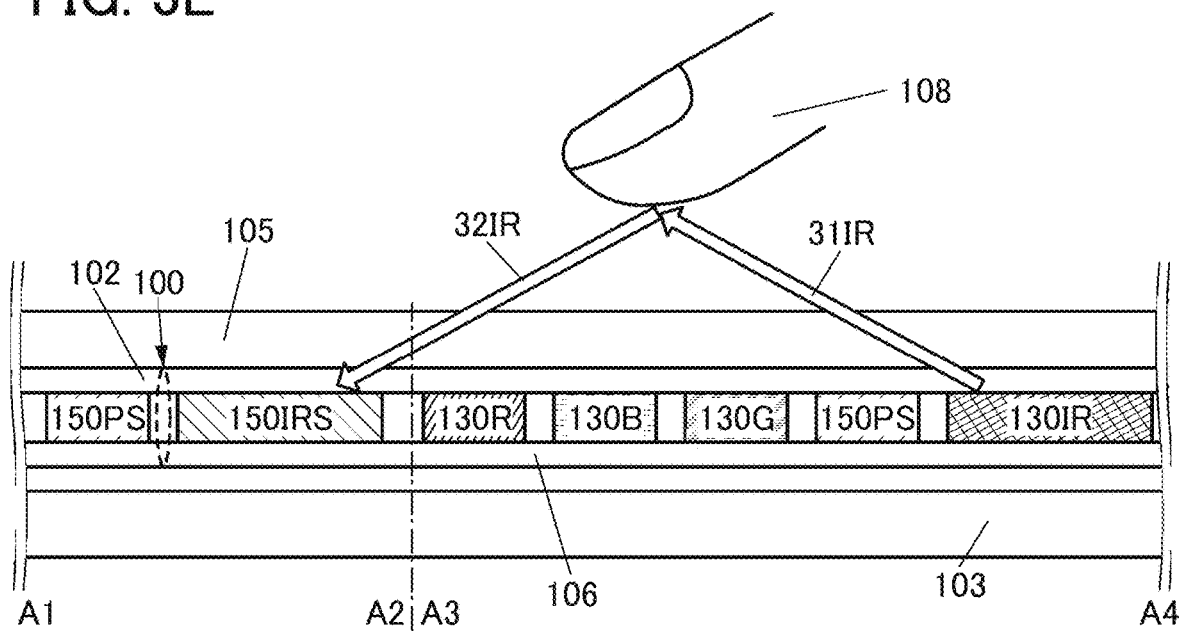
FIG. 3E is a cross-sectional view illustrating an example of an electronic device.

FIG. 3E is an example of a cross-sectional view of an electronic device including the display apparatus of one embodiment of the present invention.

The electronic device illustrated in FIG. 3E includes the display apparatus 100 between the housing 103 and the protection member 105.

The cross-sectional structure of the display apparatus 100 in FIG. 3E corresponds to the cross-sectional structure taken along a dashed-dotted line A1-A2 in FIG. 3A and the cross-sectional structure taken along a dashed-dotted line A3-A4 in FIG. 3D. That is, the display apparatus 100 illustrated in FIG. 3E includes the pixel 180A and the pixel 180C.

The subpixel R includes the light-emitting device 130R that emits the red light 31R. The subpixel G includes the light-emitting device 130G that emits the green light 31G. The subpixel B includes the light-emitting device 130B that emits the blue light 31B.

The subpixel PS includes the light-receiving device 150PS, and the subpixel IRS includes the light-receiving device 150IRS. The subpixel IR includes a light-emitting device 13018 that emits the infrared light 3118.

As illustrated in FIG. 3E, the infrared light 31IR emitted from the light-emitting device 1301R is reflected by the object 108 (here, a finger), and the reflected light 321R from the object 108 enters the light-receiving device 150IRS. The object 108 is not touching the electronic device, but the object 108 can be sensed with the light-receiving device 150IRS.

FIG. 4 to FIG. 7 illustrate examples of a layout of the display apparatus.

A near touch sensor function can be achieved in such a manner that, for example, an object (e.g., a finger, a hand, or a pen) is irradiated with light from a light source fixed to a specific position, reflected light from the object is sensed by a plurality of subpixels IRS, and the position of the object is estimated from the sensing intensity ratio among the plurality of subpixels IRS.

The pixels 180A including the subpixels IRS can be arranged at regular intervals in a display portion or arranged around the display portion, for example.

The driving frequency can be increased when near touch sensing is performed using only some of the pixels. Furthermore, since the subpixel X or the subpixel IR can be included in the other pixels, the display apparatus can be a multifunctional display apparatus.

Figure 4:
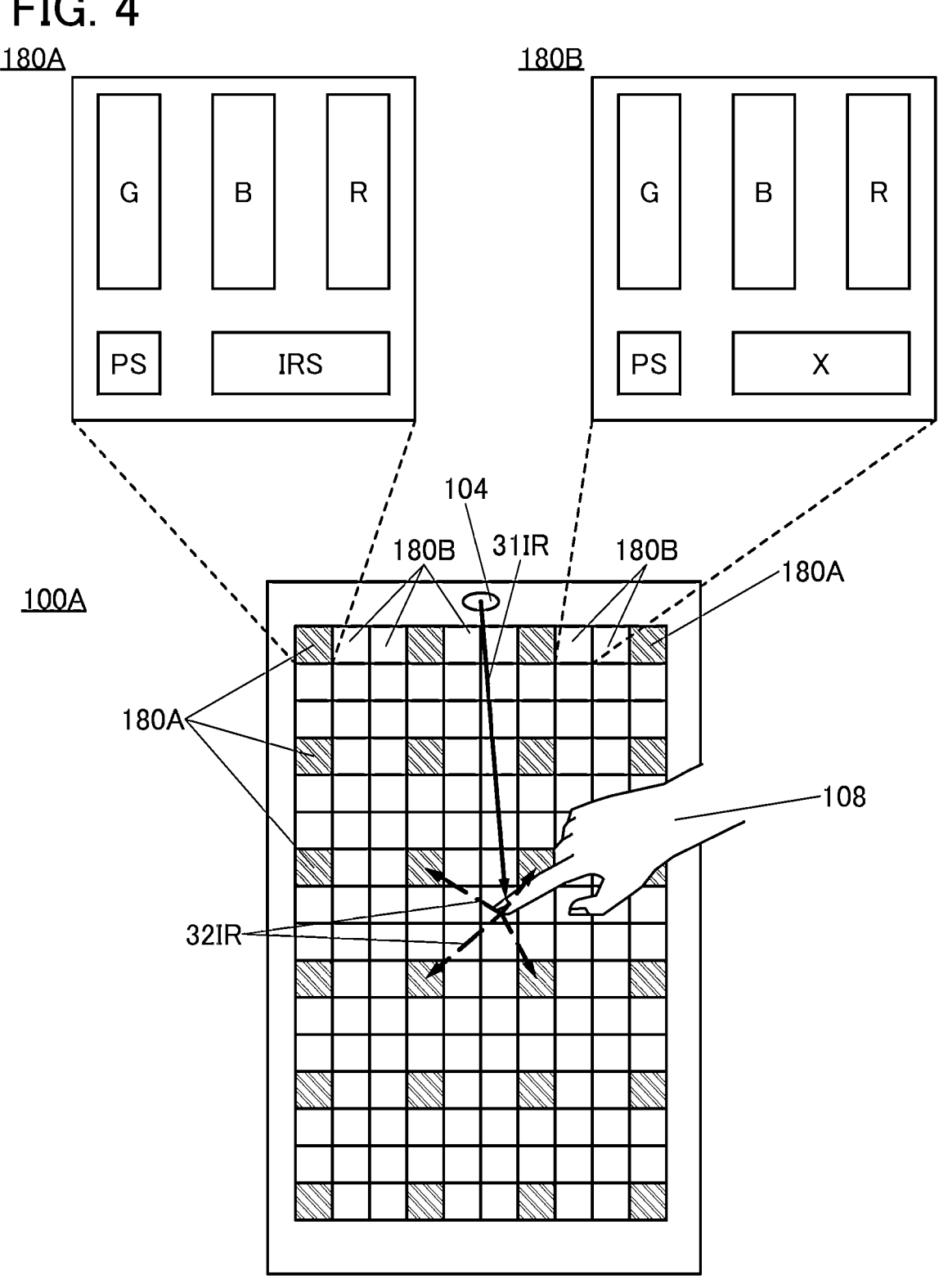
FIG. 4 is a diagram illustrating an example of a layout of a display apparatus.

A display apparatus 100A illustrated in FIG. 4 includes two kinds of pixels, the pixel 180A and the pixel 180B. In the display apparatus 100A, one pixel 180A is provided in every 3×3 pixels (9 pixels), and the other pixels are the pixels 180B.

Note that the placement interval of the pixels 180A is not limited to one in every 3×3 pixels. For example, the placement interval of pixels used for touch sensing can be determined as appropriate to be 1 pixel in every 4 pixels (2×2 pixels), 1 pixel in every 16 pixels (4×4 pixels), 1 pixel in every 100 pixels (10×10 pixels), 1 pixel in every 900 pixels (30×30 pixels), or the like.

Figure 5:
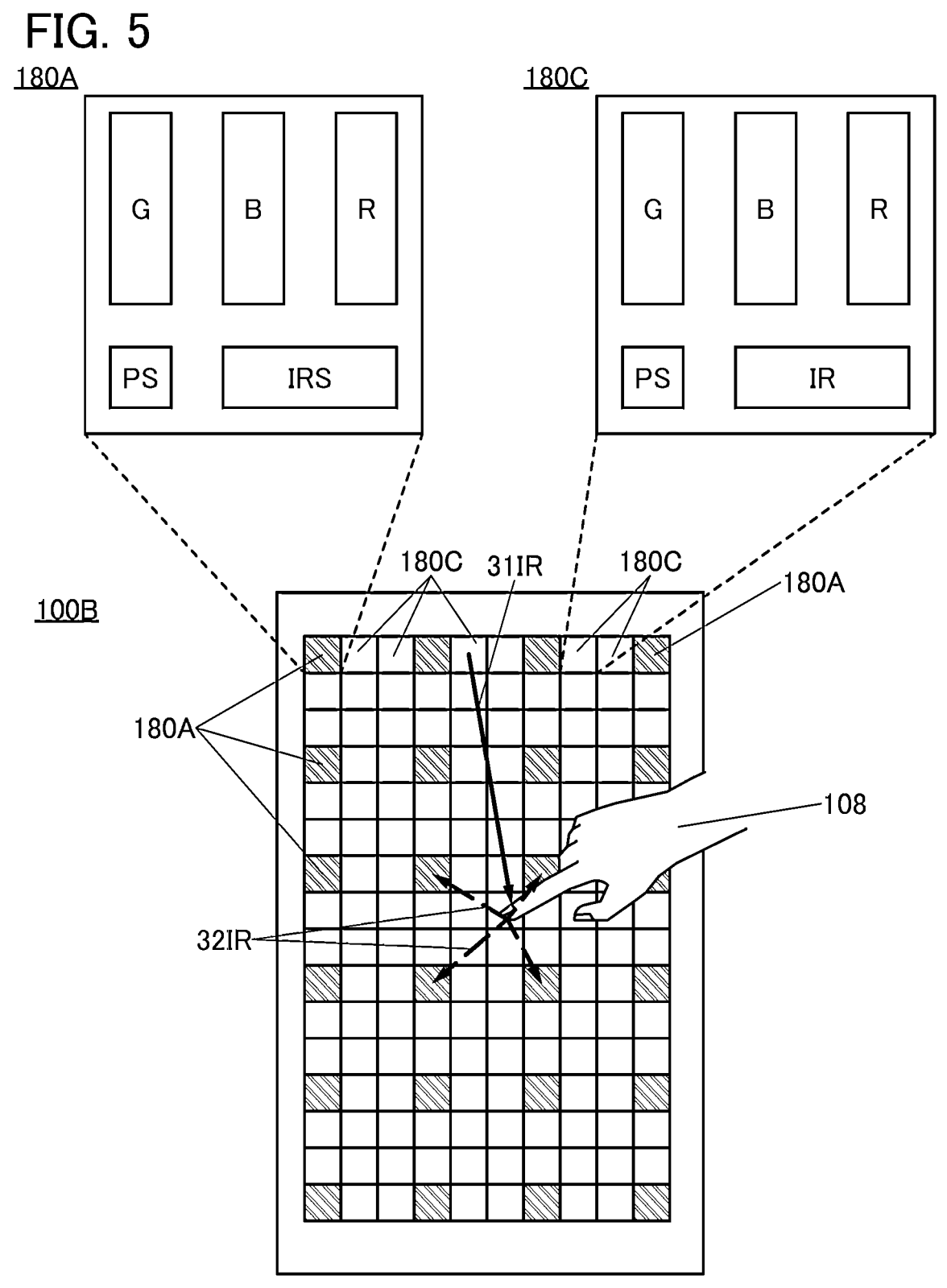

A display apparatus 100B illustrated in FIG. 5 includes two kinds of pixels, the pixel 180A and the pixel 180C. In the display apparatus 100B, one pixel 180A is provided in every 3×3 pixels (9 pixels), and the other pixels are the pixels 180C.

Figure 6:
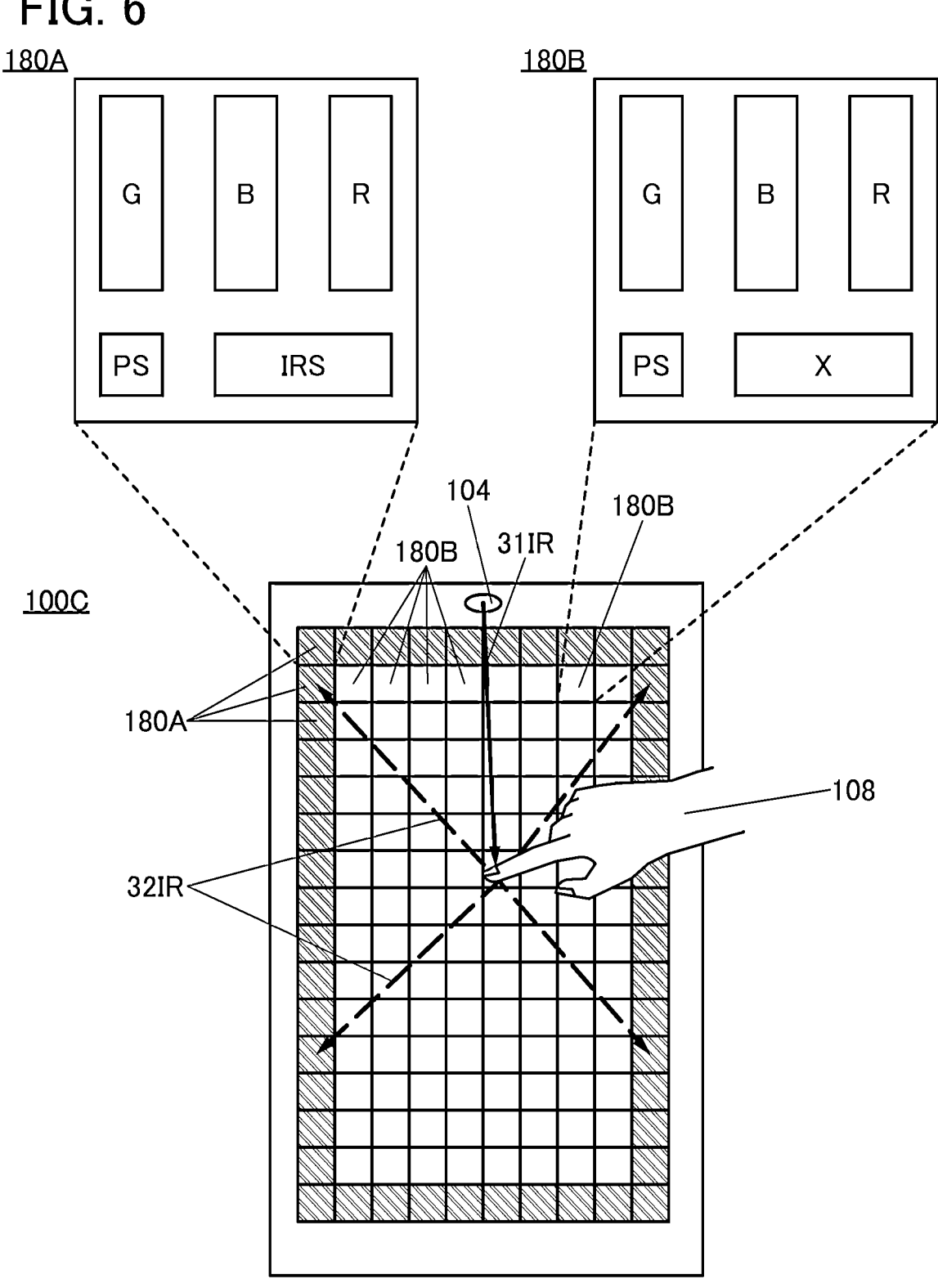
FIG. 6 is a diagram illustrating an example of a layout of a display apparatus.

A display apparatus 100C illustrated in FIG. 6 includes two kinds of pixels, the pixel 180A and the pixel 180B. In the display apparatus 100C, the pixels 180A are provided around the display portion, and the other pixels are the pixels 180B.

In the case where the pixels 180A are provided around the display portion, the pixels 180A can be arranged in a variety of ways: the pixels 180A may be arranged to surround all four sides as in FIG. 6; the pixels 180A may be provided at four corners; or one or more of the pixels 180A may be provided for each side.

Figure 7:
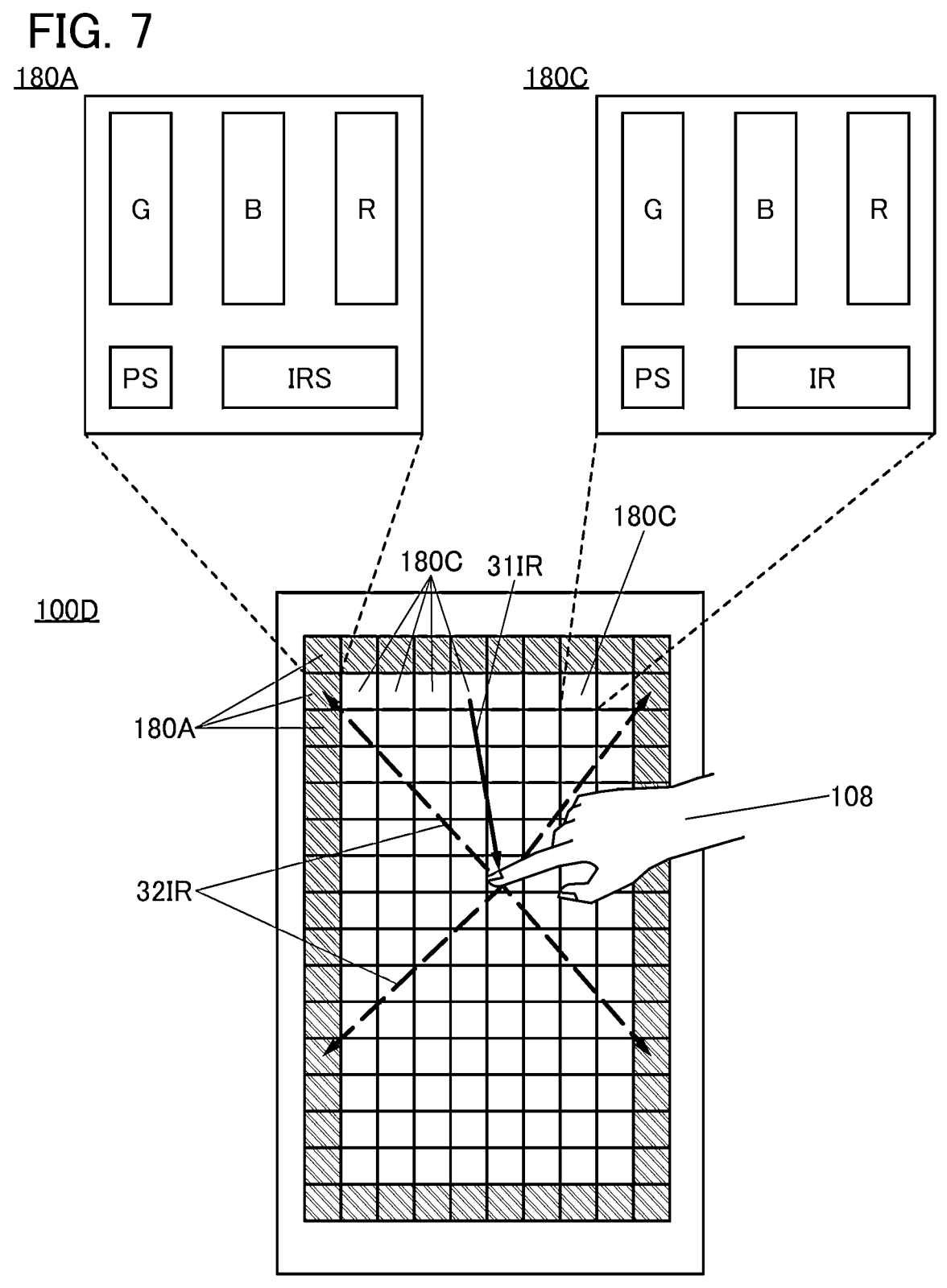

A display apparatus 100D illustrated in FIG. 7 includes two kinds of pixels, the pixel 180A and the pixel 180C. In the display apparatus 100D, the pixels 180A are provided around the display portion, and the other pixels are the pixels 180C.

In FIG. 4 and FIG. 6, the infrared light 31IR emitted from the light source 104 provided in the outside of the display portion of the display apparatus is reflected by the object 108, and the reflected light 3218 from the object 108 enters the plurality of pixels 180A. The reflected light 321R is sensed by the subpixels IRS provided in the pixels 180A, and thus the position of the object 108 can be estimated from the sensing intensity ratio among the plurality of subpixels IRS.

Note that the light source 104 is provided at least in the outside of the display portion of the display apparatus. The light source 104 may be incorporated in the display apparatus or mounted on an electronic device separately from the display apparatus. As the light source 104, a light-emitting diode that emits infrared light can be used, for example.

In FIG. 5 and FIG. 7, the infrared light 31IR emitted from the subpixel IR included in the pixel 180C is reflected by the object 108, and the reflected light 321R from the object 108 enters the plurality of pixels 180A. The reflected light 321R is sensed by the subpixels IRS provided in the pixels 180A, and thus the position of the object 108 can be estimated from the sensing intensity ratio among the plurality of subpixels IRS.

As described above, the display apparatus can have a variety of layouts.

Figure 8:
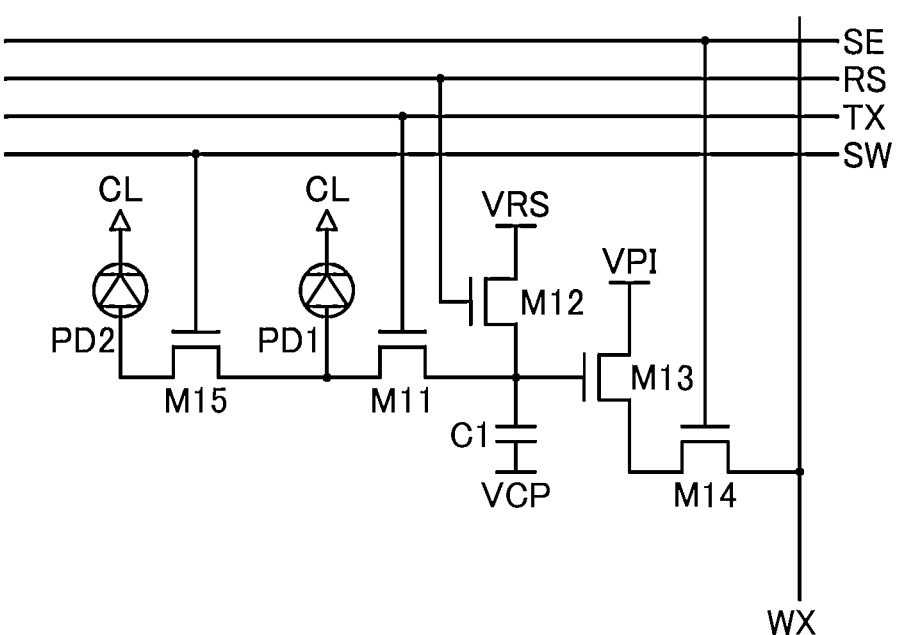
FIG. 8 is a diagram illustrating an example of a pixel circuit.

FIG. 8 illustrates an example of a pixel circuit including two light-receiving devices.

The pixel illustrated in FIG. 8 includes transistors M11, M12, M13, M14, and M15, a capacitor C1, and light-receiving devices PD1 and PD2.

A gate of the transistor M11 is electrically connected to a wiring TX, one of a source and a drain of the transistor M11 is electrically connected to an anode electrode of the light-receiving device PD1 and one of a source and a drain of the transistor M15, and the other of the source and the drain of the transistor M11 is electrically connected to one of a source and a drain of the transistor M12, a first electrode of the capacitor C1, and a gate of the transistor M13. A gate of the transistor M12 is electrically connected to a wiring RS, and the other of the source and the drain of the transistor M12 is electrically connected to a wiring VRS. One of a source and a drain of the transistor M13 is electrically connected to a wiring VPI, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring WX. A gate of the transistor M15 is electrically connected to a wiring SW, and the other of the source and the drain of the transistor M15 is electrically connected to the anode electrode of the light-receiving device PD1. Cathode electrodes of the light-receiving device PD1 and the light-receiving device PD2 are electrically connected to a wiring CL. A second electrode of the capacitor C1 is electrically connected to a wiring VCP.

Each of the transistor M11, the transistor M12, the transistor M14, and the transistor M15 functions as a switch. The transistor M13 functions as an amplifier element (amplifier).

In the display apparatus of one embodiment of the present invention, it is preferable to use transistors including a metal oxide (also referred to as an oxide semiconductor) in their semiconductor layers where channels are formed (such transistors are hereinafter also referred to as OS transistors) as all the transistors included in the pixel circuit. An OS transistor has an extremely low off-state current and enables charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are hereinafter also referred to as Si transistors) as all the transistors included in the pixel circuit. As silicon, single crystal silicon, polycrystalline silicon, amorphous silicon, and the like can be given. It is particularly preferable to use transistors including low-temperature polysilicon (LTPS) in their semiconductor layers (such transistors are hereinafter also referred to as LTPS transistors). An LTPS transistor has high field-effect mobility and can operate at high speed.

In the display apparatus of one embodiment of the present invention, two kinds of transistors are preferably used in the pixel circuit. Specifically, the pixel circuit preferably includes an OS transistor and an LTPS transistor. Changing the material of the semiconductor layer depending on the desired function of the transistor can increase the quality of the pixel circuit and the accuracy of sensing or image capturing.

For example, it is preferable to use, as all of the transistor M11 to the transistor M15, LTPS transistors including low-temperature polysilicon in their semiconductor layers. Alternatively, it is preferable that OS transistors including a metal oxide in their semiconductor layers be used as the transistor M11, the transistor M12, and the transistor M15 and an LTPS transistor be used as the transistor M13. In this case, the transistor M14 may be either an OS transistor or an LTPS transistor.

By using OS transistors as the transistor M11, the transistor M12, and the transistor M15, a potential held in the gate of the transistor M13 on the basis of charge generated in the light-receiving device PD1 and the light-receiving device PD2 can be prevented from leaking through the transistor M11, the transistor M12, or the transistor M15.

In contrast, an LTPS transistor is preferably used as the transistor M13. The LTPS transistor can have a higher field-effect mobility than the OS transistor, and has excellent drive capability and current capability. Thus, the transistor M13 can operate at higher speed than the transistor M11, the transistor M12, and the transistor M15. By using the LTPS transistor as the transistor M13, an output in accordance with the extremely low potential based on the amount of light received by the light-receiving device PD1 or the light-receiving device PD2 can be quickly supplied to the transistor M14.

In other words, in the pixel circuit illustrated in FIG. 8, the transistor M11, the transistor M12, and the transistor M15 have low leakage current and the transistor M13 has high drive capability, whereby, when the light-receiving device PD1 and the light-receiving device PD2 receive light, the charge transferred through the transistor M11 and the transistor M15 can be retained without leakage and high-speed reading can be performed.

Low off-state current, high-speed operation, and the like, which are required for the transistor M11 to the transistor M13 and the transistor M15, are not necessarily required for the transistor M14, which functions as a switch for supplying the output from the transistor M13 to the wiring WX. For this reason, either low-temperature polysilicon or an oxide semiconductor may be used for the semiconductor layer of the transistor M14.

Although n-channel transistors are shown as the transistors in FIG. 8, p-channel transistors can be used.

As described above, in the case where a high-resolution and clear image is required to be captured for personal authentication or the like, the aperture ratio (the light-receiving area) of the light-receiving device is preferably small. In contrast, in the case of a near touch sensor which only needs to sense an approximate position, for example, the aperture ratio (the light-receiving area) of the light-receiving device is preferably large. Accordingly, the aperture ratio (the light-receiving area) of the light-receiving device PD1 is preferably smaller than the aperture ratio (the light-receiving area) of the light-receiving device PD2. In addition, in the case where a high-resolution image is required to be captured, it is preferable that the image be captured only with the light-receiving device PD1 by turning on the transistor M11 and turning off the transistor M15. In contrast, in the case where sensing in a large area is performed, it is preferable to capture an image with both the light-receiving device PD1 and the light-receiving device PD2 by turning on both the transistor M11 and the transistor M15. In this manner, the amount of light received for image capturing can be increased and an object at a position away from the display apparatus can be easily sensed.

As described above, one pixel includes two kinds of light-receiving devices in the display apparatus of this embodiment, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

This embodiment can be combined with the other embodiments as appropriate. In the case where a plurality of structure examples are described in one embodiment in this specification, the structure examples can be combined as appropriate.

Embodiment 2

In this embodiment, a display apparatus of one embodiment of the present invention and a manufacturing method thereof are described with reference to FIG. 9 to FIG. 13.

The display apparatus of one embodiment of the present invention includes a light-emitting device and a light-receiving device in a pixel. In the display apparatus of one embodiment of the present invention, the pixel has a light-receiving function, which enables a touch or approach of an object to be sensed while an image is displayed. For example, all the subpixels included in the display apparatus can display an image; alternatively, some of the subpixels can emit light as a light source, some of the rest of the subpixels can sense light, and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or an approach or touch of an object (e.g., a finger, a hand, or a pen) can be sensed. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light); thus, image capturing or touch sensing is possible even in a dark place.

The display apparatus of one embodiment of the present invention has a function of displaying an image using the light-emitting devices. That is, the light-emitting devices function as display devices (also referred to as display elements).

Examples of the light-emitting device include an OLED (Organic Light Emitting Diode), and QLED (Quantum-dot Light-Emitting Diode). Examples of a light-emitting substance contained in the light-emitting device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can also be used as the light-emitting device.

The display apparatus of one embodiment of the present invention has a function of sensing light using the light-receiving devices.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can sense an approach or touch of an object with the use of the light-receiving devices.

For example, a pn or pin photodiode can be used as the light-receiving device. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus including the organic EL device.

Since a large number of layers in the organic photodiodes can have structures in common with the layers in the organic EL devices, forming the layers having common structures concurrently can inhibit an increase in the number of deposition steps.

For example, one of a pair of electrodes (a common electrode) can be a layer shared by the light-receiving device and the light-emitting device. As another example, at least one of a hole-injection layer, a hole-transport layer, an electron-transport layer, and an electron-injection layer is preferably shared by the light-receiving device and the light-emitting device.

Note that a layer shared by the light-receiving device and the light-emitting device might have different functions in the light-emitting device and the light-receiving device. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

In the case of manufacturing a display apparatus including a plurality of organic EL devices that emit light of different colors from their light-emitting layers, the light-emitting layers that emit light of different colors each need to be formed in an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and a high aperture ratio of the display apparatus.

In a method for manufacturing the display apparatus of one embodiment of the present invention, an island-shaped pixel electrode (also referred to as a lower electrode) is formed, a first layer (also referred to as an EL layer or part of an EL layer) including a light-emitting layer emitting light of a first color is formed on the entire surface, and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that of the first layer, a second layer (also referred to as an EL layer or part of an EL layer) including a light-emitting layer emitting light of a second color is processed into an island shape using a second sacrificial layer and a second resist mask.

As described above, in the method for manufacturing the display apparatus of one embodiment of the present invention, an island-shaped EL layer is formed by processing an EL layer formed on the entire surface, not by using a fine metal mask. Accordingly, a high-resolution display apparatus or a display apparatus with a high aperture ratio, which has been difficult to achieve, can be manufactured. Moreover, EL layers can be formed separately for the respective colors, enabling the display apparatus to perform extremely clear display with high contrast and high display quality. In addition, a sacrificial layer (also referred to as a mask layer) provided over an EL layer can reduce damage to the EL layer in the manufacturing process of the display apparatus, increasing the reliability of the light-emitting device.

It is difficult to set the distance between adjacent light-emitting devices to be less than 10 μm with a formation method using a metal mask, for example; however, with the above method, the distance can be decreased to 3 μm or less, 2 μm or less, or 1 μm or less.

Furthermore, a pattern of the EL layer itself (also referred to as a processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the whole area can be used as a light-emitting region. Thus, a display apparatus having both high resolution and a high aperture ratio can be manufactured.

Here, each of the first layer and the second layer includes at least a light-emitting layer and preferably consists of a plurality of layers. Specifically, one or more layers are preferably formed over the light-emitting layer. A layer between the light-emitting layer and the sacrifice layer can inhibit the light-emitting layer from being exposed on the outermost surface during the manufacturing process of the display apparatus and can reduce damage to the light-emitting layer. Thus, the reliability of the light-emitting device can be increased.

Note that it is not necessary to form all layers included in EL layers separately between light-emitting devices that emit light of different colors, and some layers of the EL layers can be formed in the same step. In the method for manufacturing the display apparatus of one embodiment of the present invention, some layers included in the EL layer are formed into an island shape separately for each color, and then the sacrifice layer is removed. After that, the other layers included in the EL layers and a common electrode (also referred to as an upper electrode) are formed so as to be shared by the light-emitting devices of different colors.

A manufacturing method similar to that of the light-emitting device can be employed for the light-receiving device. An island-shaped active layer (also referred to as a photoelectric conversion layer) included in the light-receiving layer is formed by processing a film that is to be the active layer and formed on the entire surface, not by using a fine metal mask; thus, the island-shaped active layer can have a uniform thickness. In addition, a sacrifice layer provided over the active layer can reduce damage to the active layer in the manufacturing process of the display apparatus, increasing the reliability of the light-receiving device.

[Structure Example of Display Apparatus]

Figure 9A:
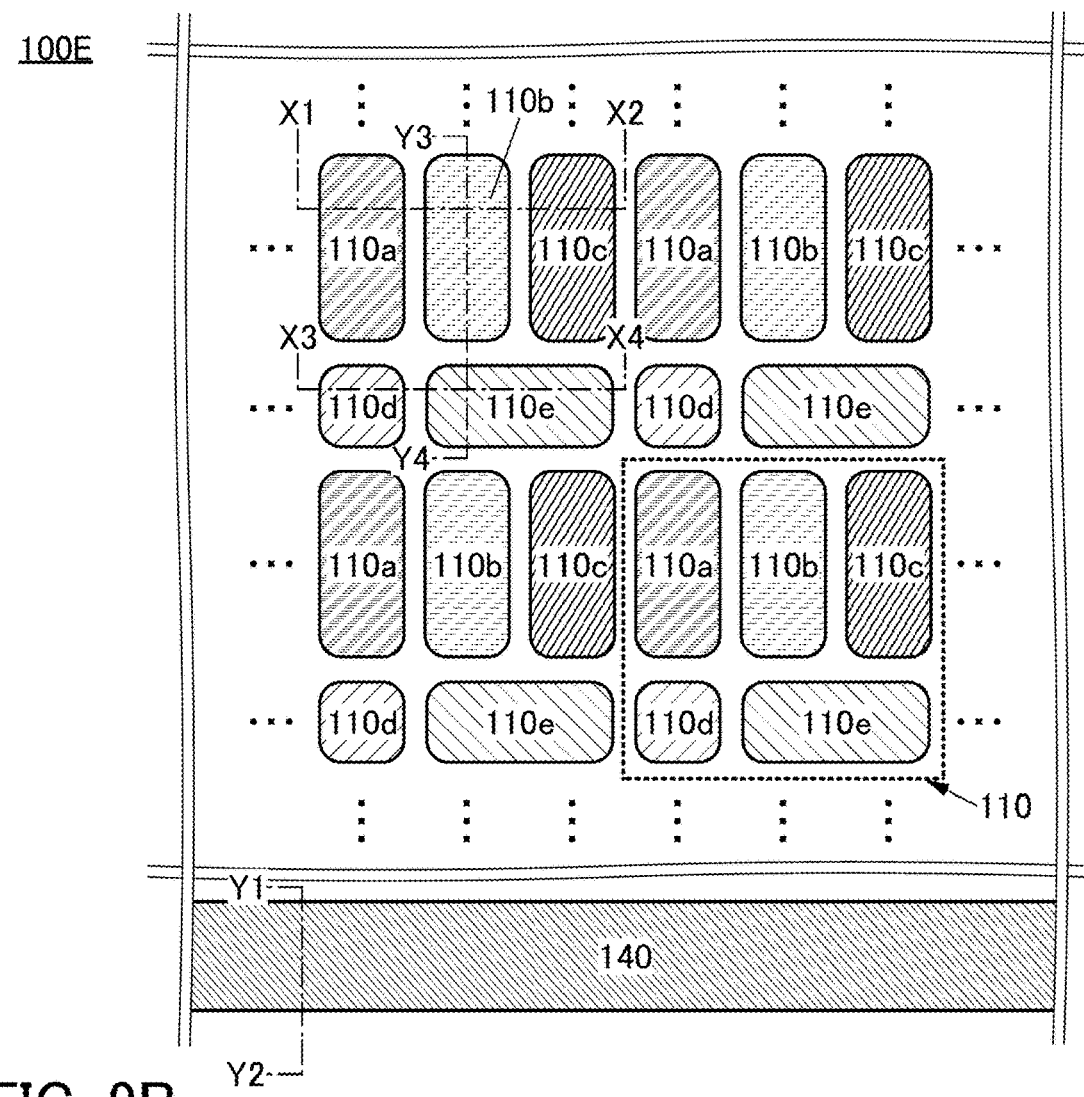
FIG. 9A is a top view illustrating an example of a display apparatus.
Figure 9B:
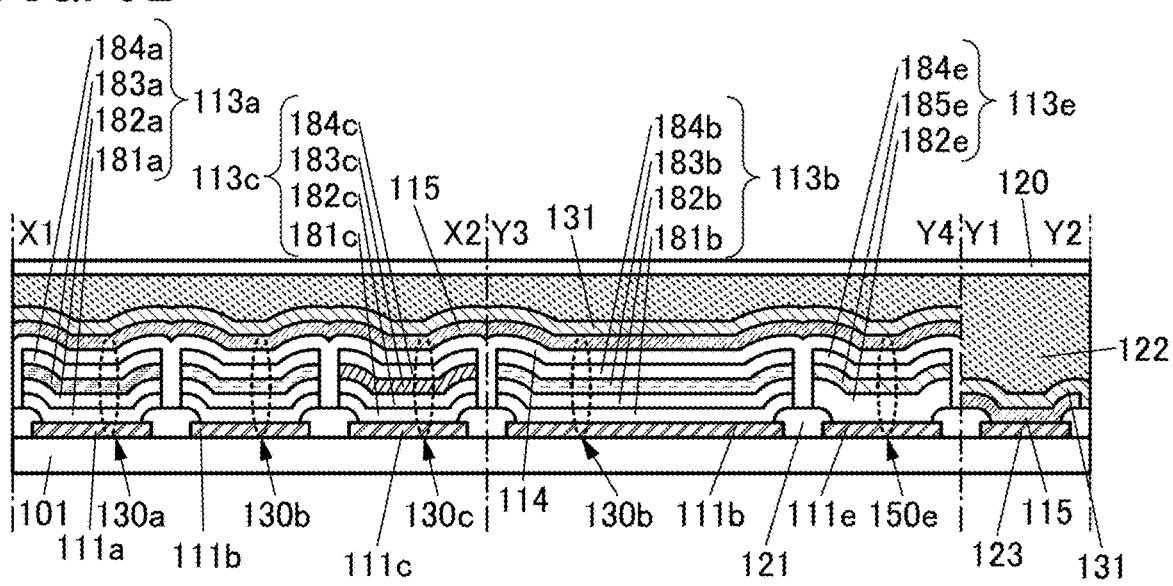
FIG. 9B is a cross-sectional view illustrating an example of the display apparatus.

FIG. 9A and FIG. 9B illustrate a display apparatus of one embodiment of the present invention.

FIG. 9A is a top view of a display apparatus 100E. The display apparatus 100E includes a display portion in which a plurality of pixels 110 are arranged in a matrix, and a connection portion 140 outside the display portion. One pixel 110 consists of five subpixels 110*a*, 110*b*, 110*c*, 110*d*, and 110*e*. The connection portion 140 can also be referred to as a cathode contact portion.

The top surface shape of the subpixel illustrated in FIG. 9A corresponds to the top surface shape of a light-emitting region or a light-receiving region.

The circuit constituting the subpixel is not necessarily placed within the dimensions of the subpixel illustrated in FIG. 9A and may be placed outside the subpixel. For example, transistors included in the subpixel 110*a* may be positioned within the range of the subpixel 110*b* illustrated in FIG. 9A, or some or all of the transistors may be positioned outside the range of the subpixel 110*a*.

Although the subpixels 110*a*, 110*b*, and 110*c* have the same or substantially the same aperture ratio (also referred to as size or size of a light-emitting region) in FIG. 9(A), one embodiment of the present invention is not limited thereto. The aperture ratio of each of the subpixels 110*a*, 110*b*, 110*c*, 110*d*, and 110*e* can be determined as appropriate. The subpixels 110*a*, 110*b*, 110*c*, 110*d*, and 110*e* may have different aperture ratios, or two or more of them may have the same or the substantially the same aperture ratio.

FIG. 9A illustrates an example in which one pixel 110 is provided in two rows and three columns. The pixel 110 includes three subpixels (the subpixels 110*a*, 110*b*, and 110*c*) in the upper row (first row) and two subpixels (the subpixels 110*d* and 110*e*) in the lower row (second row). In other words, the pixel 110 includes two subpixels (the subpixels 110*a* and 110*d*) in the left column (first column), the subpixel 110*b* in the center column (second column), the subpixel 110*c* in the right column (third column), and the subpixel 110*e* across the center and right columns.

In this embodiment, an example is described in which the subpixels 110*a*, 110*b*, and 110*c* include light-emitting devices that emit light of different colors and the subpixels 110*d* and 110*e* include light-receiving devices that have different light-receiving areas. For example, the subpixels 110*a*, 110*b*, and 110*c* correspond to the subpixels G, B, and R illustrated in FIG. 1A or the like. The subpixel 110*d* corresponds to the subpixel PS illustrated in FIG. 1A or the like and the subpixel 110e corresponds to the subpixel IRS illustrated in FIG. 1A or the like.

Note that the kind of devices provided in the subpixels 110e may differ among the pixels. Thus, a structure may be employed in which some of the subpixels 110e correspond to the subpixels IRS and the other subpixels 110e correspond to the subpixels X (see FIG. 3B) or the subpixels IR (see FIG. 3D).

Although the top view of FIG. 9A illustrates an example in which the connection portion 140 is positioned in the lower side of the display portion, one embodiment of the present invention is not limited thereto. The connection portion 140 is provided in at least one of the upper side, the right side, the left side, and the lower side of the display portion in the top view, or may be provided so as to surround the four sides of the display portion. The number of connection portions 140 can be one or more.

FIG. 9B is a cross-sectional view taken along dashed-dotted lines X1-X2, Y1-Y2, and Y3-Y4 in FIG. 9A.

As illustrated in FIG. 9B, in the display apparatus 100E, light-emitting devices 130a, 130b, and 130c, and light-receiving devices 150d (see FIG. 13B) and 150e are provided over a layer 101 including transistors, and a protective layer 131 is provided to cover the light-emitting devices and the light-receiving devices. A substrate 120 is bonded to the protective layer 131 with a resin layer 122.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. Structure examples of the layer 101 including transistors will be described later in Embodiment 3.

The light-emitting devices 130a, 130b, and 130c emit light of different colors. The light-emitting devices 130a, 130b, and 130c preferably emit light of three colors, red (R), green (G), and blue (B), for example.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode is described below as an example.

The light-emitting device 130a includes a pixel electrode 111a over the layer 101 including transistors, a first layer 113a over the pixel electrode 111a, a sixth layer 114 over the first layer 113a, and a common electrode 115 over the sixth layer 114. In the light-emitting device 130a, the first layer 113a and the sixth layer 114 can be collectively referred to as an EL layer.

The first layer 113a includes a first hole-injection layer 181a over the pixel electrode 111a, a first hole-transport layer 182a over the first hole-injection layer 181a, a first light-emitting layer 183a over the first hole-transport layer 182a, and a first electron-transport layer 184a over the first light-emitting layer 183a.

The sixth layer 114 includes an electron-injection layer, for example. Alternatively, the sixth layer 114 may include a stack of an electron-transport layer and an electron-injection layer.

The light-emitting device 130b includes a pixel electrode 111b over the layer 101 including transistors, a second layer 113b over the pixel electrode 111b, the sixth layer 114 over the second layer 113b, and the common electrode 115 over the sixth layer 114. In the light-emitting device 130b, the second layer 113b and the sixth layer 114 can be collectively referred to as an EL layer.

The second layer 113b includes a second hole-injection layer 181b over the pixel electrode 111b, a second hole-transport layer 182b over the second hole-injection layer 181b, a second light-emitting layer 183b over the second hole-transport layer 182b, and a second electron-transport layer 184b over the second light-emitting layer 183b.

The light-emitting device 130c includes a pixel electrode 111c over the layer 101 including transistors, a third layer 113c over the pixel electrode 111c, the sixth layer 114 over the third layer 113c, and the common electrode 115 over the sixth layer 114. In the light-emitting device 130c, the third layer 113c and the sixth layer 114 can be collectively referred to as an EL layer.

The third layer 113c includes a third hole-injection layer 181c over the pixel electrode 111c, a third hole-transport layer 182c over the third hole-injection layer 181c, a third light-emitting layer 183c over the third hole-transport layer 182c, and a third electron-transport layer 184c over the third light-emitting layer 183c.

The light-emitting devices 130a, 130b, and 130c emit light of different colors. The light-emitting devices 130a, 130b, and 130c preferably emit light of three colors, red (R), green (G), and blue (B), for example.

The light-receiving device includes an active layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. In other words, when the light-receiving device is driven by application of reverse bias between the pixel electrode and the common electrode, light entering the light-receiving device can be sensed and charge can be generated and extracted as current.

The light-receiving device 150d (see FIG. 12B and FIG. 13B) includes a pixel electrode 111d over the layer 101 including transistors, a fourth layer 113d over the pixel electrode 111d, the sixth layer 114 over the fourth layer 113d, and the common electrode 115 over the sixth layer 114.

The fourth layer 113d includes a fourth hole-transport layer 182d over the pixel electrode 111d, a first active layer 185d over the fourth hole-transport layer 182d, and a fourth electron-transport layer 184d over the first active layer 185d.

The sixth layer 114 is shared by the light-emitting devices and the light-receiving devices. The sixth layer 114 includes, for example, the electron-injection layer, as described above. Alternatively, the sixth layer 114 may include a stack of an electron-transport layer and an electron-injection layer.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The light-receiving device 150e includes a pixel electrode 111e over the layer 101 including transistors, a fifth layer 113e over the pixel electrode 111e, the sixth layer 114 over the fifth layer 113e, and the common electrode 115 over the sixth layer 114.

The fifth layer 113e includes a fifth hole-transport layer 182e over the pixel electrode 111e, a second active layer 185e over the fifth hole-transport layer 182e, and a fifth electron-transport layer 184e over the second active layer 185e.

The common electrode 115 is electrically connected to a conductive layer 123 provided in the connection portion 140. Thus, the same potential is supplied to the common electrode 115 included in the light-emitting devices of the respective colors.

A conductive film that transmits visible light and infrared light is used as the electrode through which light is extracted, which is either the pixel electrode or the common electrode. A conductive film that reflects visible light and infrared light is preferably used as the electrode through which light is not extracted.

As a material that forms the pair of electrodes (the pixel electrode and the common electrode) of the light-emitting device and the light-receiving device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device and the light-receiving device preferably employ a microcavity structure. Therefore, one of the pair of electrodes of each of the light-emitting device and the light-receiving device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified. When the light-receiving device has a microcavity structure, light received by the active layer can be resonated between the electrodes, whereby the light can be intensified and the sensing accuracy of the light-receiving device can be increased.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1 \times 10^{-2}$ Ωcm or lower. The near-infrared light (light at wavelengths greater than or equal to 750 nm and less than or equal to 1300 nm) transmittance and reflectivity of these electrodes preferably satisfy the above-described numerical ranges of the visible light transmittance and reflectivity.

The first layer 113a, the second layer 113b, and the third layer 113c each include a light-emitting layer. The first layer 113a, the second layer 113b, and the third layer 113c preferably include light-emitting layers that emit light of different colors.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113a, the second layer 113b, and the third layer 113c may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

The sixth layer 114 can include one or more of a hole-injection layer, a hole-transport layer, a hole-blocking layer, an electron-blocking layer, an electron-transport layer, and an electron-injection layer. For example, in the case where the pixel electrodes 111a, 111b, and 111c each function as an anode and the common electrode 115 functions as a cathode, the sixth layer 114 preferably includes an electron-injection layer.

The hole-injection layer is a layer injecting holes from an anode to a hole-transport layer, and a layer containing a material with a high hole-injection property. Examples of a material with a high hole-injection property include an aromatic amine compound and a composite material containing a hole-transport material and an acceptor material (electron-accepting material).

In the light-emitting device, the hole-transport layer transports holes injected from the anode by the hole-injection layer, to the light-emitting layer. In the light-receiving device, the hole-transport layer transports holes generated in the active layer on the basis of incident light, to the anode. The hole-transport layer contains a hole-transport material. The hole-transport material preferably has a hole mobility of $1 \times 10^{-6}$ cm$^2$/Vs or higher. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

In the light-emitting device, the electron-transport layer transports electrons injected from the cathode by the electron-injection layer, to the light-emitting layer. In the light-receiving device, the electron-transport layer transports electrons generated in the active layer on the basis of incident light, to the cathode. The electron-transport layer contains an electron-transport material. The electron-transport material preferably has an electron mobility of $1 \times 10^{-6}$ cm$^2$/Vs or higher. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a n-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate can be used.

Alternatively, for the electron-injection layer, an electron-transport material may be used. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to $-3.6$ eV and less than or equal to $-2.3$ eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris

[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The fourth layer 113d and the fifth layer 113e each include an active layer. The fourth layer 113d and the fifth layer 113e may include active layers having the same structure or active layers having different structures. For example, with the light-receiving devices having a microcavity structure, the fourth layer 113d and the fifth layer 113e can sense light with different wavelengths even when the active layers have the same structure. Note that the microcavity structures can be formed by making the thicknesses of the pixel electrodes or the thicknesses of optical adjustment layers different between the light-receiving devices 150d and 150e. In this case, the fourth layer 113d and the fifth layer 113e can have the same structure in some cases.

The first active layer 185d and the second active layer 185e each contain a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1'',4',4''-tetrahydro-di[1,4]methanonaphthaleno[1,2:2',3',56,60:2'',3''][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, each of the fourth layer 113d and the fifth layer 113e may further include a layer containing any of a substance with a high hole-transport property, a substance with a high electron-transport property, a substance with a bipolar property (a substance with a high electron-transport property and a high hole-transport property), and the like. Each of the fourth layer 113d and the fifth layer 113e may include a variety of functional layers that can be used in the first layer 113a, the second layer 113b, and the third layer 113c.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1, 3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the absorption wavelength range. The third material may be a low molecular compound or a high molecular compound.

The protective layer 131 is preferably provided over the light-emitting devices 130$a$, 130$b$, and 130$c$ and the light-receiving devices 150$d$ and 150$e$. Providing the protective layer 131 can improve the reliability of the light-emitting devices and the light-receiving devices.

There is no limitation on the conductivity of the protective layer 131. As the protective layer 131, at least one type of insulating films, semiconductor films, and conductive films can be used.

The protective layer 131 including an inorganic film can inhibit deterioration of the light-emitting devices and the light-receiving devices by preventing oxidation of the common electrode 115 and inhibiting entry of impurities (e.g., moisture and oxygen) into the light-emitting devices 130$a$, 130$b$, and 130$c$ and the light-receiving devices 150$d$ and 150$e$, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen.

The protective layer 131 preferably includes a nitride insulating film or a nitride oxide insulating film, and further preferably includes a nitride insulating film.

As the protective layer 131, an inorganic film containing ITO, In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

End portions of the pixel electrodes 111$a$, 111$b$, and 111$c$ are covered with an insulating layer 121.

In this specification and the like, a device formed using a metal mask or an FMM (fine metal mask, high-resolution mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

In the display apparatus of this embodiment, the distance between the light-emitting devices can be narrowed. Specifically, the distance between the light-emitting devices can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus of this embodiment includes a region where the distance between the side surface of the first layer 113*a* and the side surface of the second layer 113*b* or the distance between the side surface of the second layer 113*b* and the side surface of the third layer 113*c* is less than or equal to 1 μm, preferably less than or equal to 0.5 lam (500 nm), further preferably less than or equal to 100 nm.

Note that the distance between the light-emitting device and the light-receiving device can be set within the above range. In order to suppress leakage between the light-emitting device and the light-receiving device, the distance between the light-emitting device and the light-receiving device is preferably larger than the distance between the light-emitting devices. For example, the distance between the light-emitting device and the light-receiving device can be set to 8 μm or less, 5 μm or less, or 3 μm or less.

[Example of Method for Manufacturing Display Apparatus]

Next, an example of a method for manufacturing a display apparatus is described with reference to FIG. 10 to FIG. 13. FIGS. 10A to 10D each illustrate a cross section along the dashed-dotted line X1-X2, a cross section along the dashed-dotted line X3-X4, and a cross section along the dashed-dotted line Y1-Y2 in FIG. 9A side by side. FIG. 11 to FIG. 13 are similar to FIG. 10.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Alternatively, thin films included in the display apparatus (e.g., insulating films, semiconductor films, and conductive films) can be formed by a method such as spin coating, dipping, spray coating, ink-jetting, dispensing, screen printing, offset printing, a doctor knife, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display apparatus can be processed by a photolithography method or the like. Alternatively, thin films may be processed by a nanoimprinting method, a sandblasting method, a lift-off method, or the like.

Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. Light exposure may be performed by liquid immersion exposure technique. As the light for light exposure, extreme ultraviolet (EUV) light or X-rays may also be used. Furthermore, instead of the light used for the light exposure, an electron beam can also be used. It is preferable to use EUV light, X-rays, or an electron beam because they can perform extremely minute processing. Note that a photomask is not needed when light exposure is performed by scanning with a beam such as an electron beam.

For etching of thin films, a dry etching method, a wet etching method, a sandblast method, or the like can be used.

Figure 10A:
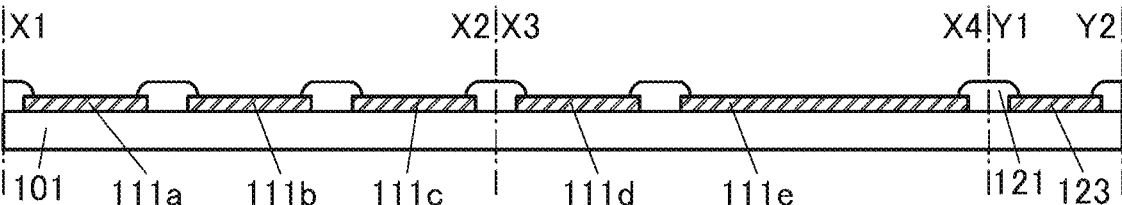
FIG. 10A to FIG. 10D are diagrams illustrating an example of a manufacturing method of a display apparatus.

As illustrated in FIG. 10A, the pixel electrodes 111*a*, 111*b*, 111*c*, 111*d*, and 111*e* and the conductive layer 123 are formed over the layer 101 including transistors. The pixel electrodes are provided in the display portion, and the conductive layer 123 is provided in the connection portion 140.

Next, the insulating layer 121 that covers end portions of the pixel electrodes 111*a*, 111*b*, 111*c*, 111*d*, and 111*e* and end portions of the conductive layer 123 is formed.

Figure 10B:
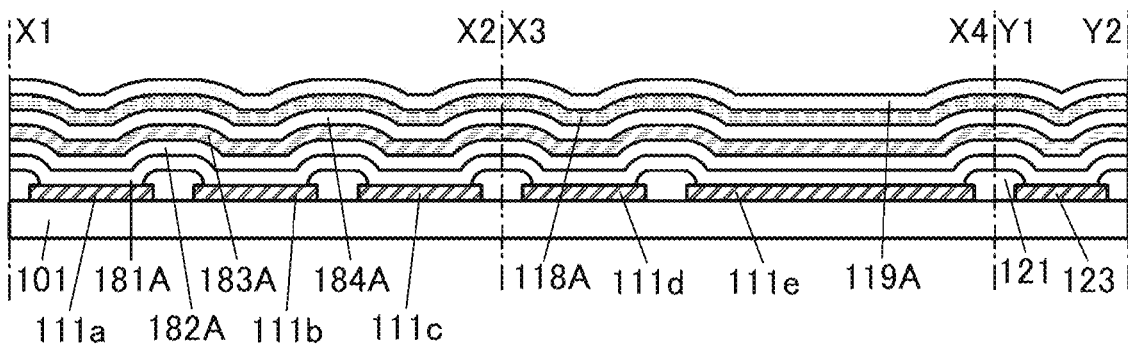

Then, as illustrated in FIG. 10B, a first hole-injection layer 181A, a first hole-transport layer 182A, a first light-emitting layer 183A, and a first electron-transport layer 184A are formed in this order over the pixel electrodes and the insulating layer 121, a first sacrificial layer 118A is formed over the first electron-transport layer 184A, and a second sacrificial layer 119A is formed over the first sacrificial layer 118A.

FIG. 10B illustrates an example in which, in the cross section along Y1-Y2, the first hole-injection layer 181A, the first hole-transport layer 182A, the first light-emitting layer 183A, the first electron-transport layer 184A, the first sacrificial layer 118A, and the second sacrificial layer 119A are formed over the conductive layer 123, but one embodiment of the present invention is not limited thereto.

For example, the first hole-injection layer 181A, the first hole-transport layer 182A, the first light-emitting layer 183A, the first electron-transport layer 184A, and the first sacrificial layer 118A do not necessarily overlap with the conductive layer 123. End portions of the first hole-injection layer 181A, the first hole-transport layer 182A, the first light-emitting layer 183A, and the first electron-transport layer 184A on the connection portion 140 side may be positioned closer to the inner side than end portions of the first sacrificial layer 118A and the second sacrificial layer 119A. For example, by using a mask for specifying a film formation area (also referred to as an area mask or a rough metal mask to be distinguished from a fine metal mask), the first hole-injection layer 181A, the first hole-transport layer 182A, the first light-emitting layer 183A, and the first electron-transport layer 184A can be formed in a region different from a region where the first sacrificial layer 118A and the second sacrificial layer 119A are formed. In one embodiment of the present invention, the light-emitting device is formed using a resist mask; by using a combination of a resist mask and an area mask as described above, the light-emitting device can be formed in a relatively simple process.

Materials that can be used for the pixel electrodes are as described above. For formation of the pixel electrodes, a sputtering method or a vacuum evaporation method can be used, for example.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a poly-imide-amide resin, a polysiloxane resin, a benzocy-clobutene-based resin, and a phenol resin. As an inorganic insulating film that can be used as the insulating layer 121, an inorganic insulating film that can be used as the protective layer 131 can be used.

When an inorganic insulating film is used as the insulating layer 121 that covers the end portions of the pixel electrodes, impurities are less likely to enter the light-emitting devices as compared with the case where an organic insulating film is used; therefore, the reliability of the light-emitting devices can be improved. When an organic insulating film is used as the insulating layer 121 that covers the end portions of the pixel electrodes, high step coverage can be obtained as compared with the case where an inorganic insulating film is used; therefore, an influence of the shape of the pixel electrodes can be small. Therefore, a short circuit in the light-emitting devices can be prevented. Specifically, when an organic insulating film is used as the insulating layer 121, the insulating layer 121 can be processed into a tapered shape or the like. In this specification and the like, a tapered shape indicates a shape in which at least part of a side surface of a structure is inclined to a substrate surface or a formation surface. For example, a tapered shape preferably includes a region where the angle between the inclined side surface and the substrate surface or the formation surface (such an angle is also referred to as a taper angle) is less than 90°.

Note that the insulating layer 121 is not necessarily provided. The aperture ratio of the subpixel can be some-times increased without providing the insulating layer 121. Alternatively, the distance between subpixels can be short-ened and the resolution or the definition of the display apparatus can be sometimes increased.

The first hole-injection layer 181A, the first hole-transport layer 182A, the first light-emitting layer 183A, and the first electron-transport layer 184A are layers to be the first hole-injection layer 181a, the first hole-transport layer 182a, the first light-emitting layer 183a, and the first electron-transport layer 184a, respectively. Thus, the above-de-scribed structures that can be used for the first hole-injection layer 181a, the first hole-transport layer 182a, the first light-emitting layer 183a, and the first electron-transport layer 184a can be used for the respective layers. Each of the first hole-injection layer 181A, the first hole-transport layer 182A, the first light-emitting layer 183A, and the first electron-transport layer 184A can be formed by a method such as an evaporation method (including a vacuum evapo-ration method), a transfer method, a printing method, an inkjet method, a coating method, or the like. Each of the first hole-injection layer 181A, the first hole-transport layer 182A, the first light-emitting layer 183A, and the first electron-transport layer 184A may be formed using a premix material. Note that in this specification and the like, a premix material is a composite material in which a plurality of materials are combined or mixed in advance.

Although this embodiment shows an example in which the sacrificial layer has a two-layer structure of the first sacrificial layer and the second sacrificial layer, the sacrifi-cial layer may have a single-layer structure or a stacked-layer structure of three or more layers. The sacrificial layer is formed using a film highly resistant to the processing conditions of the first hole-injection layer 181A, the first hole-transport layer 182A, the first light-emitting layer 183A, the first electron-transport layer 184A, and a variety of functional layers to be formed in later steps (e.g., a hole-injection layer, a hole-transport layer, a light-emitting layer, an electron-transport layer, and an active layer), specifically, a film that has high etching selectivity.

The sacrificial layer can be formed by a sputtering method, an ALD method (including a thermal ALD method and a PEALD method), or a vacuum evaporation method, for example. A formation method that causes little damage to an EL layer is preferred, and an ALD method or a vacuum evaporation method is preferred for the formation of the sacrificial layer over a sputtering method.

As the sacrificial layer, a film which can be removed by a wet etching method is preferably used. The use of a wet etching method can reduce damage to the first hole-injection layer 181A, the first hole-transport layer 182A, the first light-emitting layer 183A, and the first electron-transport layer 184A in processing of the sacrificial layer, compared to the case of using a dry etching method.

In the method for manufacturing the display apparatus of this embodiment, it is preferred that the functional layers (e.g., the hole-injection layer, the hole-transport layer, the light-emitting layer, the active layer, the electron-transport layer, and the like) included in the light-emitting device and the light-receiving device not be easily processed in the steps of processing the sacrificial layers, and that the sacri-ficial layers not be easily processed in the steps of processing the functional layers. In consideration of the above, the materials and a processing method for the sacrificial layers and processing methods for the functional layers are pref-erably selected.

The sacrificial layers can each be formed using an inor-ganic film such as a metal film, an alloy film, a metal oxide film, a semiconductor film, or an inorganic insulating film, for example.

For the sacrificial layers, a metal material such as gold, silver, platinum, magnesium, nickel, tungsten, chromium, molybdenum, iron, cobalt, copper, palladium, titanium, alu-minum, yttrium, zirconium, or tantalum or an alloy material containing the metal material can be used.

For the sacrificial layers, a metal oxide such as In—Ga—Zn oxide can be used. As the sacrificial layer, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more of aluminum, silicon, boron, yttrium, copper, vanadium, beryllium, tita-nium, iron, nickel, germanium, zirconium, molybdenum, lanthanum, cerium, neodymium, hafnium, tantalum, tungsten, and magnesium) may be used instead of gallium.

As the sacrificial layers, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layers. As the sacrificial layers, an aluminum oxide film can be formed by an ALD method, for example. The use of an ALD method is preferable, in which case damage to a base (especially, the EL layer or the like) can be reduced.

For example, the sacrificial layers can have a stacked-layer structure of an In—Ga—Zn oxide film formed by a sputtering method and an aluminum oxide film formed by an ALD method over the In—Ga—Zn oxide film. Alternatively, the sacrificial layers can have a stacked-layer structure of an aluminum oxide film formed by an ALD method and an In—Ga—Zn oxide film formed by a sputtering method over the aluminum oxide film. Further alternatively, the sacrificial layers can have a single-layer structure of an aluminum oxide film formed by an ALD method.

Figure 10C:
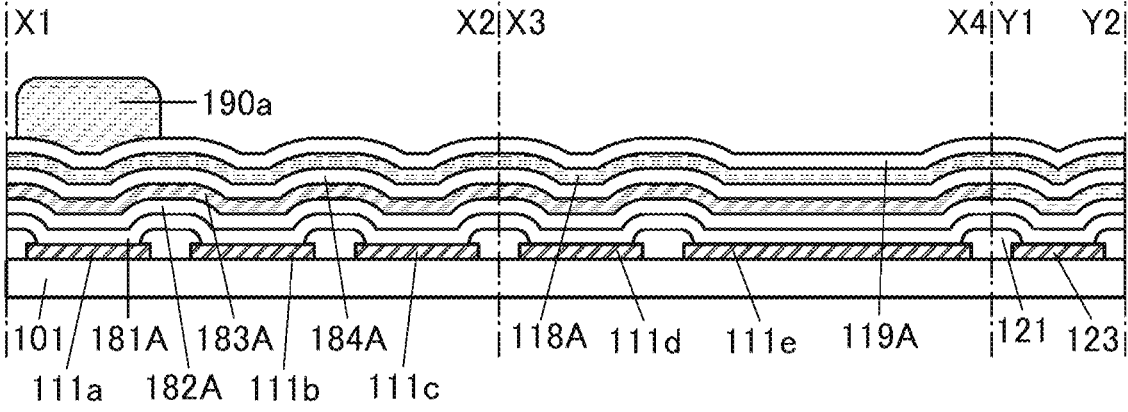

Next, a resist mask 190a is formed over the second sacrificial layer 119A as illustrated in FIG. 10C. The resist mask can be formed by application of a photosensitive resin (photoresist), light exposure, and development. The resist mask 190a is provided at a position overlapping with the pixel electrode 111a. It is preferable that the resist mask 190a not overlap with the pixel electrodes 111b, 111c, 111d, and 111e. In the case where the resist mask 190a overlaps with at least one of the pixel electrodes 111b, 111c, 111d, and 111e, the insulating layer 121 is preferably positioned therebetween. In the case where the first hole-injection layer 181A and the like are provided over the conductive layer 123, it is preferable that the resist mask 190a not overlap with the conductive layer 123. When the first hole-injection layer 181A and the like are formed with the use of an area mask or the like so as not to be provided over the conductive layer 123, the resist mask 190a is preferably provided at a position overlapping with the conductive layer 123. Thus, damage to the conductive layer 123 in a later step can be suppressed.

Figure 10D:
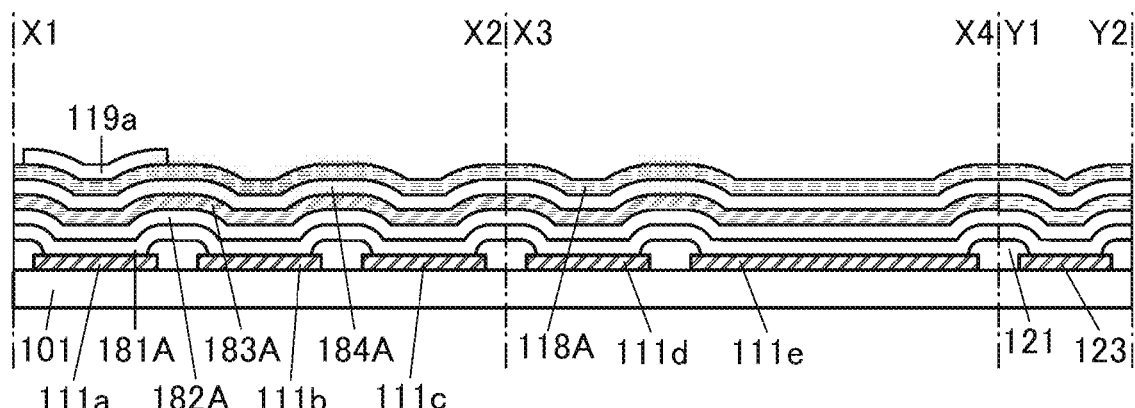

Then, as illustrated in FIG. 10D, part of the second sacrificial layer 119A is removed with the use of the resist mask 190a. Thus, a region of the second sacrificial layer 119A that does not overlap with the resist mask 190a can be removed. As a result, the second sacrificial layer 119a remains at a position overlapping with the pixel electrode 111a. After that, the resist mask 190a is removed.

Figure 11A:
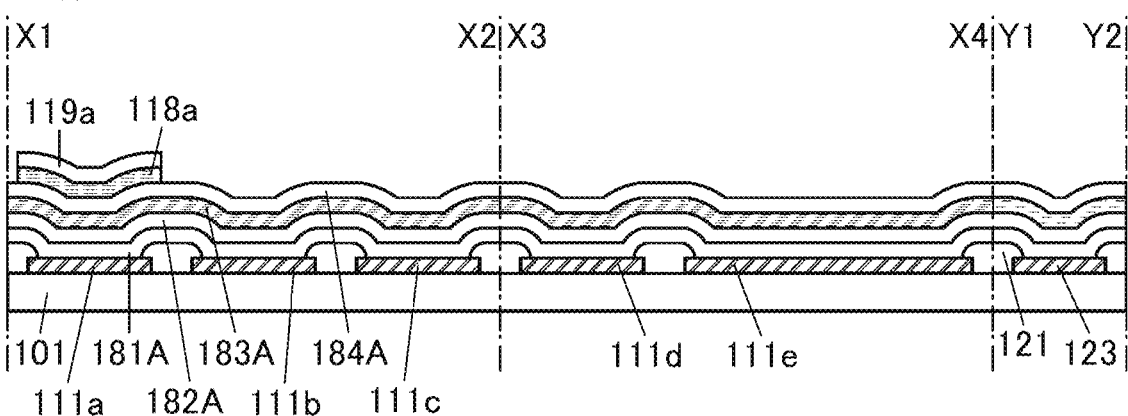
FIG. 11A to FIG. 11C are diagrams illustrating an example of a manufacturing method of a display apparatuses.

Next, as illustrated in FIG. 11A, part of the first sacrificial layer 118A is removed with the use of the second sacrificial layer 119a. Thus, a region of the first sacrificial layer 118A that does not overlap with the second sacrificial layer 119a can be removed. As a result, a stacked-layer structure of the first sacrificial layer 118a and the second sacrificial layer 119a remains at a position overlapping with the pixel electrode 111a.

Figure 11B:
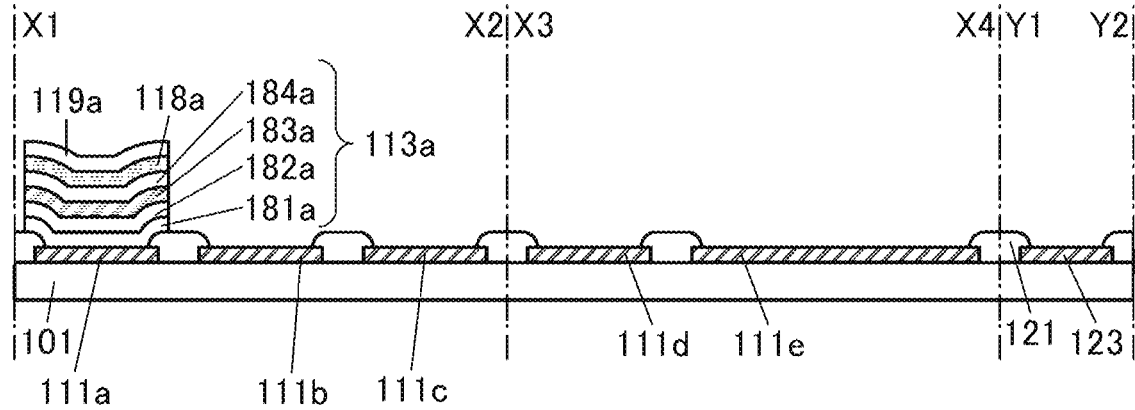

Next, as illustrated in FIG. 11B, part of the first hole-injection layer 181A, part of the first hole-transport layer 182A, part of the first light-emitting layer 183A, and part of the first electron-transport layer 184A are removed with the use of the first sacrificial layer 118a and the second sacrificial layer 119a. Thus, regions of the first hole-injection layer 181A, the first hole-transport layer 182A, the first light-emitting layer 183A, and the first electron-transport layer 184A that do not overlap with the first sacrificial layer 118a and the second sacrificial layer 119a can be removed. As a result, the pixel electrodes 111b, 111c, 111d, and 111e and the conductive layer 123 are exposed. Moreover, a stacked-layer structure of the first hole-injection layer 181a, the first hole-transport layer 182a, the first light-emitting layer 183a, the first electron-transport layer 184a, the first sacrificial layer 118a, and the second sacrificial layer 119a remains over the pixel electrode 111a. Note that the stacked-layer structure of the first hole-injection layer 181a, the first hole-transport layer 182a, the first light-emitting layer 183a, and the first electron-transport layer 184a is also referred to as the first layer 113a.

The first sacrificial layer 118A and the second sacrificial layer 119A can each be processed by a wet etching method or a dry etching method. The first sacrificial layer 118A and the second sacrificial layer 119A are preferably processed by anisotropic etching.

The use of a wet etching method can reduce damage to the first hole-injection layer 181A, the first hole-transport layer 182A, the first light-emitting layer 183A, and the first electron-transport layer 184A in processing of the sacrificial layer, compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method in which a gas containing no oxygen is used as an etching gas, the first hole-injection layer 181A, the first hole-transport layer 182A, the first light-emitting layer 183A, and the first electron-transport layer 184A can be inhibited from deteriorating. In the case of using a dry etching method, it is preferable to use $CF_4$, $C_4F_8$, $SF_6$, $CHF_3$, $Cl_2$, $H_2O$, $BCl_3$, or a gas containing a noble gas (also referred to as rare gas) such as He as the etching gas, for example.

When the sacrificial layer has a stacked-layer structure, after some of the layers are processed with the use of the resist mask 190a and the resist mask 190a is removed, the rest of the layers can be processed with the use of some of the layers as a hard mask.

For example, after the second sacrificial layer 119A is processed with the use of the resist mask 190a, the resist mask 190a is removed by ashing using oxygen plasma. At this time, the first sacrificial layer 118A is positioned on the outermost surface and the first hole-injection layer 181A, the first hole-transport layer 182A, the first light-emitting layer 183A, and the first electron-transport layer 184A are not exposed; thus, the first hole-injection layer 181A, the first hole-transport layer 182A, the first light-emitting layer 183A, and the first electron-transport layer 184A can be inhibited from being damaged in the step of removing the resist mask 190a. Then, the first sacrificial layer 118A can be processed with the use of the second sacrificial layer 119a as a hard mask and the first hole-injection layer 181A, the first hole-transport layer 182A, the first light-emitting layer 183A, and the first electron-transport layer 184A can be processed with the use of the first sacrificial layer 118a and the second sacrificial layer 119a as a hard mask.

The first hole-injection layer 181A, the first hole-transport layer 182A, the first light-emitting layer 183A, and the first electron-transport layer 184A are preferably processed by anisotropic etching. Anisotropic dry etching is particularly preferable. As an etching gas, a gas containing nitrogen, a gas containing hydrogen, a gas containing a noble gas, a gas containing nitrogen and argon, a gas containing nitrogen and hydrogen, or the like is preferably used. Since a gas containing oxygen is not used as the etching gas, the first hole-injection layer 181A, the first hole-transport layer 182A, the first light-emitting layer 183A, and the first electron-transport layer 184A can be inhibited from deteriorating.

A gas containing oxygen may be used as the etching gas. When the etching gas contains oxygen, the etching rate can be increased. Therefore, the etching can be performed under a low-power condition while an adequately high etching rate is maintained. Thus, the first hole-injection layer 181A, the first hole-transport layer 182A, the first light-emitting layer 183A, and the first electron-transport layer 184A can be inhibited from being damaged. Furthermore, a defect such as attachment of a reaction product generated at the etching can be inhibited.

Figure 11C:
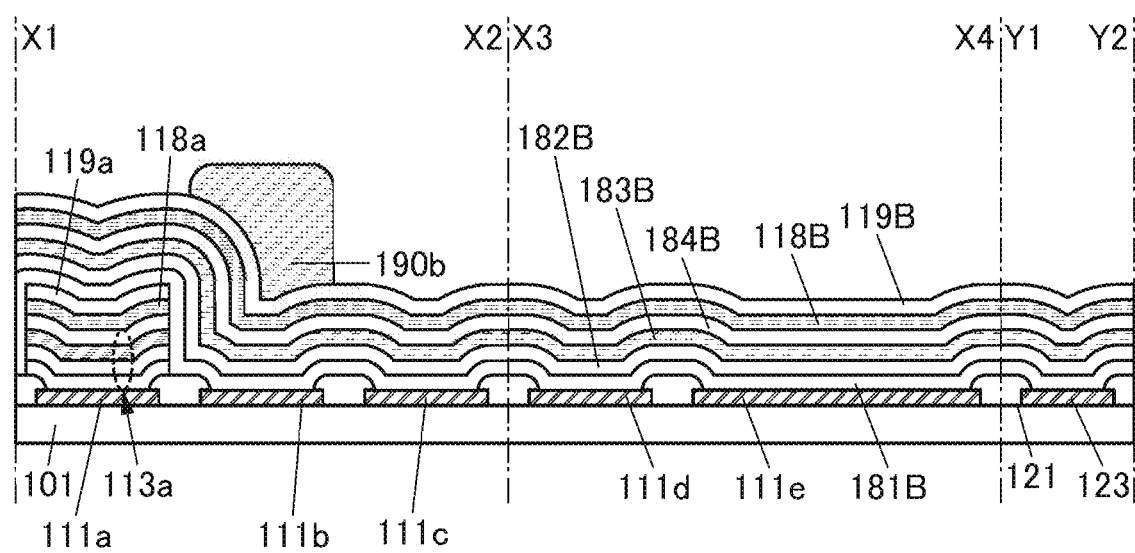

Next, as illustrated in FIG. 11C, a second hole-injection layer 181B, a second hole-transport layer 182B, a second light-emitting layer 183B, and a second electron-transport layer 184B are formed in this order over the second sacrificial layer 119a, the pixel electrodes 111b, 111c, 111d, and 111e, and the insulating layer 121, a first sacrificial layer 118B is formed over the second electron-transport layer 184B, and a second sacrificial layer 119B is formed over the first sacrificial layer 118B.

The second hole-injection layer 181B, the second hole-transport layer 182B, the second light-emitting layer 183B, and the second electron-transport layer 184B are layers to be the second hole-injection layer 181b, the second hole-transport layer 182b, the second light-emitting layer 183b, and the second electron-transport layer 184b, respectively. The second light-emitting layer 183b emits light of a color that differs from the color of the light emitted from the first light-emitting layer 183a. Structures, materials, and the like that can be used for the second hole-injection layer 181b, the second hole-transport layer 182b, the second light-emitting layer 183b, and the second electron-transport layer 184b are similar to those for the first hole-injection layer 181a, the first hole-transport layer 182a, the first light-emitting layer 183a, and the first electron-transport layer 184a. The second hole-transport layer 182B, the second light-emitting layer 183B, and the second electron-transport layer 184B can be formed by methods similar to those for the first hole-injection layer 181A, the first hole-transport layer 182A, the first light-emitting layer 183A, and the first electron-transport layer 184A, respectively.

The first sacrificial layer 118B and the second sacrificial layer 119B can be formed using materials that can be used for the first sacrificial layer 118A and the second sacrificial layer 119A.

Next, a resist mask 190b is formed over the first sacrificial layer 118B as illustrated in FIG. 11C. The resist mask 190b is provided at a position overlapping with the pixel electrode 111b.

Figure 12A:
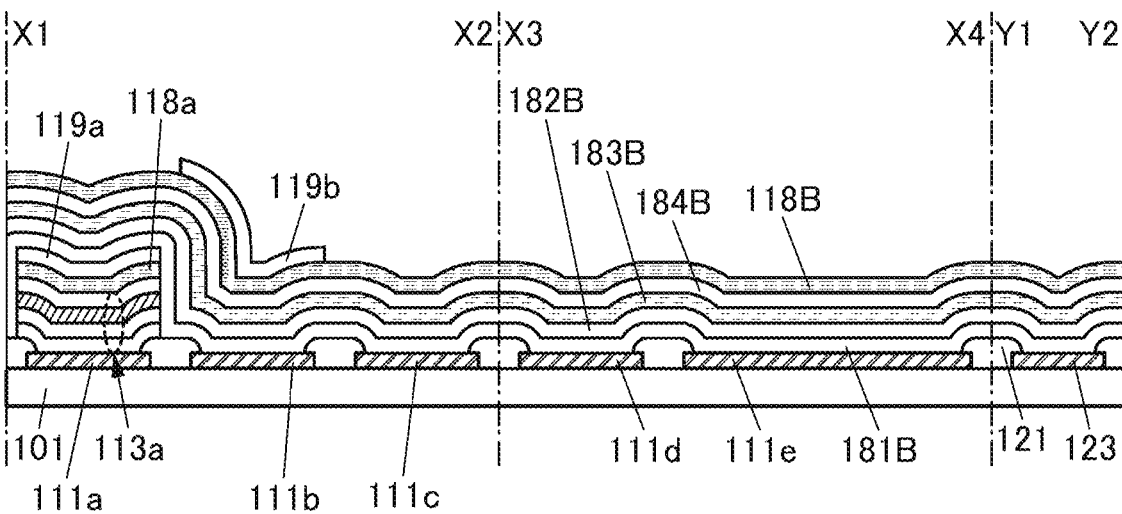
FIG. 12A to FIG. 12C are diagrams illustrating an example of a manufacturing method of a display apparatus.
Figure 12B:
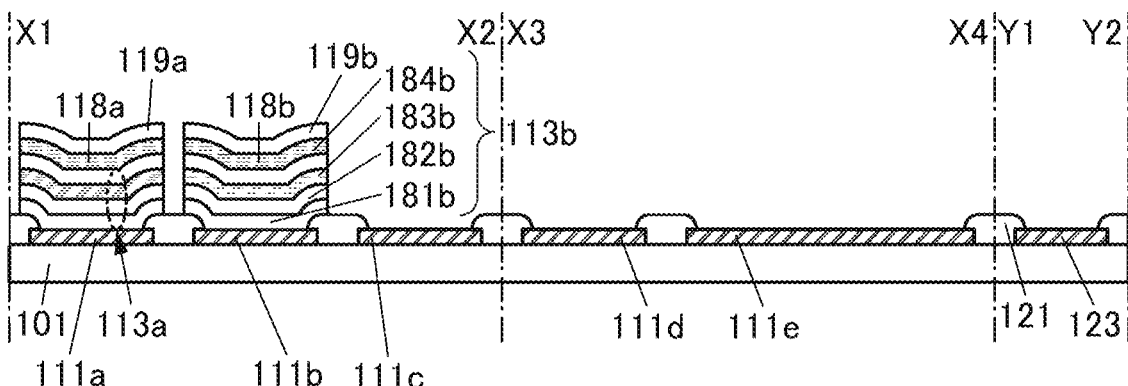

Then, as illustrated in FIG. 12A, part of the second sacrificial layer 119B is removed with the use of the resist mask 190b. Thus, a region of the second sacrificial layer 119B that does not overlap with the resist mask 190b can be removed. As a result, the second sacrificial layer 119b remains at a position overlapping with the pixel electrode 111b. After that, the resist mask 190b is removed.

Next, the first sacrificial layer 118B is processed with the use of the second sacrificial layer 119b as a hard mask, whereby the first sacrificial layer 118b is formed. Then, the second hole-injection layer 181B, the second hole-transport layer 182B, the second light-emitting layer 183B, and the second electron-transport layer 184B are processed with the use of the first sacrificial layer 118b and the second sacrificial layer 119b as a hard mask, whereby the second hole-injection layer 181b, the second hole-transport layer 182b, the second light-emitting layer 183b, and the second electron-transport layer 184b are formed. Note that the stacked-layer structure of the second hole-injection layer 181b, the second hole-transport layer 182b, the second light-emitting layer 183b, and the second electron-transport layer 184b is also referred to as the second layer 113b.

The first sacrificial layer 118B and the second sacrificial layer 119B can be processed by methods that can be used for processing the first sacrificial layer 118A and the second sacrificial layer 119A. The second hole-injection layer 181B, the second hole-transport layer 182B, the second light-emitting layer 183B, and the second electron-transport layer 184B can be processed by methods that can be used for processing the first hole-injection layer 181A, the first hole-transport layer 182A, the first light-emitting layer 183A, and the first electron-transport layer 184A. The resist mask 190b can be removed by a method and at a timing which can be applied for the removal of the resist mask 190a.

In a similar manner, a stacked-layer structure of the third layer 113c, a first sacrificial layer 118c, and a second sacrificial layer 119c is formed over the pixel electrode 111c, a stacked-layer structure of the fourth layer 113d, a first sacrificial layer 118d, and a second sacrificial layer 119d is formed over the pixel electrode 111d, and a stacked-layer structure of the fifth layer 113e, a first sacrificial layer 118e, and a second sacrificial layer 119e is formed over the pixel electrode 111e. Note that an example in which the fourth layer 113d and the fifth layer 113e have different structures is described in this embodiment. In the case where the fourth layer 113d and the fifth layer 113e have the same structure, these layers can be formed in the same step.

Figure 12C:
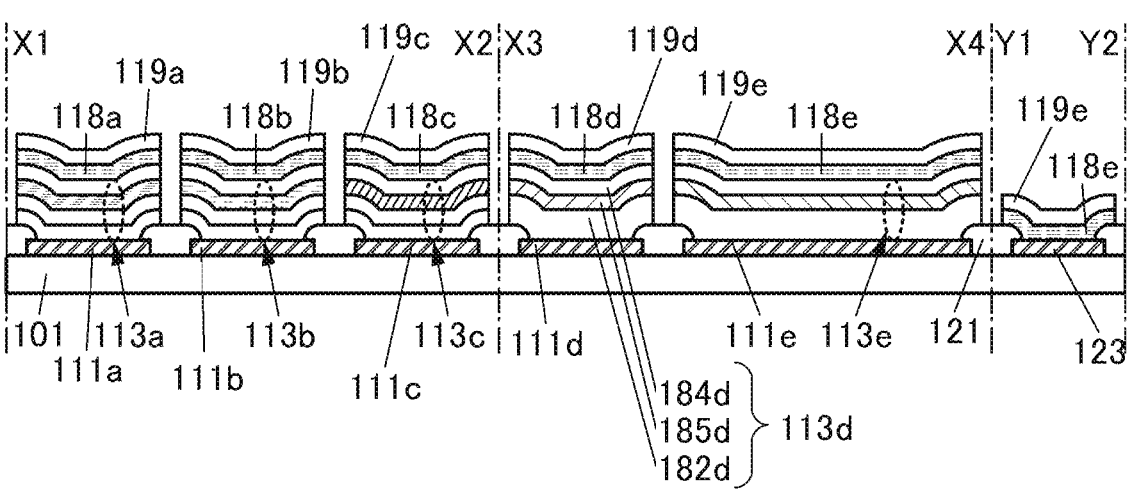

A resist mask provided for forming the fifth layer 113e is preferably provided to overlap also with the conductive layer 123. Thus, a stacked-layer structure of the first sacrificial layer 118e and the second sacrificial layer 119e remains over the conductive layer 123 as illustrated in FIG. 12C. Such a structure is preferable because the conductive layer 123 can be inhibited from being damaged in the next step of removing the first sacrificial layer and the second sacrificial layer.

Figure 13A:
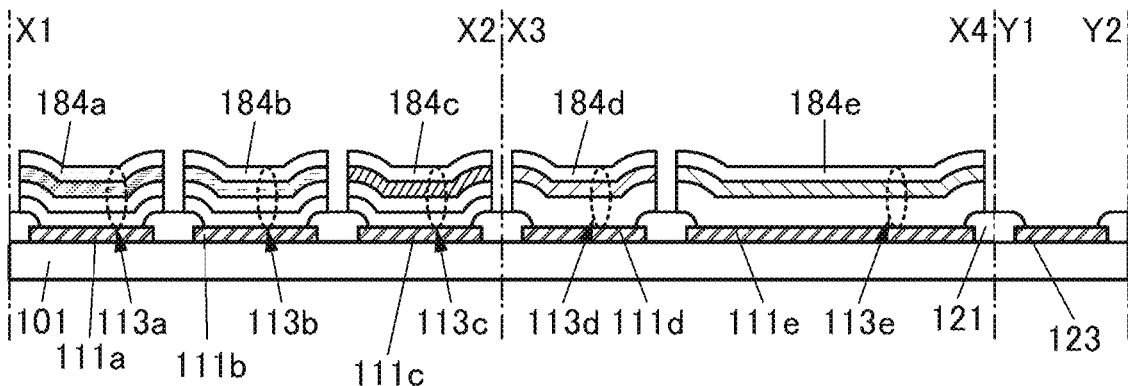
FIG. 13A to FIG. 13C are diagrams illustrating an example of a manufacturing method of a display apparatus.

Next, the first sacrificial layers 118a, 118b, 118c, 118d, and 118e and the second sacrificial layers 119a, 119b, 119c, 119d, and 119e are removed as illustrated in FIG. 13A. Thus, the first electron-transport layer 184a is exposed over the pixel electrode 111a, the second electron-transport layer 184b is exposed over the pixel electrode 111b, the third electron-transport layer 184c is exposed over the pixel electrode 111c, the fourth electron-transport layer 184d is exposed over the pixel electrode 111d, the fifth electron-transport layer 184e is exposed over the pixel electrode 111e, and the conductive layer 123 is exposed in the connection portion 140.

The step of removing the sacrificial layers can be performed by a method similar to that for the step of processing the sacrificial layers. In particular, the use of a wet etching method can reduce damage to the first layer 113a, the second layer 113b, the third layer 113c, the fourth layer 113d, and the fifth layer 113e at the time of removing the sacrificial layers, as compared to the case of using a dry etching method.

Figure 13B:
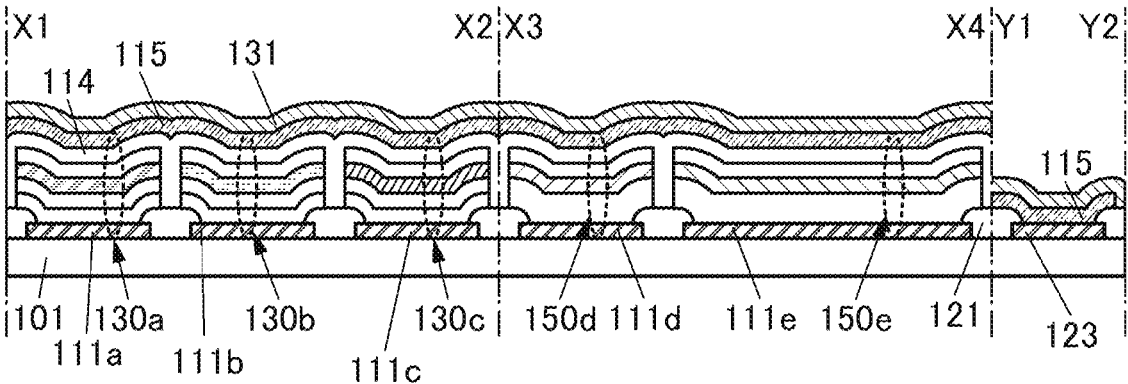

Next, as illustrated in FIG. 13B, the sixth layer 114 is formed to cover the first layer 113a, the second layer 113b, the third layer 113c, the fourth layer 113d, the fifth layer 113e, and the insulating layer 121, and the common electrode 115 is formed over the sixth layer 114, the insulating layer 121, and the conductive layer 123.

Materials that can be used for the sixth layer 114 are as described above. Layers included in the sixth layer 114 can each be formed by a method such as an evaporation method (including a vacuum evaporation method), a transfer method, a printing method, an inkjet method, or a coating method. The layers included in the sixth layer 114 may be formed using a premix material. Note that the sixth layer 114 is not necessarily provided when not needed.

Materials that can be used for the common electrode 115 are as described above. For formation of the common electrode 115, a sputtering method or a vacuum evaporation method can be used, for example.

Then, as illustrated in FIG. 13B, the protective layer 131 is formed over the common electrode 115.

Materials that can be used for the protective layer 131 are as described above. Examples of methods for forming the protective layer 131 include a vacuum evaporation method, a sputtering method, a CVD method, and an ALD method. The protective layer 131 may have a single-layer structure or a stacked-layer structure. For example, the protective layer 131 may have a stacked-layer structure of two layers which are formed by different formation methods.

Figure 13C:
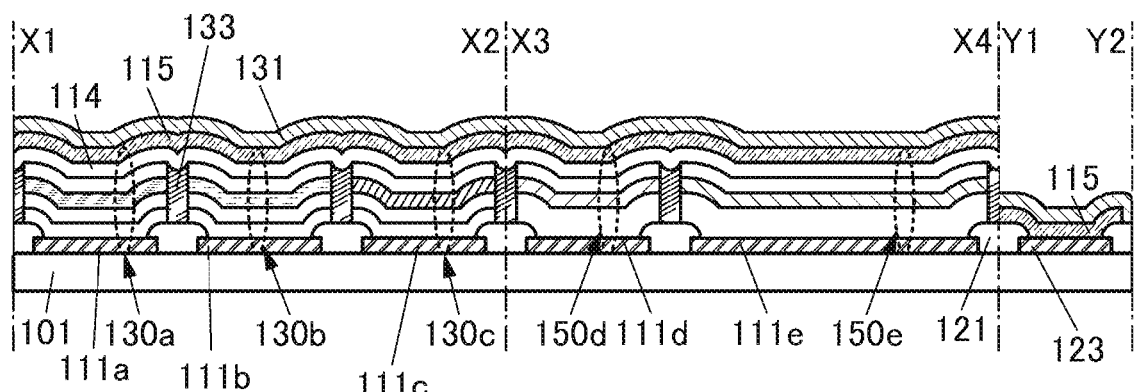

Note that FIG. 13B illustrates an example in which the sixth layer 114 is also formed in a region between the first layer 113a and the second layer 113b, for example; however, as illustrated in FIG. 13C, a space 133 may be formed in the region.

The space 133 includes, for example, any one or more selected from air, nitrogen, oxygen, carbon dioxide, and Group 18 elements (typically, helium, neon, argon, xenon, and krypton).

In the case where the refractive index of the space 133 is lower than the refractive index of the sixth layer 114, light emitted from the light-emitting device is reflected by the interface between the sixth layer 114 and the space 133. Thus, light emitted from the light-emitting device can be inhibited from entering an adjacent pixel (or subpixel). With the structure, mixture of light of different colors can be inhibited, so that the display quality of the display apparatus can be improved.

Then, the substrate 120 is bonded to the protective layer 131 with the resin layer 122, whereby the display apparatus 100E illustrated in FIG. 9B can be manufactured.

As described above, in the method for manufacturing the display apparatus of one embodiment of the present invention, an island-shaped EL layer is formed by processing an EL layer formed on the entire surface, not by using a fine metal mask. Thus, the island-shaped EL layer can have a uniform thickness. In addition, a high-resolution display apparatus or a display apparatus with a high aperture ratio, which has been difficult to achieve, can be manufactured. Moreover, a high-resolution display apparatus or a display apparatus with a high aperture ratio, which incorporates a light-receiving device and has a function of sensing light, can be manufactured.

The first layer, the second layer, and the third layer included in the light-emitting devices of different colors are formed in separate steps. Accordingly, the respective EL layers can be formed to have structures (a material, thickness, and the like) appropriate for the light-emitting devices of different colors. Thus, the light-emitting devices can have favorable characteristics.

This embodiment can be combined with the other embodiments as appropriate.

Embodiment 3

In this embodiment, a display apparatus of one embodiment of the present invention is described with reference to FIG. 14 and FIG. 15.

The display apparatus in this embodiment can be a high-definition display apparatus or large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Figure 14:
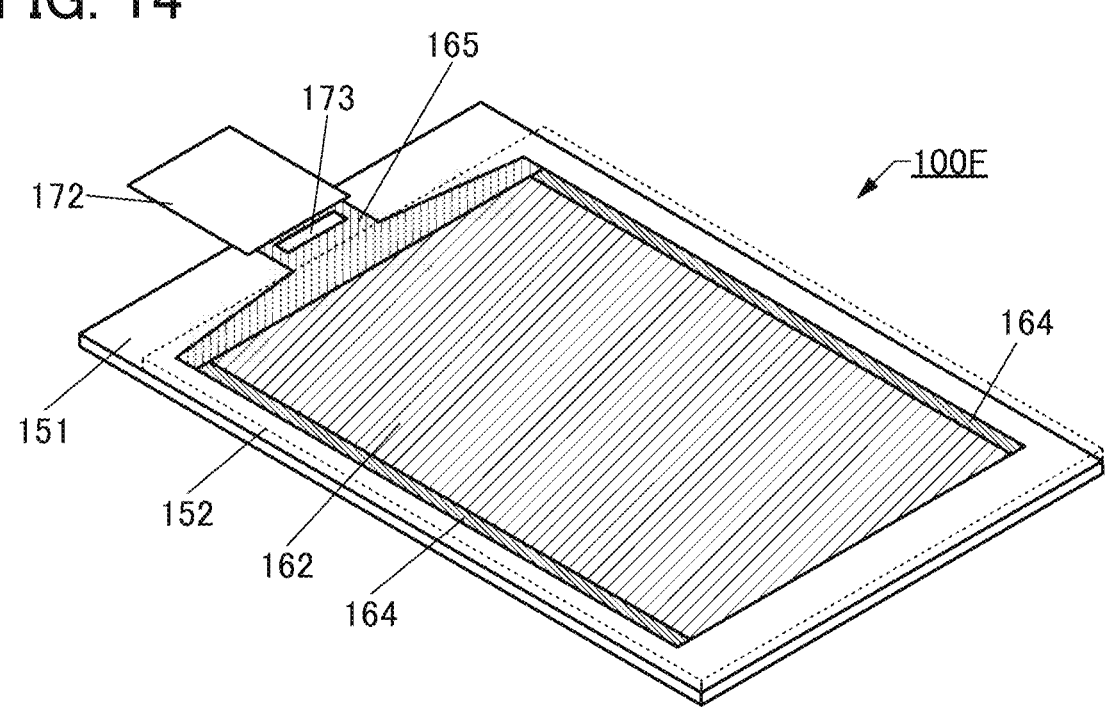
FIG. 14 is a perspective view illustrating an example of a display apparatus.
Figures 15A, 15B, 15C:
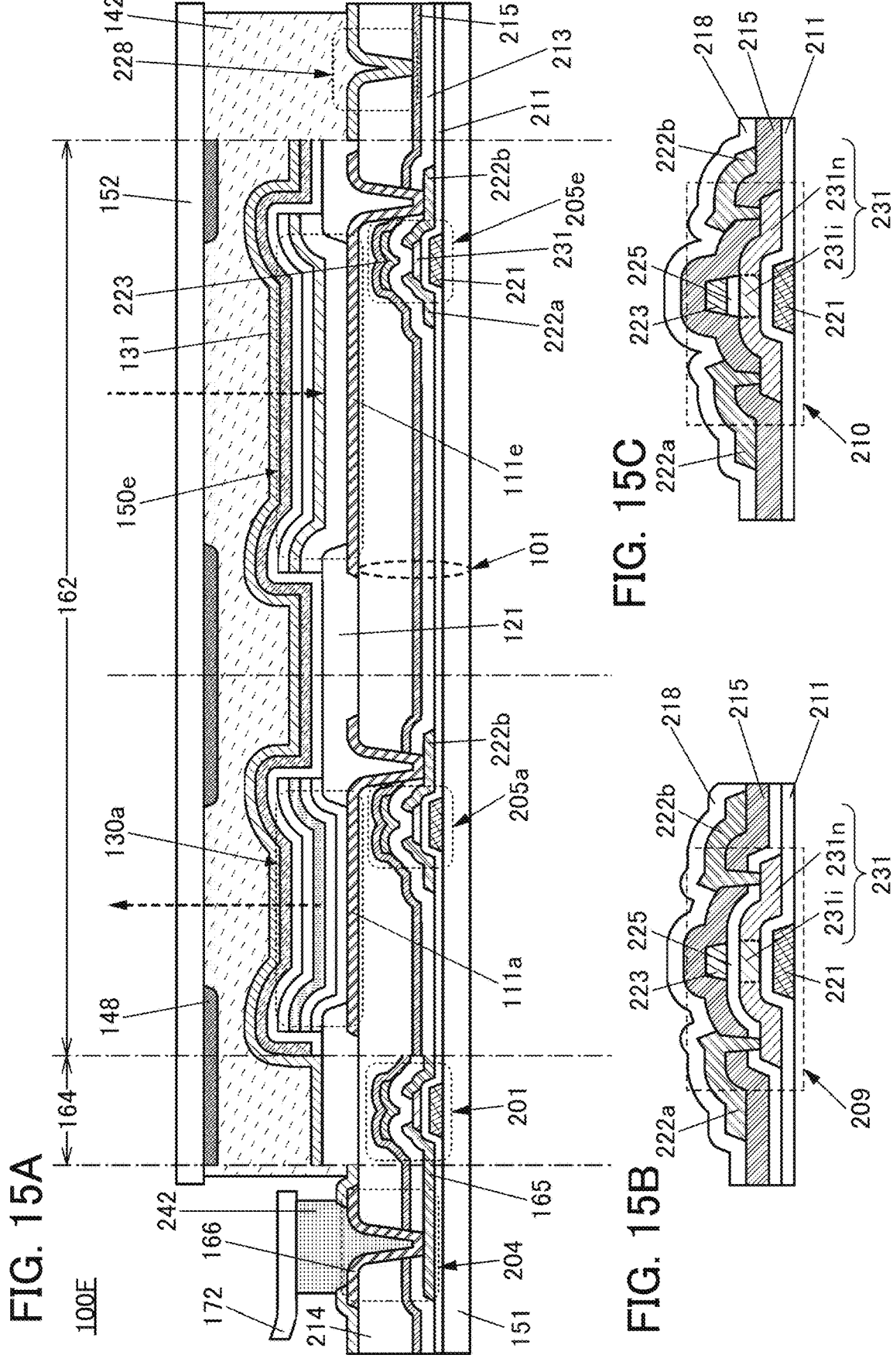
FIG. 15A is a cross-sectional view illustrating an example of a display apparatus.
FIG. 15B and FIG. 15C are cross-sectional views each illustrating an example of a transistor.

FIG. 14 is a perspective view of a display apparatus 100F, and FIG. 15A is a cross-sectional view of the display apparatus 100F.

The display apparatus 100F has a structure where a substrate 152 and a substrate 151 are bonded to each other. In FIG. 14, the substrate 152 is denoted by a dashed line.

The display apparatus 100F includes a display portion 162, a circuit 164, a wiring 165, and the like. FIG. 14 illustrates an example in which an IC 173 and an FPC 172 are mounted on the display apparatus 100F. Thus, the structure illustrated in FIG. 14 can be regarded as a display module including the display apparatus 100F, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 14 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100F and the display module are not necessarily provided with an IC. The IC may be mounted on the FPC by a COF method or the like.

FIG. 15A illustrates an example of cross sections of part of a region including the FPC 172, part of the circuit 164, part of the display portion 162, and part of a region including an end portion of the display apparatus 100F.

The display apparatus 100F illustrated in FIG. 15A includes a transistor 201, a transistor 205a, a transistor 205e, the light-emitting device 130a, the light-receiving device 150e, and the like between the substrate 151 and the substrate 152. The light-emitting device 130a emits red light, green light, or blue light, for example. Alternatively, the light-emitting device 130a may emit infrared light. The light-receiving device 150e senses infrared light, for example. Alternatively, the light-receiving device 150e may sense visible light or both visible light and infrared light.

In the case where a pixel of the display apparatus includes three kinds of subpixels including light-emitting devices emitting light of different colors, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 131 and the substrate 152 are bonded to each other with an adhesive layer 142. A solid sealing structure, a hollow sealing structure, or the like can be employed to seal the light-emitting devices. In FIG. 15A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. The adhesive layer 142 may be provided not to overlap with the light-emitting device. The space may be filled with a resin different from that of the frame-like adhesive layer 142.

The light-emitting device 130a has a stacked-layer structure similar to that of the light-emitting device 130a illustrated in FIG. 9B, and the light-receiving device 150e has a stacked-layer structure similar to that of the light-receiving device 150e illustrated in FIG. 9B. Embodiment 2 can be referred to for the details of the light-emitting device and the light-receiving device. End portions of the light-emitting device 130a and end portions of the light-receiving device 150e are covered with the protective layer 131.

The pixel electrodes 111a and 111e are each electrically connected to conductive layers 222b included in the transistors 205a and 205e through openings provided in an insulating layer 214.

End portions of the pixel electrodes are covered with the insulating layer 121. The pixel electrode contains a material that reflects visible light, and the common electrode contains a material that transmits visible light.

Light from the light-emitting device is emitted toward the substrate 152 side. The light-receiving device senses light entering from the substrate 152 side. Thus, for the substrate 152, a material that has high visible-light- and infrared-light-transmitting properties is preferably used.

A stacked-layer structure including the substrate 151 and the components thereover up to the insulating layer 214 corresponds to the layer 101 including transistors in Embodiment 2.

The transistor 201, the transistor 205a, and the transistor 205e are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100F. This can inhibit entry of impurities from the end portion of the display apparatus 100F through the organic insulating film. Alternatively, the organic insulating film may be formed so that its end portion is positioned on the inner side compared to the end portion of the display apparatus 100F, to prevent the organic insulating film from being exposed at the end portion of the display apparatus 100F.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 15A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100F can be increased.

Each of the transistor 201, the transistor 205a, and the transistor 205e includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistor 201, the transistor 205a, and the transistor 205e. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

FIG. 15B and FIG. 15C illustrate other structure examples of transistors.

The transistor 209 and the transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 15B illustrates an example of the transistor 209 in which the insulating layer 225 covers a top surface and a side surface of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source, and the other functions as a drain.

In the transistor 210 illustrated in FIG. 15C, the insulating layer 225 overlaps with the channel formation region 231i of the semiconductor layer 231 and does not overlap with the low-resistance regions 231n. The structure illustrated in FIG. 15C is obtained by processing the insulating layer 225 with the conductive layer 223 as a mask, for example. In FIG. 15C, the insulating layer 215 is provided to cover the insulating layer 225 and the conductive layer 223, and the conductive layer 222a and the conductive layer 222b are connected to the low-resistance regions 231n through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 is a conductive film obtained by processing the same conductive film as the pixel electrode. On a top surface of the connection portion 204, the conductive layer 166 is exposed. Thus, the connection portion 204 and the FPC 172 can be electrically connected to each other through the connection layer 242.

A light-blocking layer 148 is preferably provided on the surface of the substrate 152 on the substrate 151 side. A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 provided to cover the light-emitting device prevents an impurity such as water from entering the light-emitting device. As a result, the reliability of the light-emitting device can be enhanced.

In the region 228 in the vicinity of the end portion of the display apparatus 100F, the insulating layer 215 and the protective layer 131 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display apparatus 100F can be enhanced.

For each of the substrate 151 and the substrate 152, glass, quartz, ceramics, sapphire, a resin, a metal, an alloy, a semiconductor, or the like can be used. The substrate on the side from which light from the light-emitting device is extracted is formed using a material that transmits the light. When the substrate 151 and the substrate 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

This embodiment can be combined with the other embodiments as appropriate.

Embodiment 4

In this embodiment, a light-emitting device that can be used for the display apparatus of one embodiment of the present invention is described.

Figures 16A, 16B, 16C, 16D:
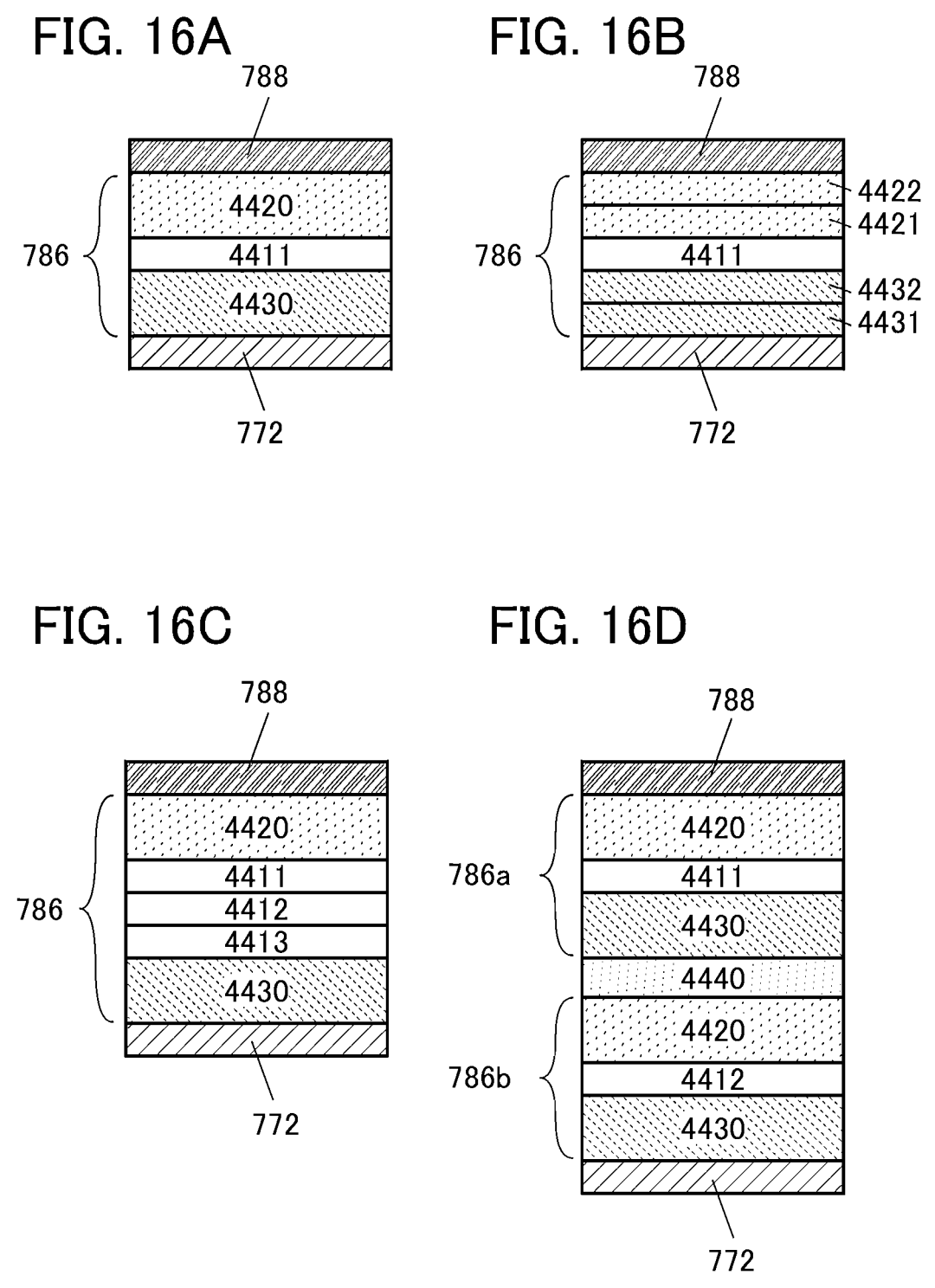

A light-emitting device illustrated in FIG. 16A includes an electrode 772, an EL layer 786, and an electrode 788. One of the electrode 772 and the electrode 788 functions as an anode and the other functions as a cathode. One of the electrode 772 and the electrode 788 functions as a pixel electrode and the other functions as a common electrode. One of the electrode 772 and the electrode 788, through which light is extracted, preferably has a visible-light-transmitting property, and the other preferably reflects visible light.

The EL layer 786 included in the light-emitting device can be formed of a plurality of layers such as a layer 4420, a light-emitting layer 4411, and a layer 4430, as illustrated in FIG. 16A. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can serve as a single light-emitting unit, and the structure in FIG. 16A is referred to as a single structure in this specification.

FIG. 16B is a modification example of the EL layer 786 included in the light-emitting device illustrated in FIG. 16A. Specifically, the light-emitting device illustrated in FIG. 16B includes a layer 4431 over the electrode 772, a layer 4432 over the layer 4431, the light-emitting layer 4411 over the layer 4432, a layer 4421 over the light-emitting layer 4411, a layer 4422 over the layer 4421, and the electrode 788 over the layer 4422. For example, when the electrode 772 functions as an anode and the electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the electrode 772 functions as a cathode and the electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layer structure, carriers can be efficiently injected to the light-emitting layer 4411, and the efficiency of the recombination of carriers in the light-emitting layer 4411 can be increased.

Note that a structure in which a plurality of light-emitting layers (light-emitting layers 4411, 4412, and 4413) are provided between the layer 4420 and the layer 4430 as illustrated in FIG. 16C is a variation of the single structure.

A structure in which a plurality of light-emitting units (EL layers 786a and 786b) are connected in series with an intermediate layer 4440 (also referred to as a charge-generation layer) therebetween as illustrated in FIG. 16D is referred to as a tandem structure in this specification. Without limitation thereto, the tandem structure may be referred to as a stack structure, for example. The tandem structure enables a light-emitting device capable of high-luminance light emission.

Note that also in FIG. 16C and FIG. 16D, the layer 4420 and the layer 4430 can each have a stacked-layer structure of two or more layers as illustrated in FIG. 16B.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

A light-emitting device that emits white light preferably contains two or more kinds of light-emitting substances in a light-emitting layer. To obtain white light emission, two or more light-emitting substances may be selected so that their emission colors are complementary. For example, when emission colors of a first light-emitting layer and a second light-emitting layer are complementary colors, the light-emitting device can be configured to emit white light as a whole. The same applies to a light-emitting device including three or more light-emitting layers. For example, when emission colors of the light-emitting layers 4411, 4412, and 4413 illustrated in FIG. 16C are complementary colors, a white-light-emitting device having a single structure can be obtained.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of color spectral components of R, G, and B.

[Modification Example of Display Apparatus]

Structure examples of light-emitting devices are described with reference to FIG. 17 to FIG. 20.

Figure 17A:
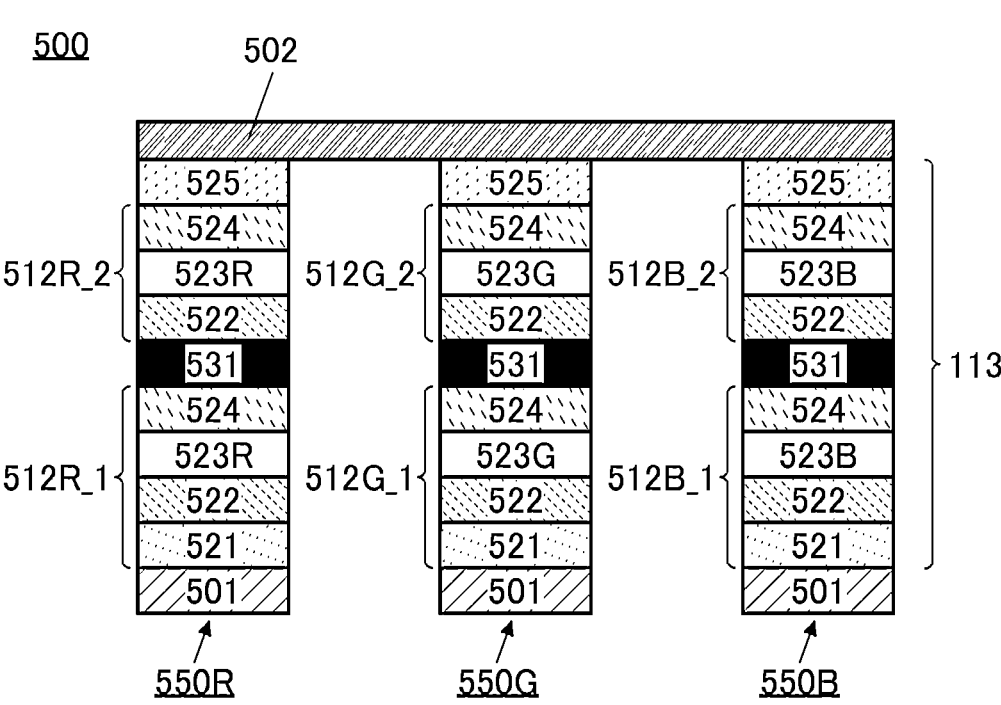
FIG. 17A and FIG. 17B are cross-sectional views each illustrating an example of a display apparatus.

FIG. 17A is a schematic cross-sectional view of a display apparatus 500. The display apparatus 500 includes a light-emitting device 550R that emits red light, a light-emitting device 550G that emits green light, and a light-emitting device 550B that emits blue light. Note that the description of the light-receiving device included in the display apparatus is omitted in this embodiment.

The light-emitting device 550R has a structure in which between a pair of electrodes (an electrode 501 and an electrode 502), two light-emitting units (a light-emitting unit 512R_1 and a light-emitting unit 512R_2) are stacked with an intermediate layer 531 therebetween. Similarly, the light-emitting device 550G includes a light-emitting unit 512G_1 and a light-emitting unit 512G_2, and the light-emitting device 550B includes a light-emitting unit 512B_1 and a light-emitting unit 512B_2.

The electrode 501 functions as a pixel electrode and is provided in every light-emitting device. The electrode 502 functions as a common electrode and is shared by a plurality of light-emitting devices.

The light-emitting unit 512R_1 includes a layer 521, a layer 522, a light-emitting layer 523R, a layer 524, and the like. The light-emitting unit 512R_2 includes the layer 522, the light-emitting layer 523R, the layer 524, and the like. The light-emitting device 550R includes a layer 525 and the like between the light-emitting unit 512R_2 and the electrode 502. Note that the layer 525 can also be regarded as part of the light-emitting unit 512R_2.

The layer 521 includes, for example, a layer containing a substance with a high hole-injection property (hole-injection layer). The layer 522 includes, for example, a layer containing a substance with a high hole-transport property (hole-transport layer). The layer 524 includes, for example, a layer containing a substance with a high electron-transport property (electron-transport layer). The layer 525 includes, for example, a layer containing a substance with a high electron-injection property (electron-injection layer).

Alternatively, the layer 521 may include an electron-injection layer, the layer 522 may include an electron-transport layer, the layer 524 may include a hole-transport layer, and the layer 525 may include a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

FIG. 17A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The intermediate layer 531 has a function of injecting electrons into one of the light-emitting unit 512R_1 and the light-emitting unit 512R_2 and injecting holes into the other when voltage is applied between the electrode 501 and the electrode 502. The intermediate layer 531 can also be referred to as a charge-generation layer.

For example, the intermediate layer 531 can be favorably formed using a material that can be used for the electron-injection layer, such as lithium. As another example, the intermediate layer can be favorably formed using a material that can be used for the hole-injection layer. A layer containing a hole-transport material and an acceptor material (electron-accepting material) can be used as the intermediate layer. A layer containing an electron-transport material and a donor material can be used as the intermediate layer. Forming the intermediate layer including such a layer can suppress an increase in the driving voltage that would be caused by stacking light-emitting units.

Note that the light-emitting layer 523R included in the light-emitting device 550R contains a light-emitting substance that emits red light, the light-emitting layer 523G included in the light-emitting device 550G contains a light-emitting substance that emits green light, and the light-emitting layer 523B included in the light-emitting device 550B contains a light-emitting substance that emits blue light. Note that the light-emitting device 550G and the light-emitting device 550B have a structure in which the light-emitting layer 523R included in the light-emitting device 550R is replaced with the light-emitting layer 523G and the light-emitting layer 523B, respectively, and the other components are similar to those of the light-emitting device 550R.

The structure (material, thickness, and the like) of the layer 521, the layer 522, the layer 524, and the layer 525 may be the same or different from each other among the light-emitting devices of different colors.

A structure in which a plurality of light-emitting units are connected in series with the intermediate layer 531 therebetween as in the light-emitting device 550R, the light-emitting device 550G, and the light-emitting device 550B is referred to as a tandem structure in this specification. In contrast, a structure in which one light-emitting unit is provided between a pair of electrodes is referred to as a single structure. Note that in this specification and the like, the term "tandem structure" is used; however, without being limited to this, the tandem structure may be referred to as a stack structure, for example. The tandem structure enables a light-emitting device capable of high-luminance light emission. Furthermore, the tandem structure reduces the amount of current needed for obtaining the same luminance as compared with a single structure, and thus can improve the reliability.

A structure in which light-emitting layers of light-emitting devices are separately formed as in the light-emitting device 550R, the light-emitting device 550G, and the light-emitting device 550B is referred to as a side-by-side (SBS) structure in some cases. The SBS structure can optimize materials and structures of light-emitting devices and thus can extend freedom of choice of materials and structures, whereby the luminance and the reliability can be easily improved.

It can be said that the display apparatus 500 employs a tandem structure and an SBS structure. Thus, the display apparatus 500 can take advantages of both the tandem structure and the SBS structure. As illustrated in FIG. 17A, two light-emitting units are formed in series in the display apparatus 500, and this structure may be referred to as a two-unit tandem structure. In the two-unit tandem structure illustrated in FIG. 17A, a second light-emitting unit including a red-light-emitting layer is stacked over a first light-emitting unit including a red-light-emitting layer. Similarly, in the two-unit tandem structure illustrated in FIG. 17A, a second light-emitting unit including a green-light-emitting layer is stacked over a first light-emitting unit including a green-light-emitting layer, and a second light-emitting unit including a blue-light-emitting layer is stacked over a first light-emitting unit including a blue-light-emitting layer.

In FIG. 17A, the light-emitting unit 512R_1, the intermediate layer 531, the light-emitting unit 512R_2, and the layer 525 can be formed as an island-shaped layer. The light-emitting unit 512G_1, the intermediate layer 531, the light-emitting unit 512G_2, and the layer 525 can be formed as an island-shaped layer. The light-emitting unit 512B_1, the intermediate layer 531, the light-emitting unit 512B_2, and the layer 525 can be formed as an island-shaped layer. That is, a layer 113 illustrated in FIG. 17A corresponds to the first layer 113a, the second layer 113b, or the third layer 113c illustrated in FIG. 9B or the like.

Figure 17B:
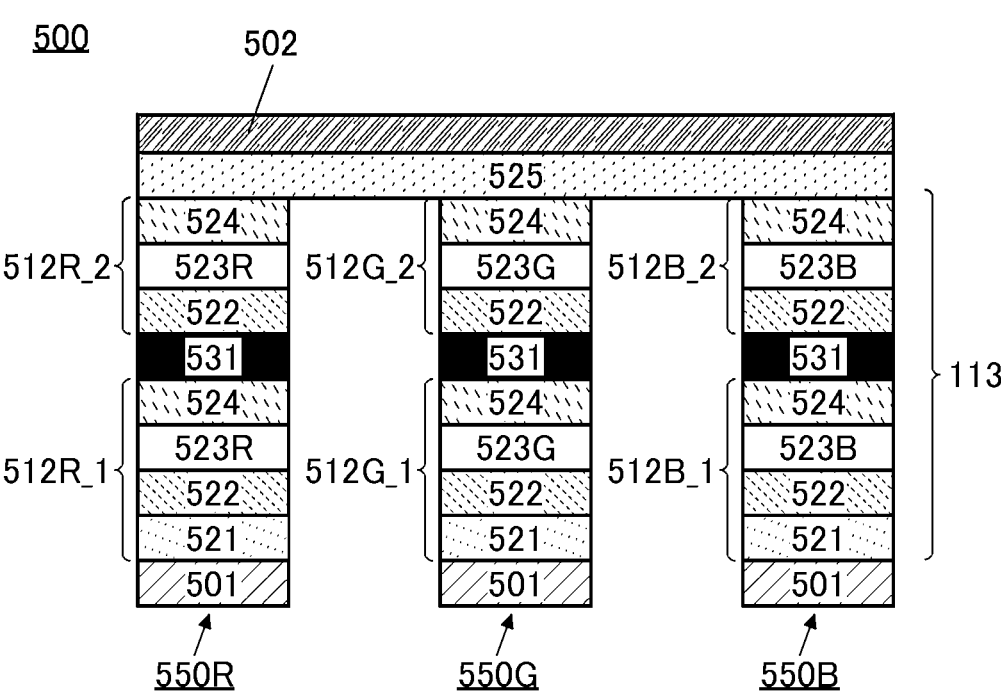

FIG. 17B illustrates a modification example of the display apparatus 500 illustrated in FIG. 17A. The display apparatus 500 illustrated in FIG. 17B is an example of the case where like the electrode 502, the layer 525 is shared by the light-emitting devices. In this case, the layer 525 can be referred to as a common layer. By providing one or more common layers for a plurality of light-emitting devices in this manner, the manufacturing process can be simplified, resulting in a reduction in manufacturing cost.

In FIG. 17B, the light-emitting unit 512R_1, the intermediate layer 531, and the light-emitting unit 512R_2 can be formed as an island-shaped layer. The light-emitting unit 512G_1, the intermediate layer 531, and the light-emitting unit 512G_2 can be formed as an island-shaped layer. The light-emitting unit 512B_1, the intermediate layer 531, and the light-emitting unit 512B_2 can be formed as an island-shaped layer. That is, the layer 113 illustrated in FIG. 17B corresponds to the first layer 113a, the second layer 113b, or the third layer 113c illustrated in FIG. 9B or the like. The layer 525 corresponds to the sixth layer 114 illustrated in FIG. 9B. Note that also in FIG. 18 to FIG. 20, a layer corresponding to the first layer 113a, the second layer 113b, or the third layer 113c illustrated in FIG. 9B or the like is denoted by the layer 113.

Figure 18A:
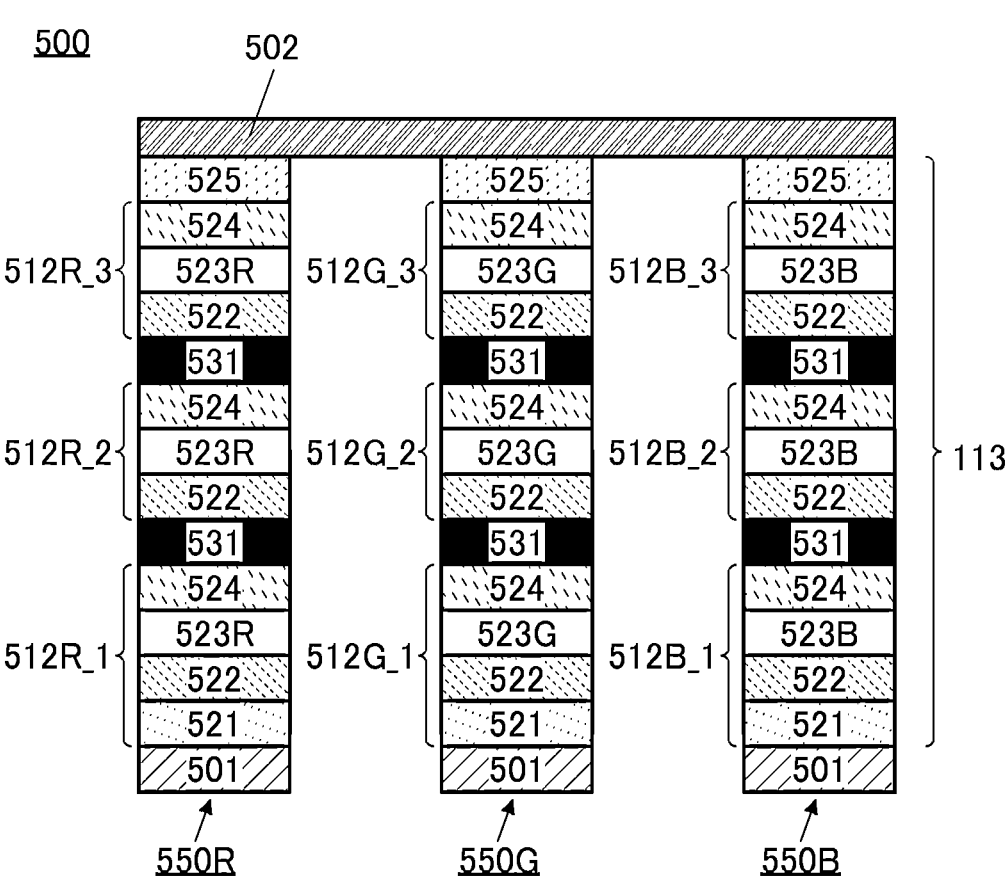
FIG. 18A and FIG. 18B are cross-sectional views each illustrating an example of a display apparatus.

The display apparatus 500 illustrated in FIG. 18A is an example in which three light-emitting units are stacked. In the light-emitting device 550R in FIG. 18A, a light-emitting unit 512R_3 is further stacked over the light-emitting unit 512R_2 with another intermediate layer 531 therebetween. The light-emitting unit 512R_3 includes the layer 522, the light-emitting layer 523R, the layer 524, and the like. The light-emitting unit 512R_3 can have a structure similar to that of the light-emitting unit 512R_2. The same applies to a light-emitting unit 512G_3 included in the light-emitting device 550G and a light-emitting unit 512B_3 included in the light-emitting device 550B.

Figure 18B:
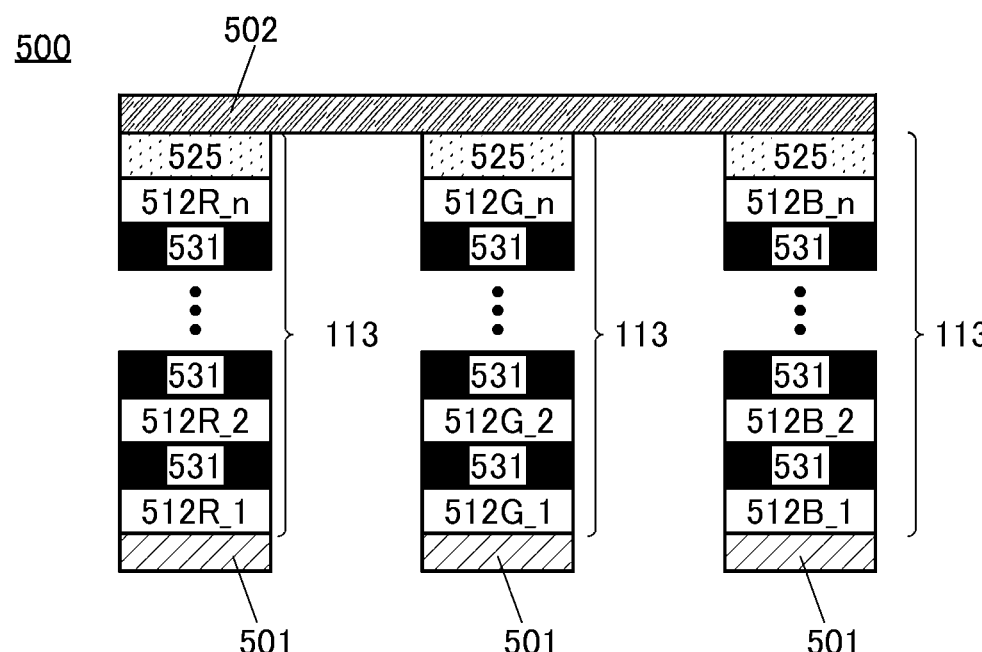

FIG. 18B illustrates an example in which n light-emitting units (n is an integer greater than or equal to 2) are stacked.

When the number of stacked light-emitting units is increased in the above manner, luminance obtained from the light-emitting device with the same amount of current can be increased in accordance with the number of stacked layers. Moreover, increasing the number of stacked light-emitting units can reduce current necessary for obtaining the same luminance; thus, power consumption of the light-emitting device can be reduced in accordance with the number of stacked layers.

Figure 19A:
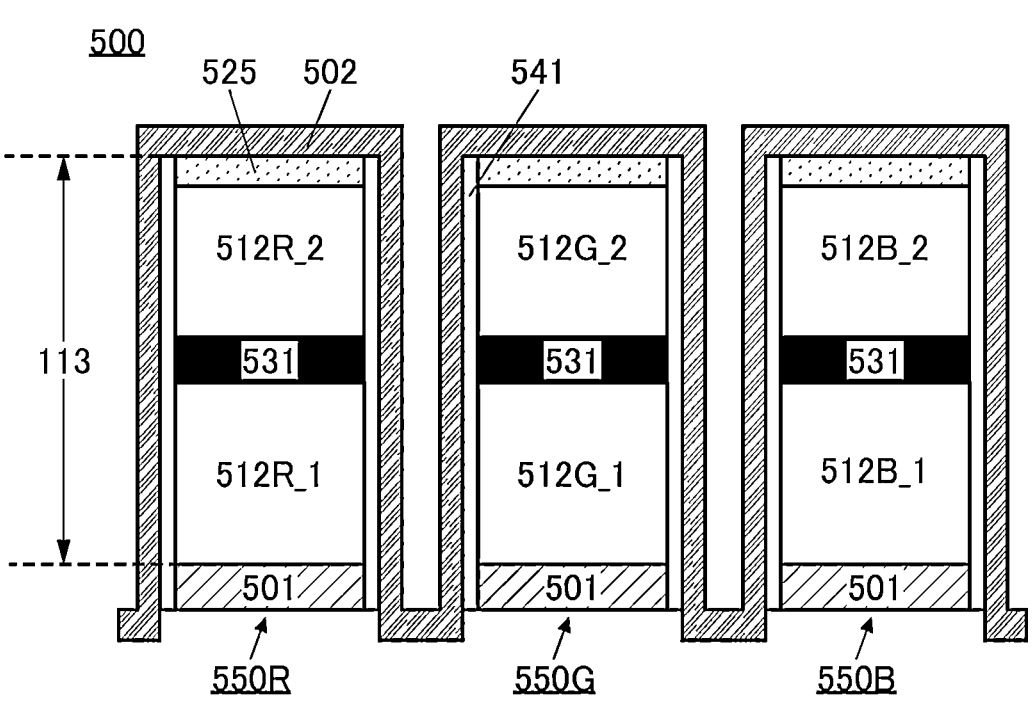
FIG. 19A and FIG. 19B are cross-sectional views each illustrating an example of a display apparatus.

The display apparatus 500 illustrated in FIG. 19A is an example in which two adjacent light-emitting devices are separated from each other and the electrode 502 is provided along the side surfaces of the light-emitting units and the intermediate layers 531.

Here, the intermediate layer 531 and the electrode 502 might be electrically short-circuited when in contact with each other. Thus, the intermediate layer 531 and the electrode 502 are preferably insulated from each other.

FIG. 19A illustrates an example in which an insulating layer 541 is provided to cover the side surfaces of the electrode 501, the light-emitting units, and the intermediate layer 531. The insulating layer 541 can be referred to as a sidewall, a sidewall protective layer, a sidewall insulating film, or the like. With the insulating layer 541, the intermediate layer 531 and the electrode 502 can be electrically insulated from each other.

The side surfaces of the light-emitting units and the intermediate layer 531 are preferably perpendicular to or substantially perpendicular to the formation surface. For example, the angle between the formation surface and these side surfaces is preferably greater than or equal to 60° and less than or equal to 90°.

Figure 19B:
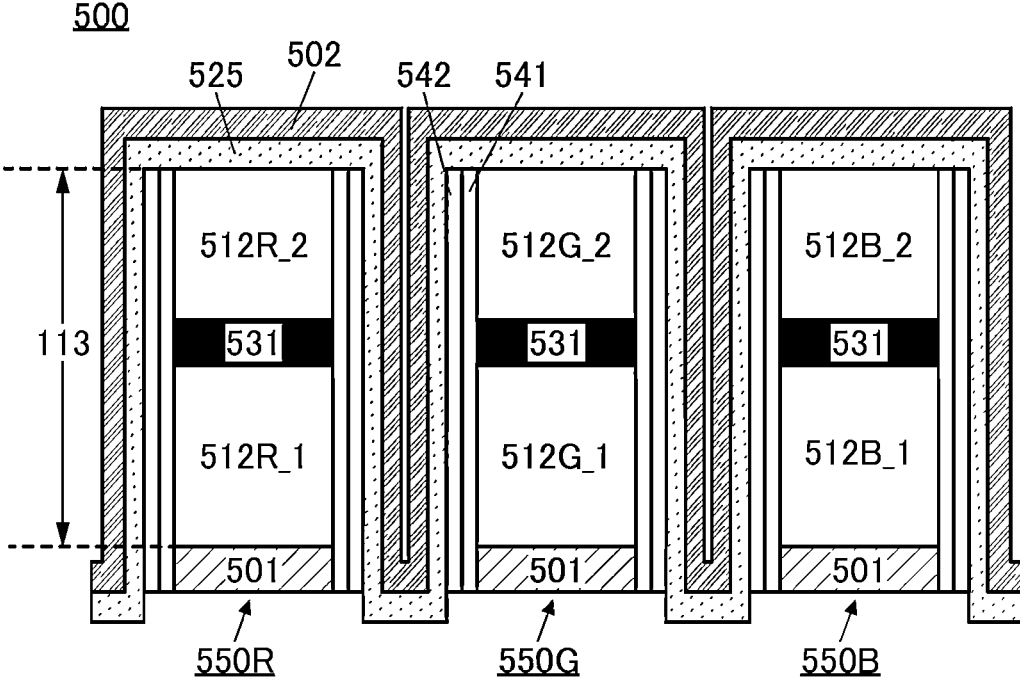

FIG. 19B illustrates an example in which the layer 525 and the electrode 502 are provided along the side surfaces of the light-emitting units and the intermediate layers 531. Furthermore, a two-layer structure of the insulating layer 541 and an insulating layer 542 is provided as a sidewall protective layer.

Figure 20A:
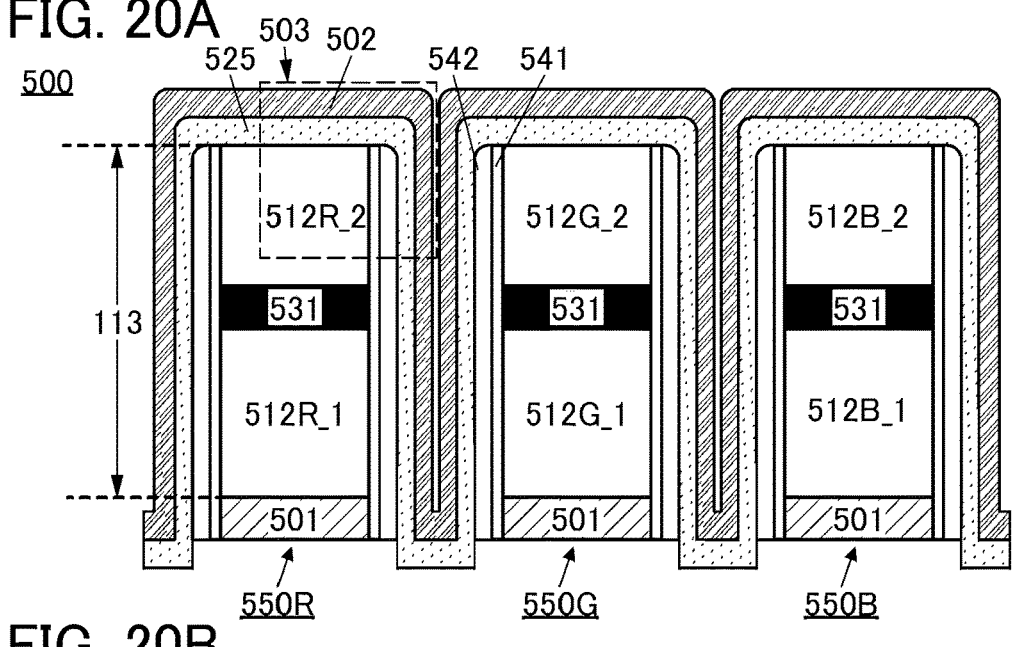
FIG. 20A to FIG. 20C are cross-sectional views illustrating examples of display apparatuses.
Figure 20B:
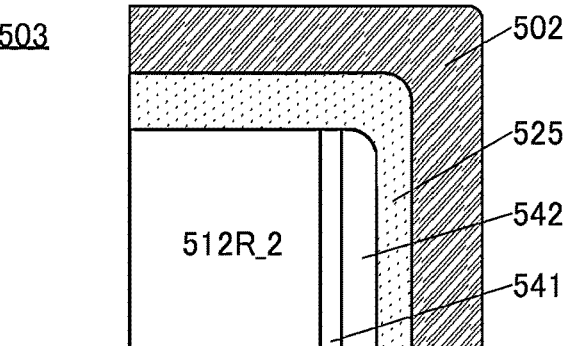

FIG. 20A illustrates a modification example of FIG. 19B. FIG. 20B is an enlarged view of a region 503 illustrated in FIG. 20A. The shape of an end portion of the insulating layer 542 in FIG. 20A is different from that in FIG. 19B. The shape of the end portion of the insulating layer 542 is different and the layer 525 and the electrode 502 are formed along the shape of the insulating layer 542; accordingly, the shapes of the layer 525 and the electrode 502 are also different. FIG. 20A is different from FIG. 19B in that the thickness of the insulating layer 542 is larger than the thickness of the insulating layer 541. The shape of the end portion of the insulating layer 542 can be a rounded shape as in FIG. 20B. For example, the end portion of the insulating layer 542 can be rounded as illustrated in FIG. 20B when an upper portion of the insulating layer 542 is etched by anisotropic etching in formation of the insulating layer 542 by a dry etching method. The rounded end portion of the insulating layer 542 is favorable because coverage with the layer 525 and the electrode 502 can be increased. As illustrated in FIG. 20A and FIG. 20B, the end portion is easily rounded in some cases when the thickness of the insulating layer 542 is larger than the thickness of the insulating layer 541.

Owing to the insulating layer 541 (and the insulating layer 542) functioning as the sidewall protective layer, the electrode 502 and the intermediate layer 531 can be prevented from being electrically short-circuited. Furthermore, the insulating layer 541 (and the insulating layer 542) covers the side surfaces of the electrode 501, whereby the electrode 501 and the electrode 502 can be prevented from being electrically short-circuited. Thus, an electric short circuit at corner portions of four corners of the light-emitting device can be prevented.

An inorganic insulating film is preferably used for each of the insulating layer 541 and the insulating layer 542. For example, an oxide or a nitride such as silicon oxide, silicon oxynitride, silicon nitride oxide, silicon nitride, aluminum oxide, aluminum oxynitride, or hafnium oxide can be used. Yttrium oxide, zirconium oxide, gallium oxide, tantalum oxide, magnesium oxide, lanthanum oxide, cerium oxide, neodymium oxide, or the like may be used.

The insulating layer 541 and the insulating layer 542 can be formed by any of a variety of film formation methods such as a sputtering method, an evaporation method, a CVD method, and an ALD method, for example. In particular, the insulating layer 541 that is formed directly on the light-emitting units and the intermediate layer 531 is preferably formed by an ALD method, which causes little damage on a formation layer. At this time, the insulating layer 542 is preferably formed by a sputtering method, in which case the productivity can be increased.

For example, an aluminum oxide film formed by an ALD method can be used as the insulating layer 541 and a silicon nitride film formed by a sputtering method can be used as the insulating layer 542.

One or both of the insulating layer 541 and the insulating layer 542 preferably have a function of a barrier insulating film against at least one of water and oxygen. Alternatively, one or both of the insulating layer 541 and the insulating layer 542 preferably have a function of inhibiting diffusion of at least one of water and oxygen. Alternatively, one or both of the insulating layer 541 and the insulating layer 542 preferably have a function of capturing or fixing (also referred to as gettering) at least one of water and oxygen.

Note that in this specification and the like, a barrier insulating film refers to an insulating film having a barrier property. In this specification and the like, a barrier property refers to a function of inhibiting diffusion of a targeted substance (also referred to as having low permeability). Alternatively, a barrier property refers to a function of capturing or fixing (also referred to as gettering) a targeted substance.

When one or both of the insulating layer 541 and the insulating layer 542 have a function of the barrier insulating film or a gettering function, entry of impurities (typically, water or oxygen) that would diffuse into the light-emitting devices from the outside can be suppressed. With such a structure, the display apparatus can have high reliability.

Figure 20C:
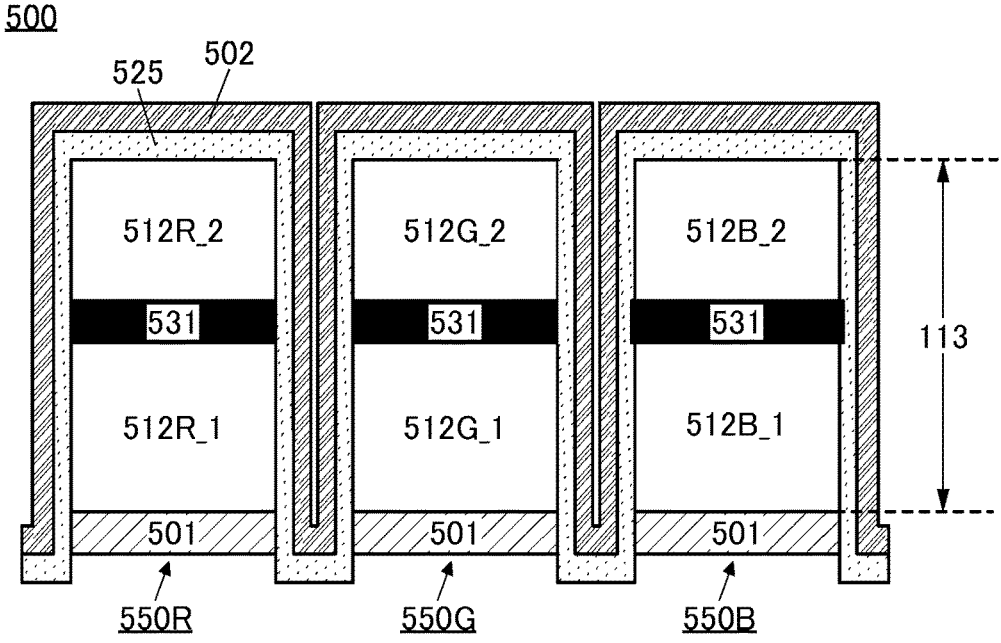

As illustrated in FIG. 20C, the insulating layer 541 and the insulating layer 542 that function as the sidewall protective layer are not necessarily provided. In FIG. 20C, the layer 525 is provided in contact with the side surfaces of the light-emitting units and the intermediate layers 531.

There is no particular limitation on the light-emitting material of the light-emitting layer in the display apparatus 500. For example, in the display apparatus 500 illustrated in FIG. 17A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a fluorescent material, the light-emitting layer 523G included in the light-emitting unit 512G_2 contains a fluorescent material, the light-emitting layer 523B included in the light-emitting unit 512B_1 contains a fluorescent material, and the light-emitting layer 523B included in the light-emitting unit 512B_2 contains a fluorescent material.

Alternatively, in the display apparatus 500 illustrated in FIG. 17A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a phosphorescent material, the light-emitting layer 523G included in the light-emitting unit 512G_2 contains a phosphorescent material, the light-emitting layer 523B included in the light-emitting unit 512B_1 contains a fluorescent material, and the light-emitting layer 523B included in the light-emitting unit 512B_2 contains a fluorescent material.

Note that in the display apparatus of one embodiment of the present invention, all the light-emitting layers may contain fluorescent materials or all the light-emitting layers may contain phosphorescent materials.

Alternatively, the display apparatus 500 illustrated in FIG. 17A may employ a structure in which the light-emitting layer 523R included in the light-emitting unit 512R_1 contains a phosphorescent material and the light-emitting layer 523R included in the light-emitting unit 512R_2 contains a fluorescent material, or a structure in which the light-emitting layer 523R included in the light-emitting unit 512R_1 contains a fluorescent material and the light-emitting layer 523R included in the light-emitting unit 512R_2 contains a phosphorescent material, i.e., a structure in which a light-emitting layer in a first unit and a light-emitting layer in a second unit are formed using different light-emitting materials. Note that here, the light-emitting unit 512R_1 and the light-emitting unit 512R_2 are described, and the same structure can also be applied to the light-emitting unit 512G_1 and the light-emitting unit 512G_2, and the light-emitting unit 512B_1 and the light-emitting unit 512B_2.

This embodiment can be combined with the other embodiments as appropriate.

Embodiment 5

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, forma-tion of a crystal grain boundary is inhibited by the distortion of lattice arrangement. This is probably because the CAAC-OS can tolerate distortion owing to a low density of arrange-ment of oxygen atoms in the a-b plane direction, an inter-atomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconduc-tor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semi-conductor might be decreased by entry of impurities, for-mation of defects, or the like, the CAAC-OS can be regarded as an oxide semiconductor that has small amounts of impu-rities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD mea-surement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a struc-ture between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a com-posite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main compo-nent. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$) and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^{-3}$, preferably lower than or equal to $2 \times 10^{17}$ atoms/cm$^{3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/cm$^{3}$, preferably lower than or equal to $2 \times 10^{16}$ atoms/cm$^{3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^{3}$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 6

In this embodiment, electronic devices of one embodiment of the present invention are described with reference to FIG. 21 to FIG. 23.

An electronic device of this embodiment is provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display apparatus of one embodiment of the present invention can have a high resolution, and thus can be favorably used for an electronic device having a relatively small display portion. Examples of such an electronic device include a watch-type or a bracelet-type information terminal device (wearable device), and a wearable device worn on a head, such as a device for VR (Virtual Reality) such as a head mounted display, a glasses-type device for AR (Augmented Reality), and a device for MR (Mixed Reality).

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display apparatus of one embodiment of the present invention is preferably higher than or equal to 100 ppi, preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with high definition and high resolution, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
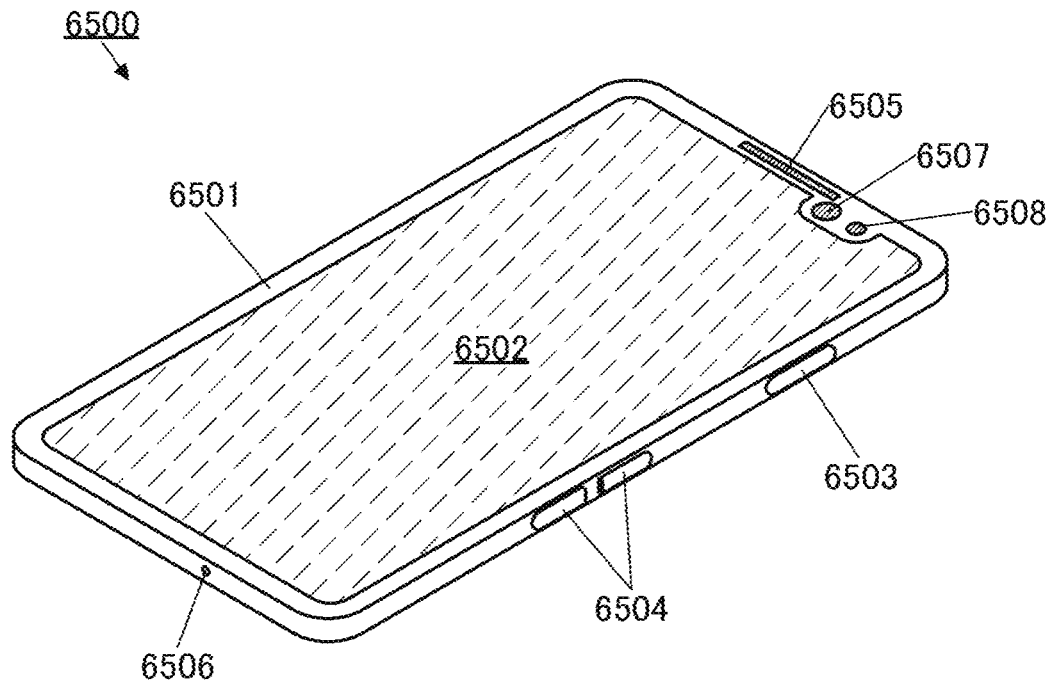
FIG. 21A and FIG. 21B are diagrams illustrating an example of an electronic device.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 21B:
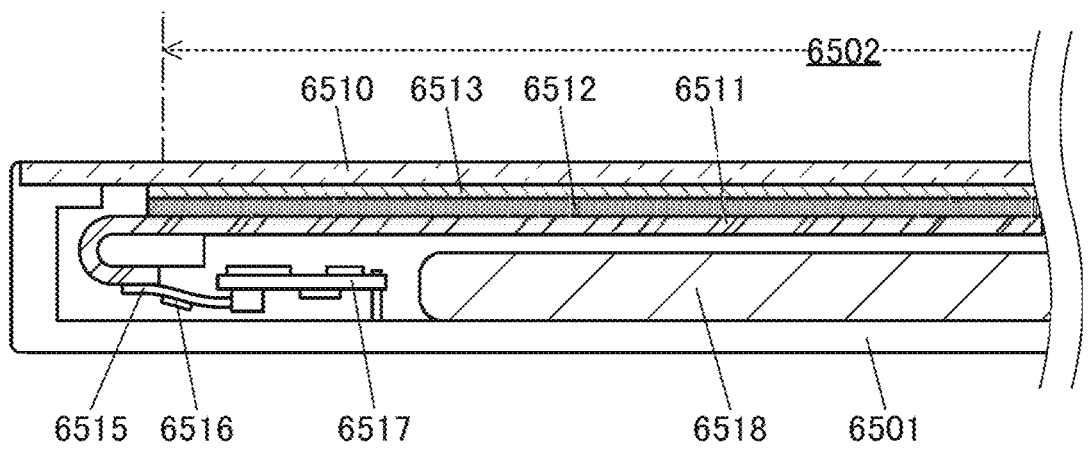

FIG. 21B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 22A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 22A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 22B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 22C and FIG. 22D illustrate examples of digital signage.

Digital signage 7300 illustrated in FIG. 22C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 22C and FIG. 22D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 23A to FIG. 23F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 23A to FIG. 23F.

The electronic devices illustrated in FIG. 23A to FIG. 23F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 23A to FIG. 23F are described in detail below.

FIG. 23A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, an SNS (social networking service) message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 23B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 23C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 23D to FIG. 23F are perspective views illustrating a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

Example

In this example, results of evaluating a near touch sensor function of a display apparatus of one embodiment of the present invention are described.

In this example, a display apparatus including the subpixel G, the subpixel B, the subpixel R, and the subpixel IRS in a pixel was evaluated.

The subpixel R includes a light-emitting device that emits red light. The subpixel G includes a light-emitting device that emits green light. The subpixel B includes a light-emitting device that emits blue light. Organic EL devices were used as the light-emitting devices.

The subpixel IRS includes a light-receiving device that senses infrared light. An organic optical sensor was used as the light-receiving device.

In this example, light that was emitted from a light source and reflected by a hand (finger) of an object was sensed with the light-receiving device included in the subpixel IRS. Light reflection by the skin is almost perfect scattering (perfect scattering and a slight regular reflection component), and thus the intensity of reflected light that is to be sensed changes according to a relation between the finger position and the subpixel IRS that senses reflected light. Accordingly, sensing the reflected light with a plurality of subpixels IRS enables the finger position to be estimated from the ratio of the reflection intensities.

[Evaluation 1]

Figure 24A:
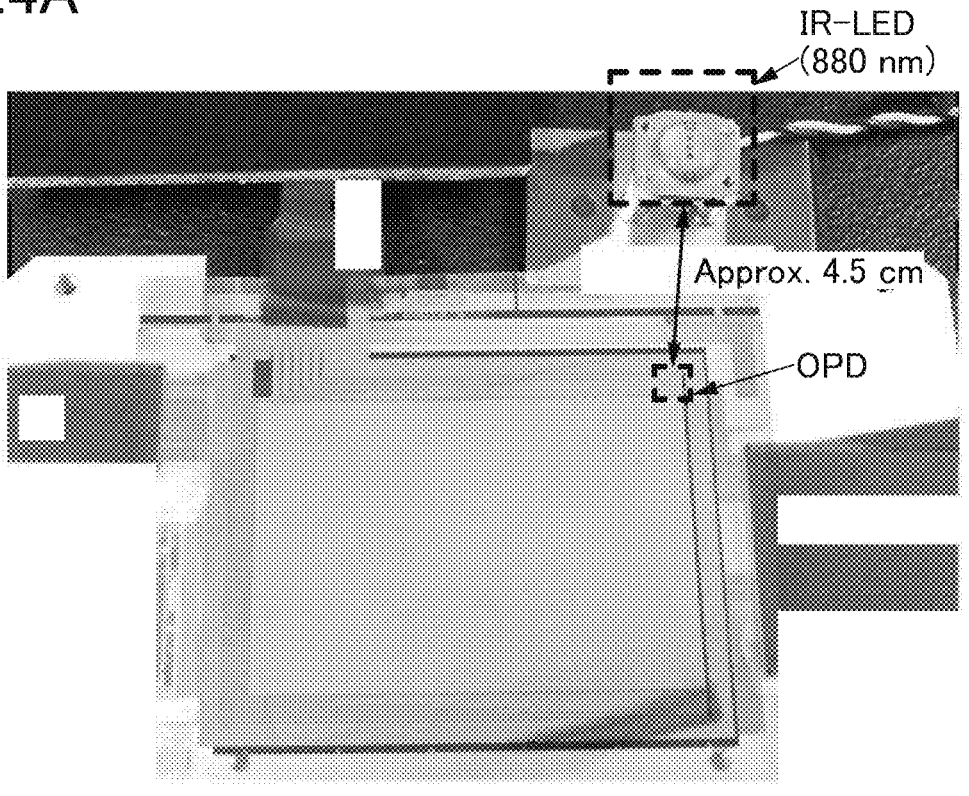
FIG. 24A and FIG. 24B are diagrams showing an evaluation method in Example.

FIG. 24A is a photograph of an evaluation system, which shows the positional relation between a display apparatus and a light source used for the evaluation, for example. An LED emitting infrared light with a wavelength of 880 nm was used as a light source IR-LED, and was driven with 0.3 A. The distance between the light source IR-LED and a sensor OPD was set to approximately 4.5 cm.

The evaluation system shown in FIG. 24A was used to evaluate how far from the display apparatus light reflected by a hand was able to be sensed.

Figure 25A:
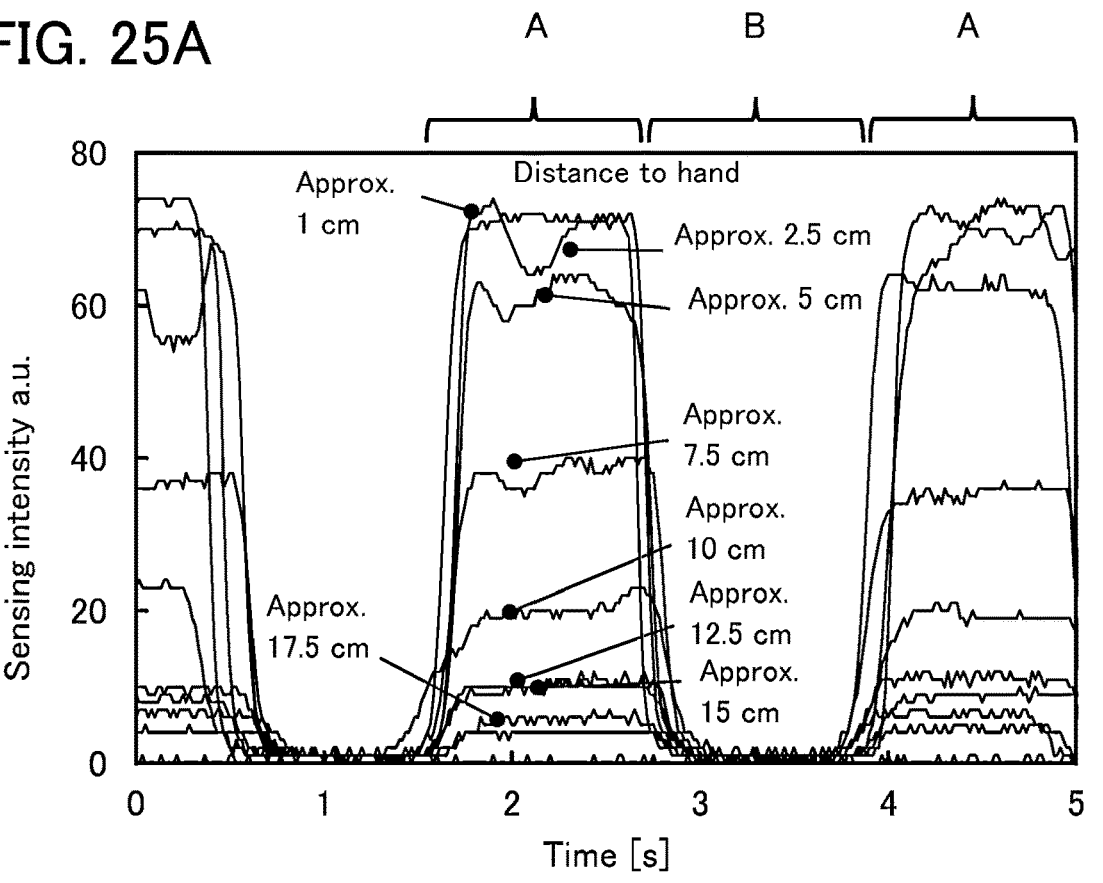
FIG. 25A and FIG. 25B show evaluation results in Example.

FIG. 25A shows changes in the sensing intensity of the time when a hand is placed over the display apparatus and the time when a hand is not placed over the display apparatus. In FIG. 25A, a period A is the time when a hand is placed over the display apparatus and a period B is the time when a hand is not placed over the display apparatus. The sensing intensities were high in the period A while the sensing intensities were low in the period B. As shown in FIG. 25A, it is confirmed that light reflected by the hand can be sensed even when the distance between the display apparatus and the hand is approximately 15 cm or longer.

Figure 25B:
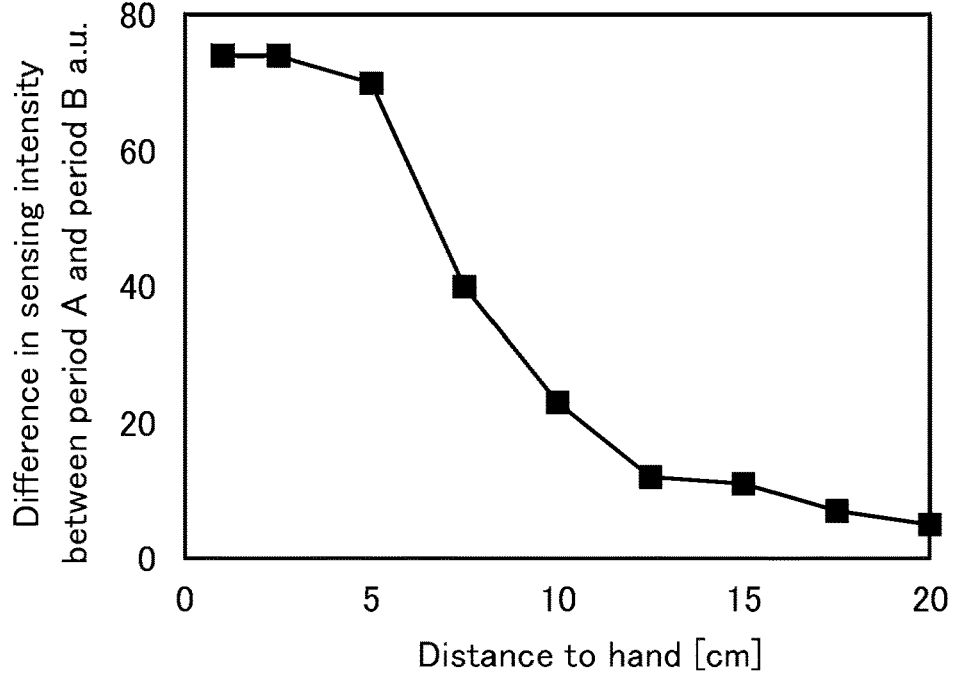

FIG. 25B shows a difference in sensing intensity between the period A and the period B in accordance with the distance between the display apparatus and the hand. Specifically, the vertical axis in FIG. 25B represents a difference in average value of the sensing intensity between the time when the hand is placed over the display apparatus and the time when the hand is not placed over the display apparatus. As shown in FIG. 25B, the longer the distance is, the smaller the difference in sensing intensity is. This indicates that with the near touch sensor function, an object positioned at a distance of longer than or equal to 0 mm and shorter than or equal to 15 cm, preferably longer than or equal to 0 mm and shorter than or equal to 10 cm from the display apparatus can be sensed with high accuracy.

[Evaluation 2]

In Evaluation 1, the evaluation in the direction perpendicular to the display surface of the display apparatus was performed. Next, as Evaluation 2, evaluation in the direction parallel to the display surface of the display apparatus, i.e., the positional accuracy evaluation was performed.

Figure 24B:
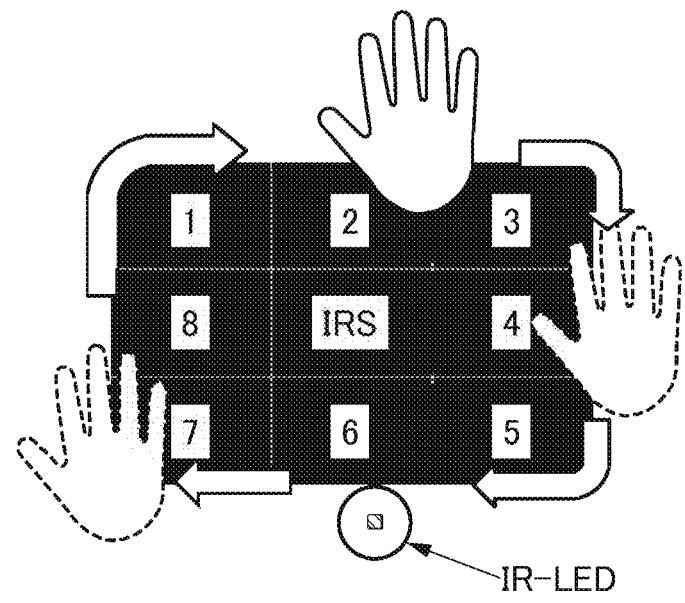

Specifically, as shown in FIG. 24B, images were captured while a hand at a distance of approximately 5 cm from the display apparatus was moving along the periphery of the display apparatus.

Evaluation was performed under three conditions: a bare hand, a hand with a black glove on, and a hand with a gray glove on. The black glove is made of chemical fiber, and is not sensed by a capacitive touch sensor. The gray glove is made of conductive fiber in which copper sulfide is mixed with chemical fiber, and can be sensed by a capacitive touch sensor.

Note that the same light source as in Evaluation 1 was used.

Figure 26:
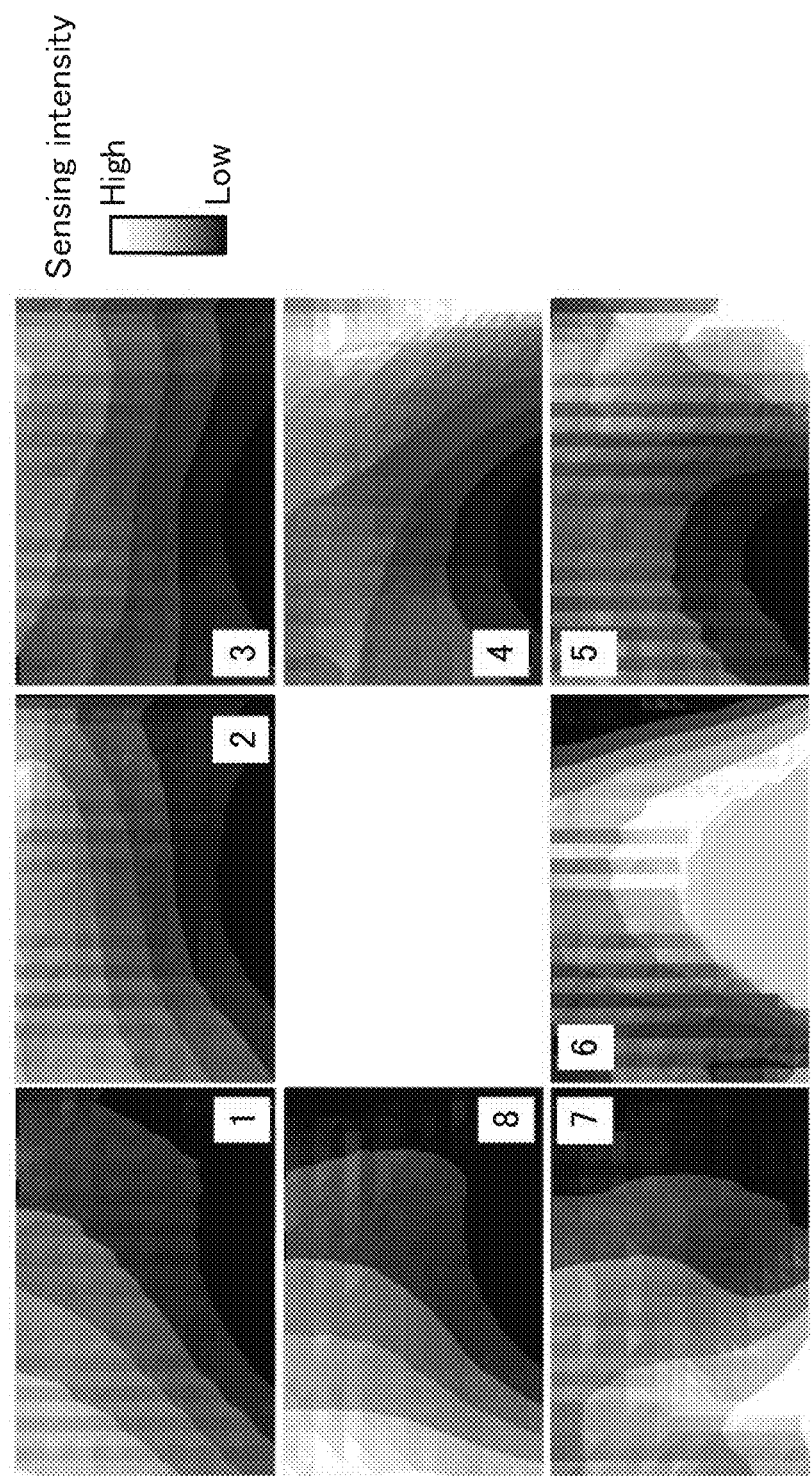
FIG. 26 shows an evaluation result in Example.
Figure 27:
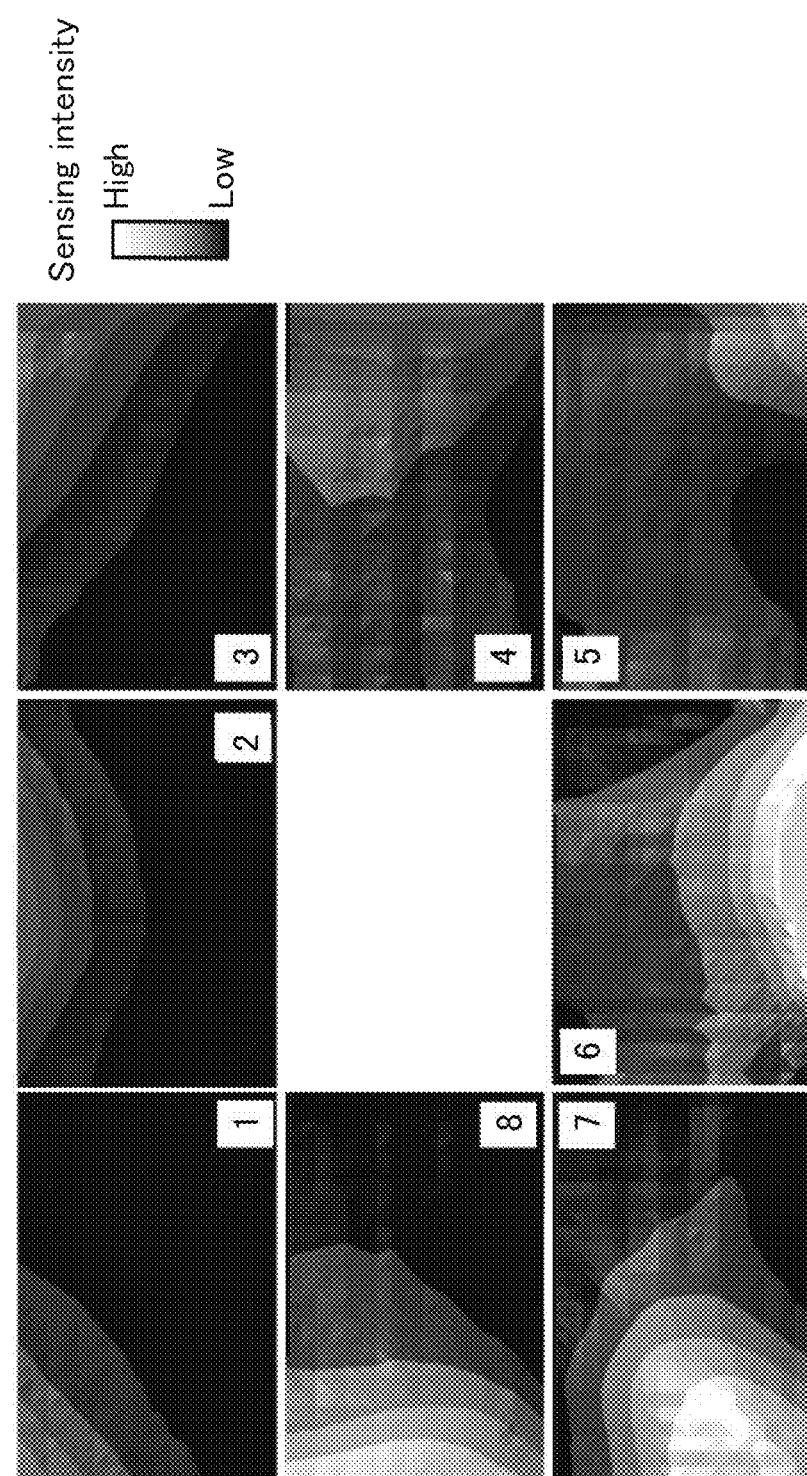
FIG. 27 shows an evaluation result in Example.
Figure 28:
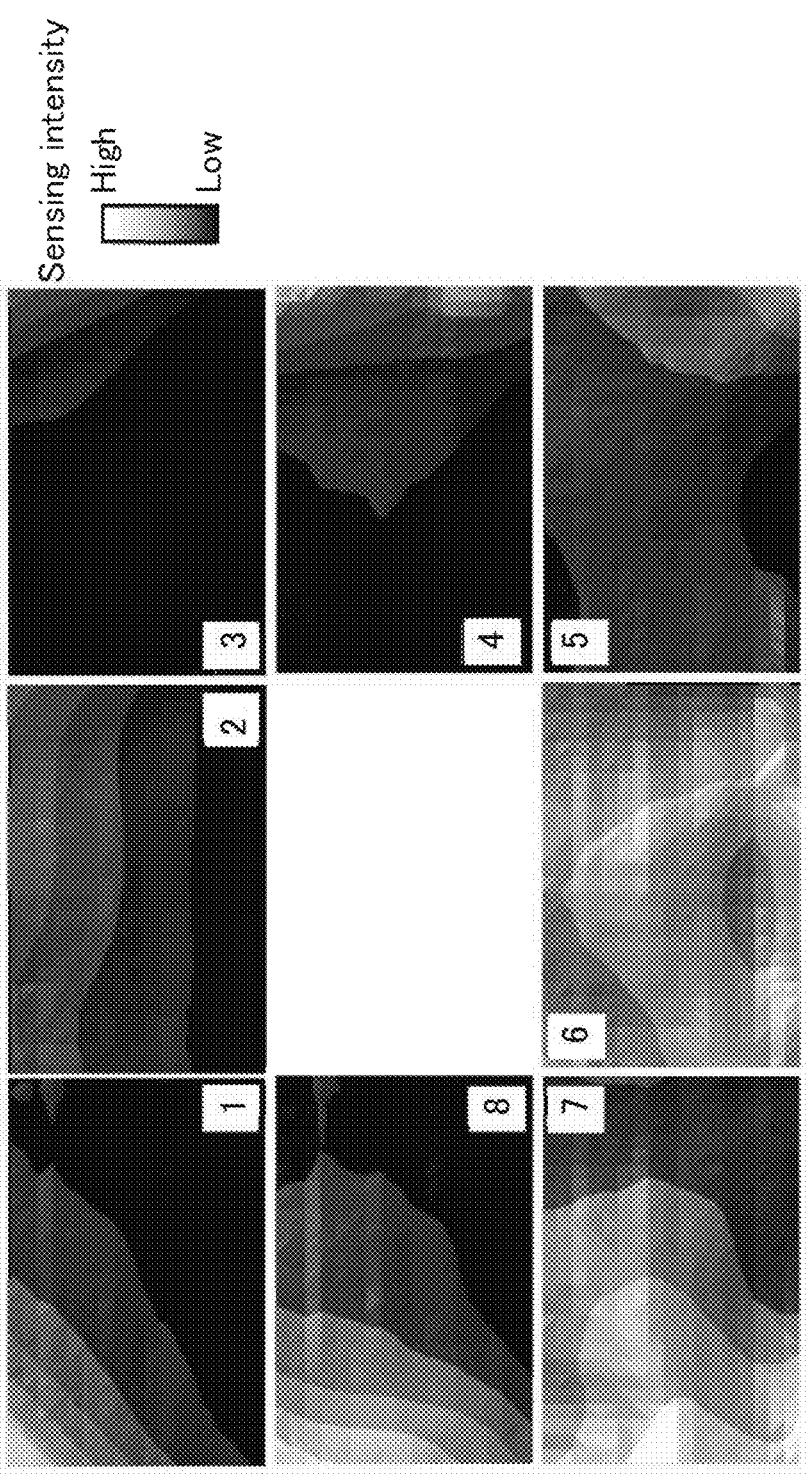
FIG. 28 shows an evaluation result in Example.

FIG. 26 to FIG. 28 show results of capturing reflection images when the hand was placed over the display apparatus at positions of a region 1 to a region 8 shown in FIG. 24B.

FIG. 26 shows the evaluation result of the bare hand, FIG. 27 shows the evaluation result of the hand with the black glove on, and FIG. 28 shows the evaluation result of the hand with the gray glove on. For viewability, FIG. 26 to FIG. 28 show the results in which each image was normalized.

As shown in FIG. 26 to FIG. 28, it is confirmed that, when the hand is placed at a position of any of the region 1 to the region 8, the sensing intensity is high at a location that is the closest to the position and the sensing intensities are low at other locations regardless of the presence or absence of a glove and the kind of glove. Thus, it can be said from these intensity ratios that at which position of the region 1 to the region 8 the hand is placed is identified.

Figure 29:
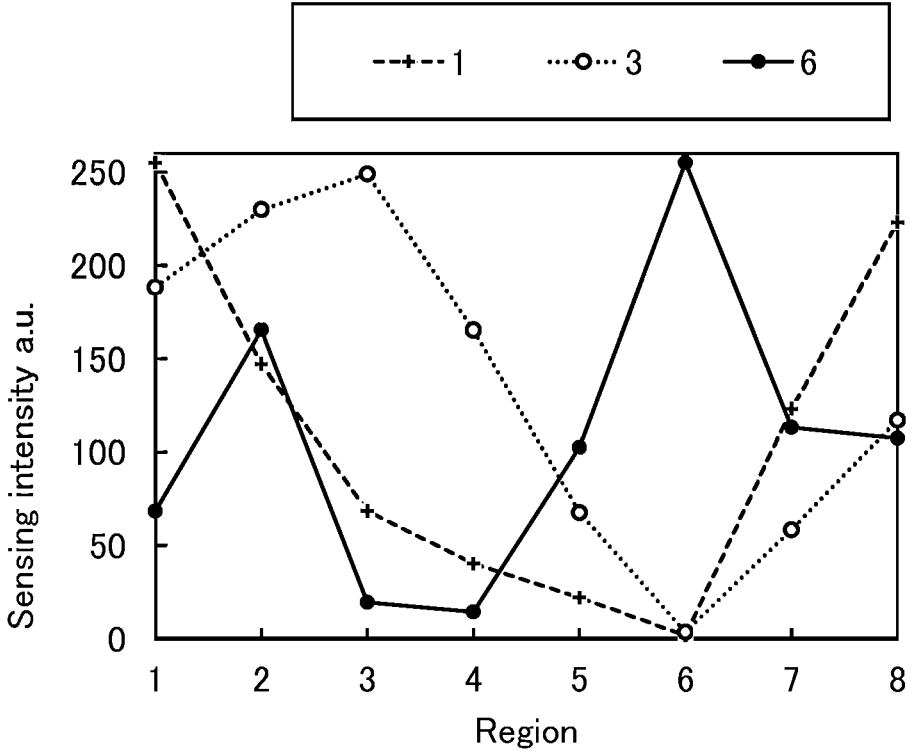
FIG. 29 shows an evaluation result in Example.

Next, FIG. 29 is a graph showing the sensing intensities of the reflected light from the region 1 to the region 8 when the hand is placed around the region 6 that is the closest to the light source, and the region 1 and the region 3 that are the farthest from the light source in the evaluation with the bare hand.

It is confirmed also from FIG. 29 that the sensing intensity of the region that is the closest to the hand is high as in the image of FIG. 26.

It is confirmed from the results in this example that the position of an object can be estimated in such a manner that a point light source is used and reflected light from the object that is positioned away from a display apparatus is received by a plurality of light-receiving devices included in the display apparatus. In this manner, the object can be sensed even when the object is not touching the display apparatus. This indicates that operations of a screen such as swipe and scroll can be performed in a non-contact manner.

REFERENCE NUMERALS

CL: wiring, M11: transistor, M12: transistor, M13: transistor, M14: transistor, M15: transistor, RS: wiring, SE: wiring, SW: wiring, TX: wiring, VCP: wiring, VPI: wiring, VRS: wiring, WX: wiring, 31B: light, 31G: light, 3118: infrared light, 31R: light, 32G: reflected light, 3218: reflected light, 100A: display apparatus, 100B: display apparatus, 100C: display apparatus, 100D: display apparatus, 100E: display apparatus, 100F: display apparatus, 100: display apparatus, 101: layer, 102: substrate, 103: housing, 104: light source, 105: protection member, 106: substrate, 108: object, 110a: subpixel, 110b: subpixel, 110c: subpixel, 110d: subpixel, 110e: subpixel, 110: pixel, 111a: pixel electrode, 111b: pixel electrode, 111c: pixel electrode, 111d: pixel electrode, 111e: pixel electrode, 113: layer, 113a: first layer, 113b: second layer, 113c: third layer, 113d: fourth layer, 113e: fifth layer, 114: sixth layer, 115: common electrode, 118A: first sacrificial layer, 118a: first sacrificial layer, 118B: first sacrificial layer, 118b: first sacrificial layer, 118c: first sacrificial layer, 118d: first sacrificial layer, 118e: first sacrificial layer, 119A: second sacrificial layer, 119a: second sacrificial layer, 119B: second sacrificial layer, 119b: second sacrificial layer, 119c: second sacrificial layer, 119d: second sacrificial layer, 119e: second sacrificial layer, 120: substrate, 121: insulating layer, 122: resin layer, 123: conductive layer, 130a: light-emitting device, 130B: light-emitting device, 130b: light-emitting device, 130c: light-emitting device, 130G: light-emitting device, 1301R: light-emitting device, 130R: light-emitting device, 131: protective layer, 133: space, 140: connection portion, 142: adhesive layer, 148: light-blocking layer, 150d: light-receiving device, 150e: light-receiving device, 150IRS: light-receiving device, 150PS: light-receiving device, 151: substrate, 152: substrate, 162: display portion, 164: circuit, 165: wiring, 166: conductive layer, 172: FPC, 173: IC, 180A: pixel, 180B: pixel, 180C: pixel, 181A: first hole-injection layer, 181a: first hole-injection layer, 181B: second hole-injection layer, 181b: second hole-injection layer, 181c: third hole-injection layer, 182A: first hole-transport layer, 182a: first hole-transport layer, 182B: second hole-transport layer, 182b: second hole-transport layer, 182c: third hole-transport layer, 182d: fourth hole-transport layer, 182e: fifth hole-transport layer, 183A: first light-emitting layer, 183a: first light-emitting layer, 183B: second light-emitting layer, 183b: second light-emitting layer, 183c: third light-emitting layer, 184A: first electron-transport layer, 184a: first electron-transport layer, 184B: second electron-transport layer, 184b: second electron-transport layer, 184c: third electron-transport layer, 184d: fourth electron-transport layer, 184e: fifth electron-transport layer, 185d: first active layer, 185e: second active layer, 190a: resist mask, 190b: resist mask, 201: transistor, 204: connection portion, 205a: transistor, 205e: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231i: channel formation region, 231n: low-resistance region, 231: semiconductor layer, 242: connection layer, 500: display apparatus, 501: electrode, 502: electrode, 503: region, 512B_1: light-emitting unit, 512B_2: light-emitting unit, 512B_3: light-emitting unit, 512G_1: light-emitting unit, 512G_2: light-emitting unit, 512G_3: light-emitting unit, 512R_1: light-emitting unit, 512R_2: light-emitting unit, 512R_3: light-emitting unit, 521: layer, 522: layer, 523B: light-emitting layer, 523G: light-emitting layer, 523R: light-emitting layer, 524: layer, 525: layer, 531: intermediate layer, 541: insulating layer, 542: insulating layer, 550B: light-emitting device, 550G: light-emitting device, 550R: light-emitting device, 772: electrode, 786a: EL layer, 786b: EL layer, 786: EL layer, 788: electrode, 4411: light-emitting layer, 4412: light-emitting layer, 4413: light-emitting layer, 4420: layer, 4421: layer, 4422: layer, 4430: layer, 4431: layer, 4432: layer, 4440: intermediate layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal.

The invention claimed is:

1. A display apparatus comprising a first pixel, wherein the first pixel comprises a first light-emitting device, a second light-emitting device, a first light-receiving device, and a second light-receiving device over a layer including a transistor, wherein the first light-emitting device comprises a first pixel electrode and a common electrode over the first pixel electrode, wherein the second light-emitting device comprises a second pixel electrode and the common electrode over the second pixel electrode, wherein the first light-receiving device comprises a third pixel electrode and the common electrode over the third pixel electrode, wherein the second light-receiving device comprises a fourth pixel electrode and the common electrode over the fourth pixel electrode, wherein each of the first pixel electrode, the second pixel electrode, the third pixel electrode, and the fourth pixel electrode is in direct contact with an upper surface of the layer including the transistor, wherein the first light-emitting device and the second light-emitting device are configured to emit visible light with different wavelengths, wherein the first light-receiving device is configured to sense light emitted from the first light-emitting device, and wherein the second light-receiving device is configured to sense infrared light.

2. The display apparatus according to claim 1, wherein an area of a light-receiving region of the first light-receiving device is smaller than an area of a light-receiving region of the second light-receiving device.

3. The display apparatus according to claim 1, wherein the second light-receiving device is configured to sense an object that is not touching the display apparatus.

4. The display apparatus according to claim 1, further comprising a second pixel, wherein the second pixel comprises the first light-emitting device, the second light-emitting device, the first light-receiving device, and a sensor device.

5. An electronic device comprising the display apparatus according to claim 4, wherein the electronic device is configured to measure, with the sensor device, at least one of force, displacement, position, speed, acceleration, angular velocity, rotational frequency, distance, magnetism, temperature, chemical substance, time, hardness, electric field, electric current, voltage, electric power, radiation, flow rate, humidity, gradient, oscillation, odor, physical condition, pulse, body temperature, and blood oxygen level.

6. The display apparatus according to claim 1, further comprising a second pixel, wherein the second pixel comprises the first light-emitting device, the second light-emitting device, a fourth light-emitting device, and the first light-receiving device, and wherein the fourth light-emitting device is configured to emit infrared light.

7. An electronic device comprising:

the display apparatus according to claim 1;

a fourth light-emitting device; and a housing, wherein the fourth light-emitting device is configured to emit infrared light.

8. The electronic device according to claim 7, wherein the fourth light-emitting device emits light to the outside of the electronic device through the display apparatus.

9. A display module comprising:

the display apparatus according to claim 1; and at least one of a connector and an integrated circuit.

10. An electronic device comprising:

the display module according to claim 9; and at least one of a housing, a battery, a camera, a speaker, and a microphone.

11. A display apparatus comprising a first pixel, wherein the first pixel comprises a first light-emitting device, a second light-emitting device, a third light-emitting device, a first light-receiving device, and a second light-receiving device over a layer including a transistor, wherein the first light-emitting device comprises a first pixel electrode and a common electrode over the first pixel electrode, wherein the second light-emitting device comprises a second pixel electrode and the common electrode over the second pixel electrode, wherein the third light-emitting device comprises a third pixel electrode and the common electrode over the third pixel electrode, wherein the first light-receiving device comprises a fourth pixel electrode and the common electrode over the fourth pixel electrode, wherein the second light-receiving device comprises a fifth pixel electrode and the common electrode over the fifth pixel electrode, wherein each of the first pixel electrode, the second pixel electrode, the third pixel electrode, the fourth pixel electrode, and the fifth pixel electrode is in direct contact with an upper surface of the layer including the transistor, wherein the first light-emitting device is configured to emit red light, wherein the second light-emitting device is configured to emit green light, wherein the third light-emitting device is configured to emit blue light, wherein the first light-receiving device is configured to sense light emitted from at least one of the first light-emitting device, the second light-emitting device, and the third light-emitting device, and wherein the second light-receiving device is configured to sense infrared light.

12. The display apparatus according to claim 11, wherein an area of a light-receiving region of the first light-receiving device is smaller than an area of a light-receiving region of the second light-receiving device.

13. The display apparatus according to claim 11, wherein the second light-receiving device is configured to sense an object that is not touching the display apparatus.

14. The display apparatus according to claim 11, further comprising a second pixel, wherein the second pixel comprises the first light-emitting device, the second light-emitting device, the first light-receiving device, and a sensor device.

15. An electronic device comprising the display apparatus according to claim 14, wherein the electronic device is configured to measure, with the sensor device, at least one of force, displacement, position, speed, acceleration, angular velocity, rotational frequency, distance, magnetism, temperature, chemical substance, time, hardness, electric field, electric current, voltage, electric power, radiation, flow rate, humidity, gradient, oscillation, odor, physical condition, pulse, body temperature, and blood oxygen level.

16. The display apparatus according to claim 11, further comprising a second pixel, wherein the second pixel comprises the first light-emitting device, the second light-emitting device, a fourth light-emitting device, and the first light-receiving device, and wherein the fourth light-emitting device is configured to emit infrared light.

17. An electronic device comprising:

the display apparatus according to claim 11;

a fourth light-emitting device; and a housing, wherein the fourth light-emitting device is configured to emit infrared light.

18. The electronic device according to claim 17, wherein the fourth light-emitting device emits light to the outside of the electronic device through the display apparatus.

19. A method for manufacturing a display apparatus, comprising:

forming a first pixel electrode, a second pixel electrode, and a third pixel electrode;

forming a first layer comprising a light-emitting layer over the first pixel electrode, the second pixel electrode, and the third pixel electrode;

forming a first sacrificial layer over the first layer;

processing the first layer and the first sacrificial layer so that the second pixel electrode and the third pixel electrode are exposed;

forming a second layer comprising a first active layer over the first pixel electrode, the second pixel electrode, and the third pixel electrode;

forming a second sacrificial layer over the second layer;

processing the second layer and the second sacrificial layer so that the first sacrificial layer and the third pixel electrode are exposed;

forming a third layer comprising a second active layer over the first pixel electrode, the second pixel electrode, and the third pixel electrode;

forming a third sacrificial layer over the third layer;

processing the third layer and the third sacrificial layer so that the first sacrificial layer and the second sacrificial layer are exposed;

removing the first sacrificial layer, the second sacrificial layer, and the third sacrificial layer; and forming a common electrode over the first layer, the second layer, and the third layer.

20. The method for manufacturing a display apparatus, according to claim 19, wherein after the removal of the first sacrificial layer, the second sacrificial layer, and the third sacrificial layer, a fourth layer is formed over the first layer, the second layer, and the third layer, and the common electrode is formed over the fourth layer.

21. The method for manufacturing a display apparatus, according to claim 19, wherein a protective layer is formed over the common electrode.

* * * * *